(12) United States Patent
Huang et al.

(10) Patent No.: US 11,784,056 B2
(45) Date of Patent: Oct. 10, 2023

(54) SELF-ALIGNED DOUBLE PATTERNING

(71) Applicant: Taiwan Semiconductor Manufacturing Co., Ltd., Hsinchu (TW)

(72) Inventors: Kuan-Wei Huang, Taoyuan (TW); Yu-Yu Chen, Hsinchu (TW); Jyu-Horng Shieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/883,930

(22) Filed: Aug. 9, 2022

(65) Prior Publication Data

US 2022/0384201 A1   Dec. 1, 2022

Related U.S. Application Data

(63) Continuation of application No. 17/018,705, filed on Sep. 11, 2020.

(60) Provisional application No. 62/927,336, filed on Oct. 29, 2019.

(51) Int. Cl.
*H01L 21/308* (2006.01)
*H01L 21/311* (2006.01)
*H01L 21/768* (2006.01)

(52) U.S. Cl.
CPC ...... *H01L 21/3085* (2013.01); *H01L 21/3088* (2013.01); *H01L 21/31144* (2013.01); *H01L 21/76802* (2013.01); *H01L 21/76898* (2013.01)

(58) Field of Classification Search
CPC ............ H01L 21/3085; H01L 21/3088; H01L 21/31144; H01L 21/76802; H01L 21/76898; H01L 21/0337; H01L 21/76811; H01L 21/76816; H01L 2221/101; H01L 21/0338; H01L 21/0332; H01L 21/3081; H01L 21/3086; H01L 21/32139
See application file for complete search history.

(56) References Cited

U.S. PATENT DOCUMENTS

| | | | |
|---|---|---|---|
| 8,728,332 B2 | 5/2014 | Lin et al. | |
| 8,796,666 B1 | 8/2014 | Huang et al. | |
| 8,822,243 B2 | 9/2014 | Yan et al. | |
| 8,987,142 B2 | 3/2015 | Lee et al. | |
| 9,053,279 B2 | 6/2015 | Chang et al. | |
| 9,093,530 B2 | 7/2015 | Huang et al. | |
| 9,099,530 B2 | 8/2015 | Lin et al. | |
| 9,153,478 B2 | 10/2015 | Liu et al. | |

(Continued)

FOREIGN PATENT DOCUMENTS

| | | |
|---|---|---|
| DE | 112012004187 T5 | 6/2014 |
| JP | 2014528647 A | 10/2014 |

(Continued)

*Primary Examiner* — Robert G Bachner
(74) *Attorney, Agent, or Firm* — Slater Matsil, LLP

(57) ABSTRACT

A method includes patterning a mandrel layer over a target layer to form first mandrels and second mandrels, the first mandrels having a larger width than the second mandrels. A spacer layer is formed over the first mandrels and the second mandrels, and altered so that a thickness of the spacer layer over the first mandrels is greater than a thickness of the spacer layer over the second mandrels. Spacers are formed from the spacer layer which have a greater width adjacent the first mandrels than the spacers which are adjacent the second mandrels. The spacers are used to etch a target layer.

20 Claims, 59 Drawing Sheets

(56) References Cited

U.S. PATENT DOCUMENTS

| | | |
|---|---|---|
| 9,455,194 B1 | 9/2016 | Feng et al. |
| 9,501,601 B2 | 11/2016 | Chang et al. |
| 9,548,303 B2 | 1/2017 | Lee et al. |
| 9,748,110 B2 | 8/2017 | Kal et al. |
| 10,559,492 B2 | 2/2020 | Peng et al. |
| 2011/0113393 A1 | 5/2011 | Sezginer |
| 2013/0089984 A1 | 4/2013 | Raghunathan et al. |
| 2016/0240629 A1 | 8/2016 | Liou et al. |
| 2016/0314983 A1 | 10/2016 | Han et al. |
| 2018/0315601 A1 | 11/2018 | Peng et al. |
| 2019/0103305 A1 | 4/2019 | Liu et al. |
| 2019/0148221 A1 | 5/2019 | Peng et al. |
| 2019/0148389 A1 | 5/2019 | Lin et al. |
| 2019/0196336 A1 | 6/2019 | Tiron et al. |

FOREIGN PATENT DOCUMENTS

| | | |
|---|---|---|
| KR | 20180121327 A | 11/2018 |
| KR | 20190038241 A | 4/2019 |
| KR | 20190054911 A | 5/2019 |
| TW | 201140358 A | 11/2011 |
| TW | 201715574 A | 5/2017 |
| TW | 201926436 A | 7/2019 |
| TW | 201931440 A | 8/2019 |
| TW | 201935521 A | 9/2019 |
| TW | 201937707 A | 9/2019 |
| WO | 2019100899 A1 | 5/2019 |

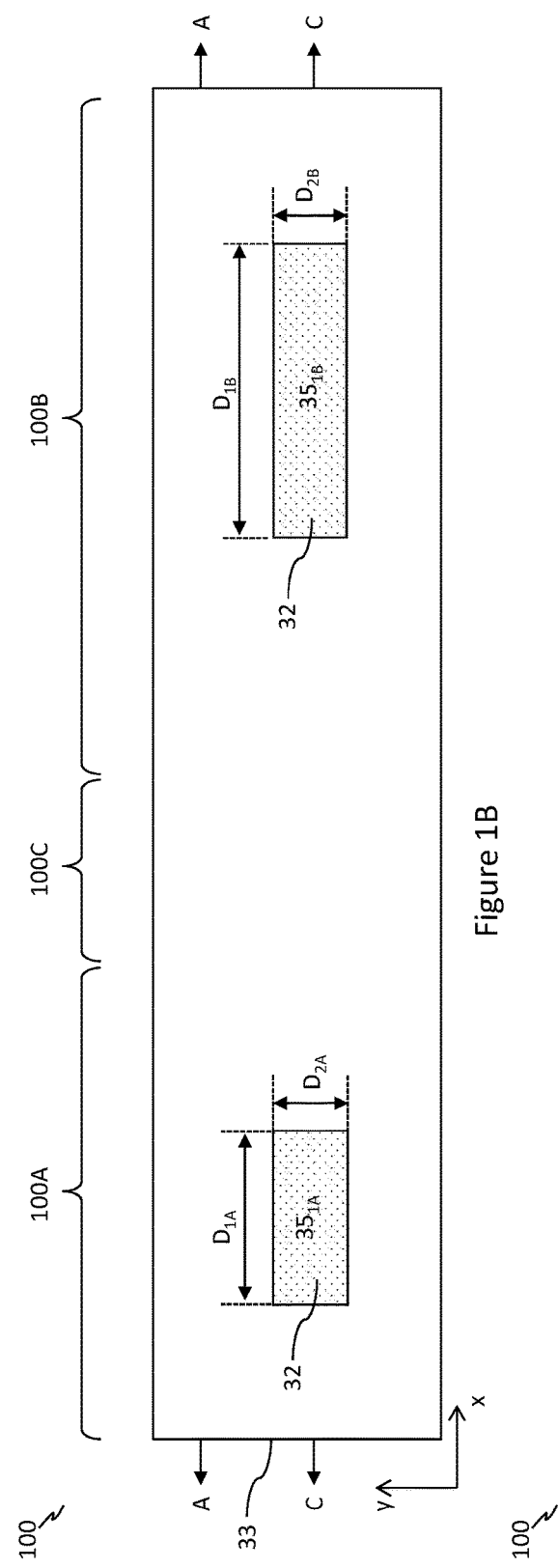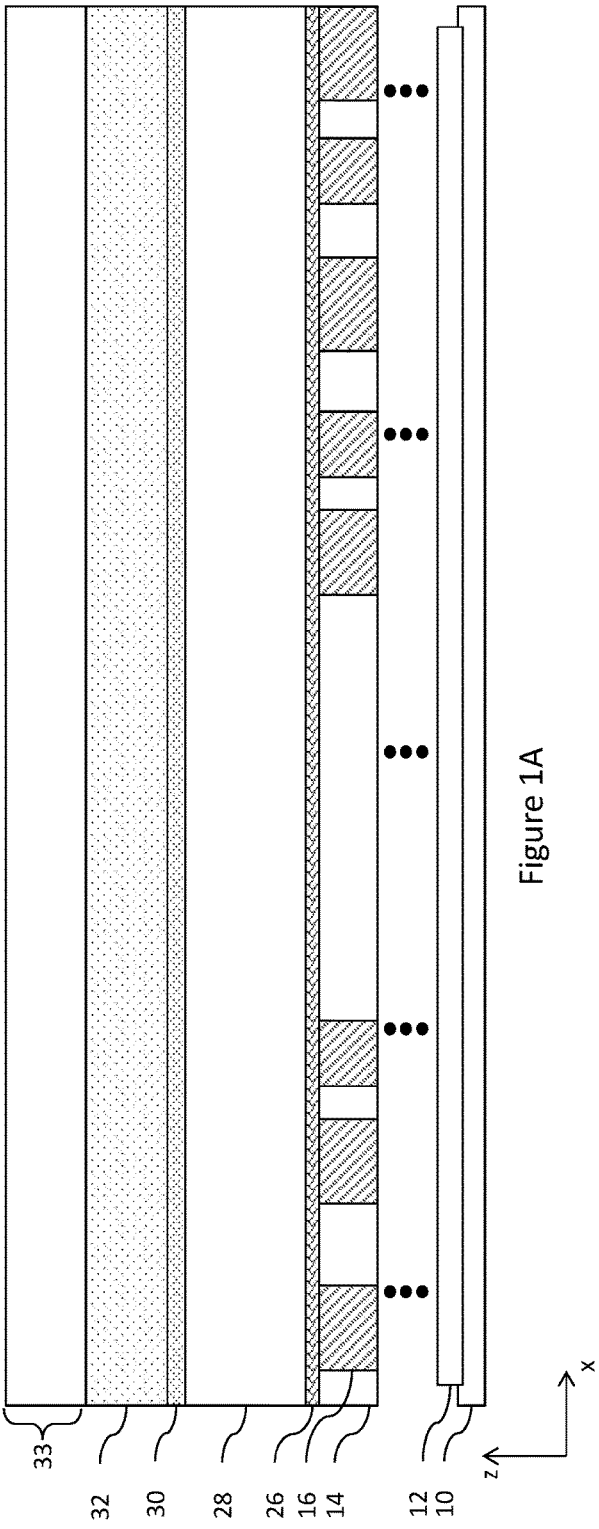
Figure 1B
Figure 1A

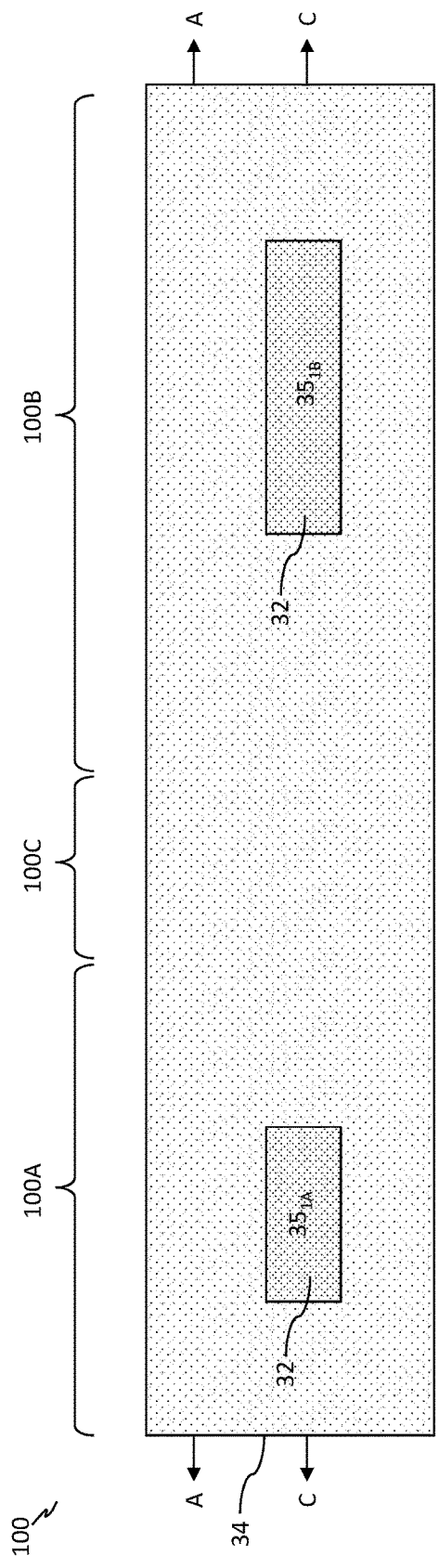
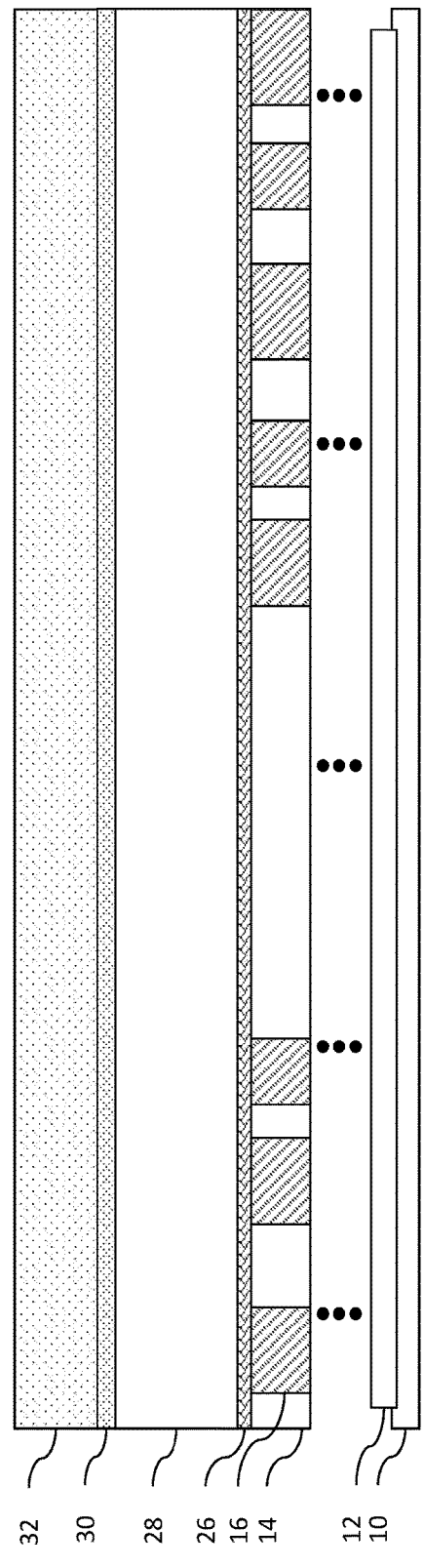

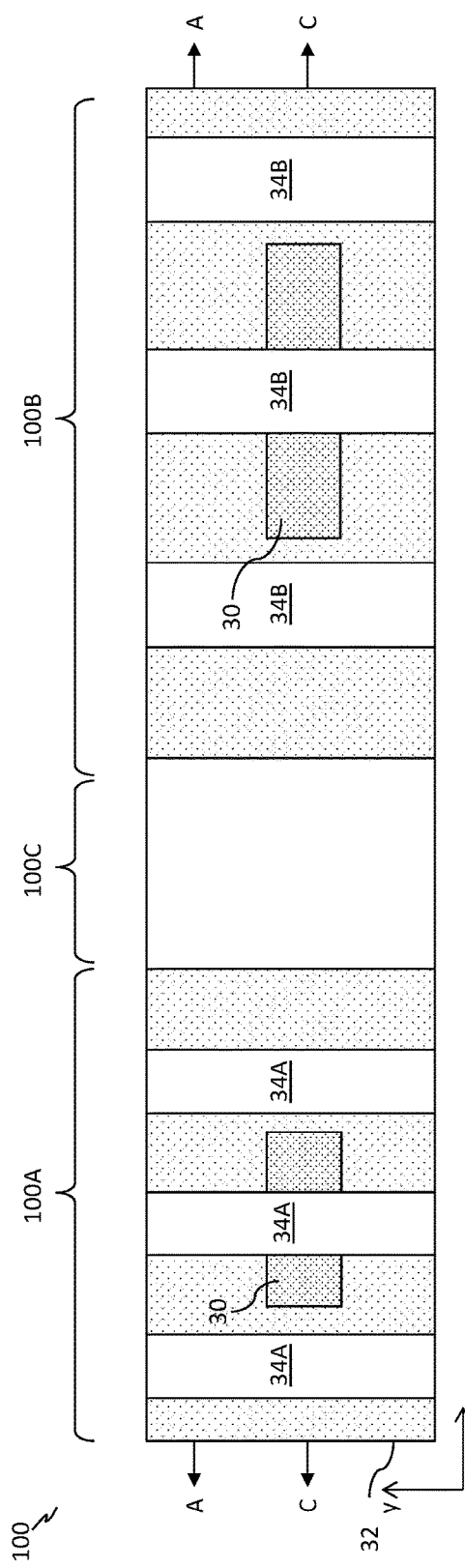
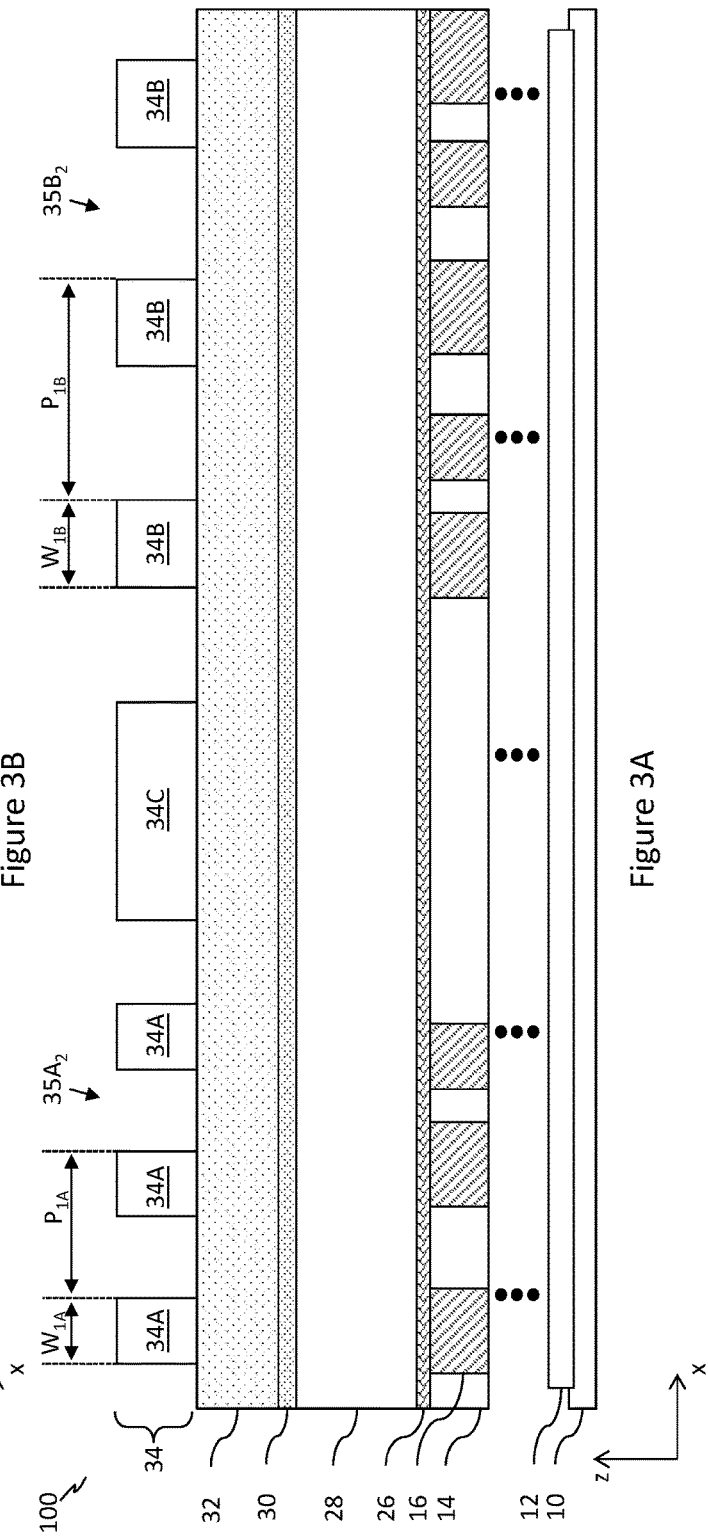
Figure 3B
Figure 3A

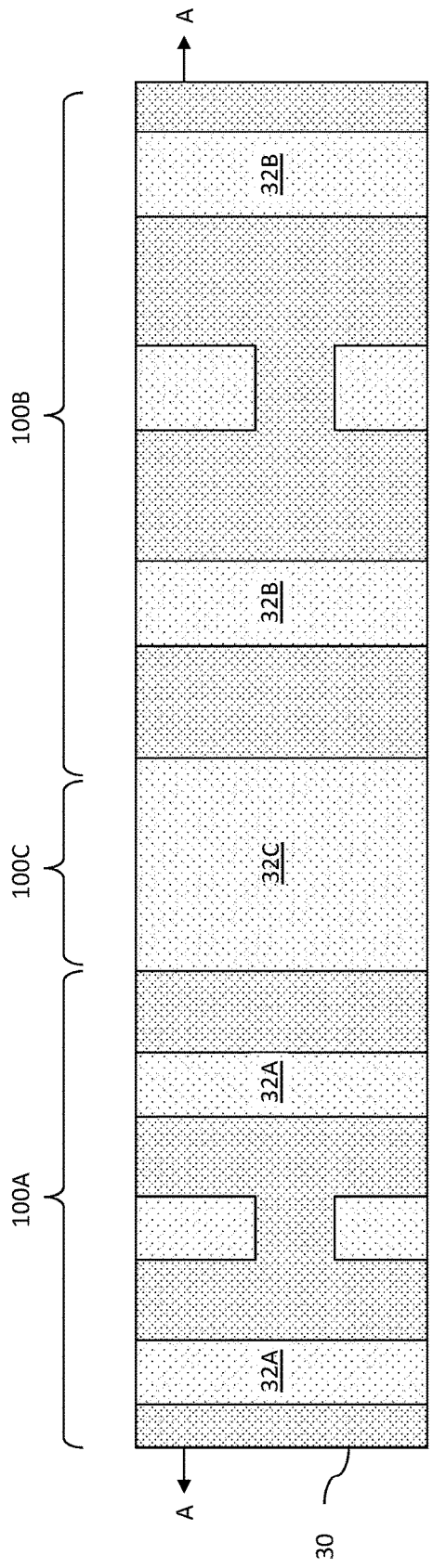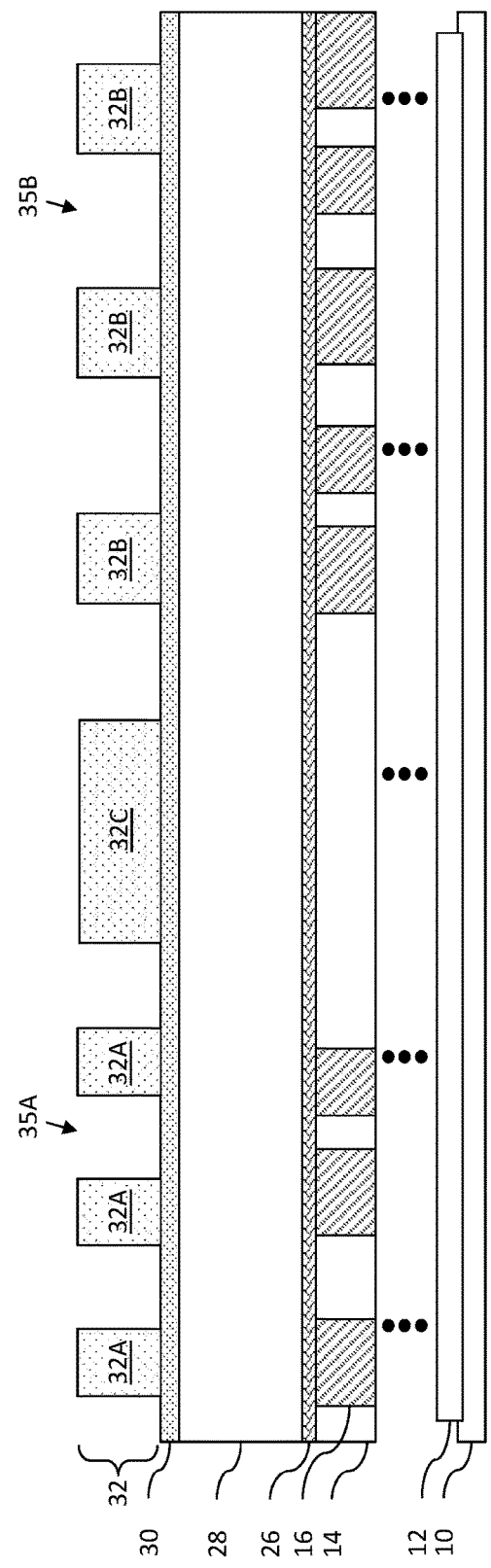

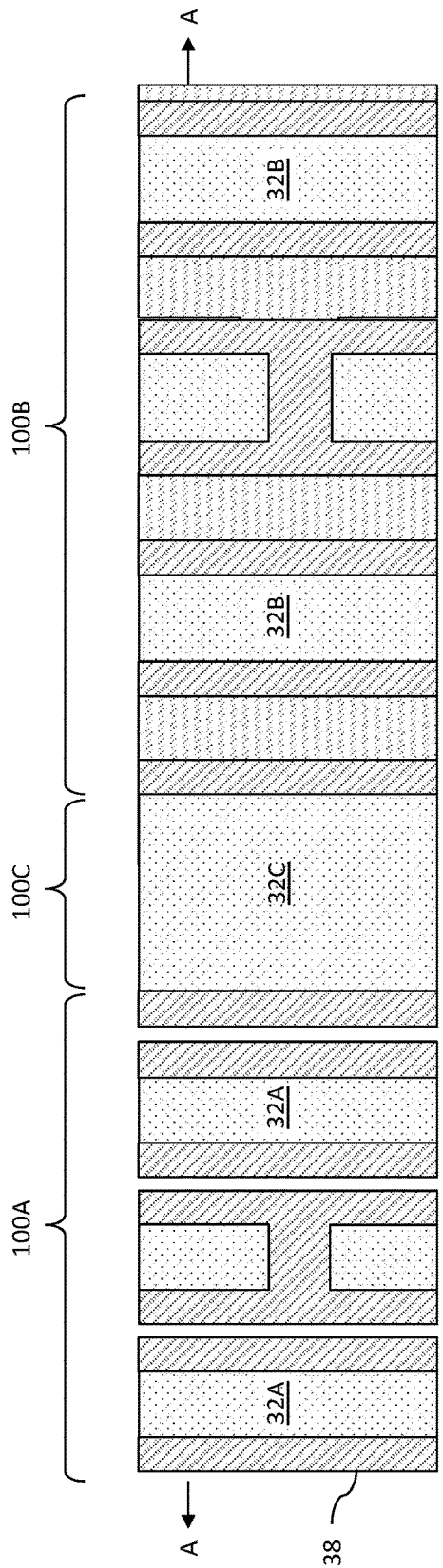
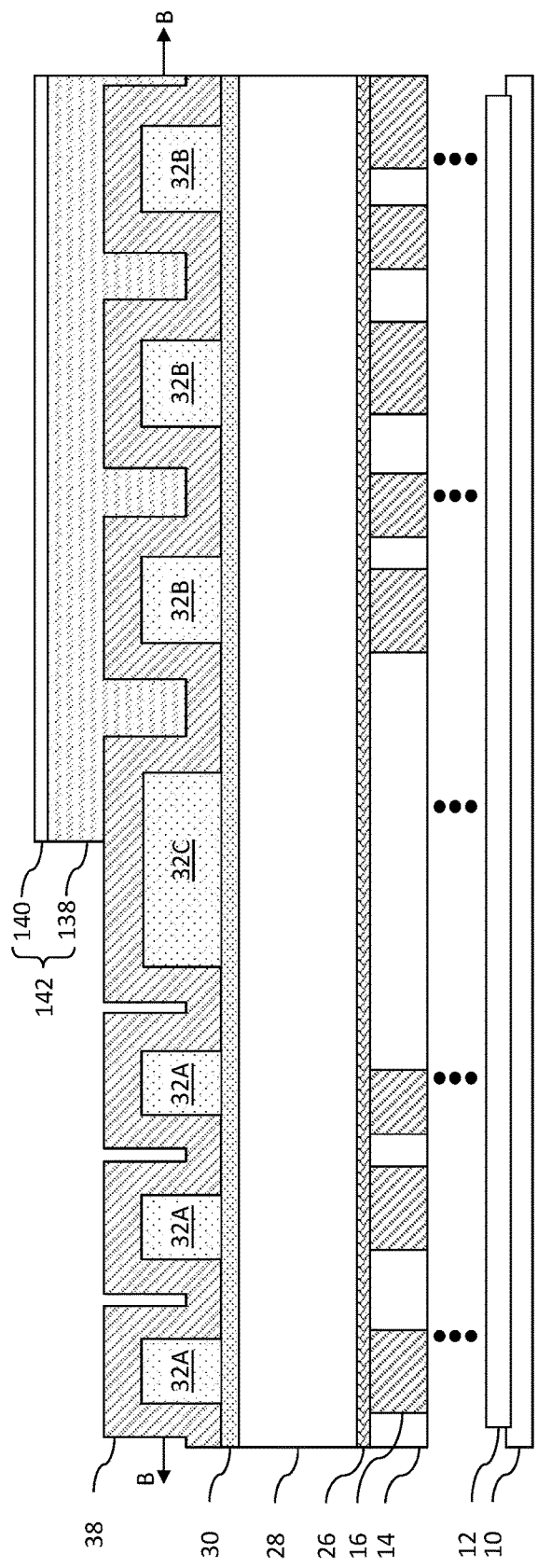
Figure 6B
Figure 6A

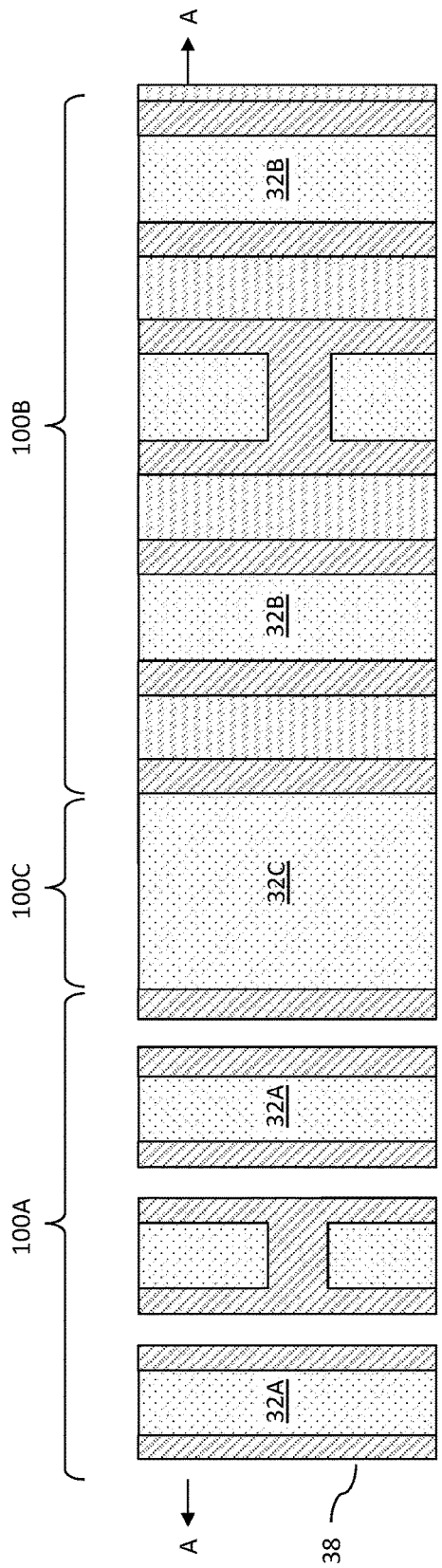
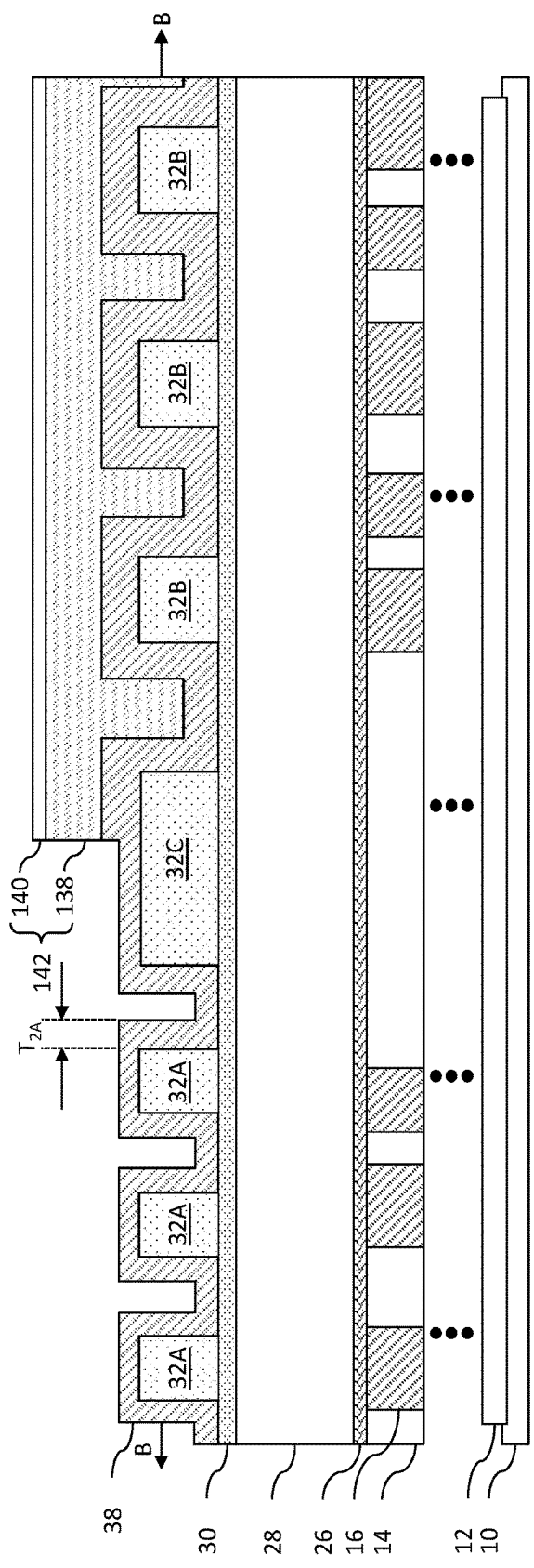
Figure 7B
Figure 7A

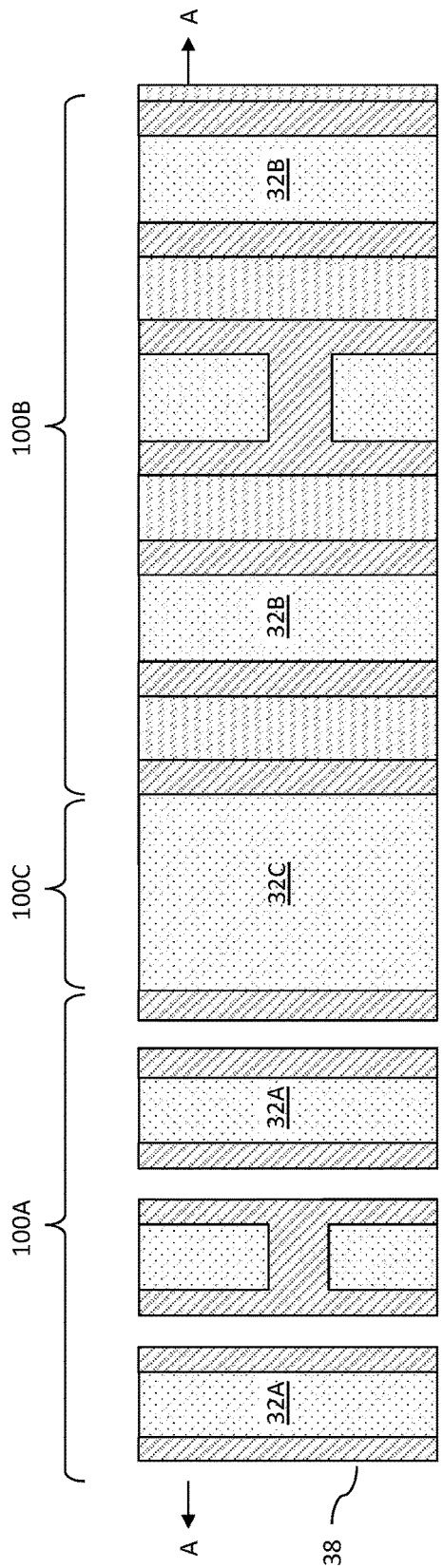
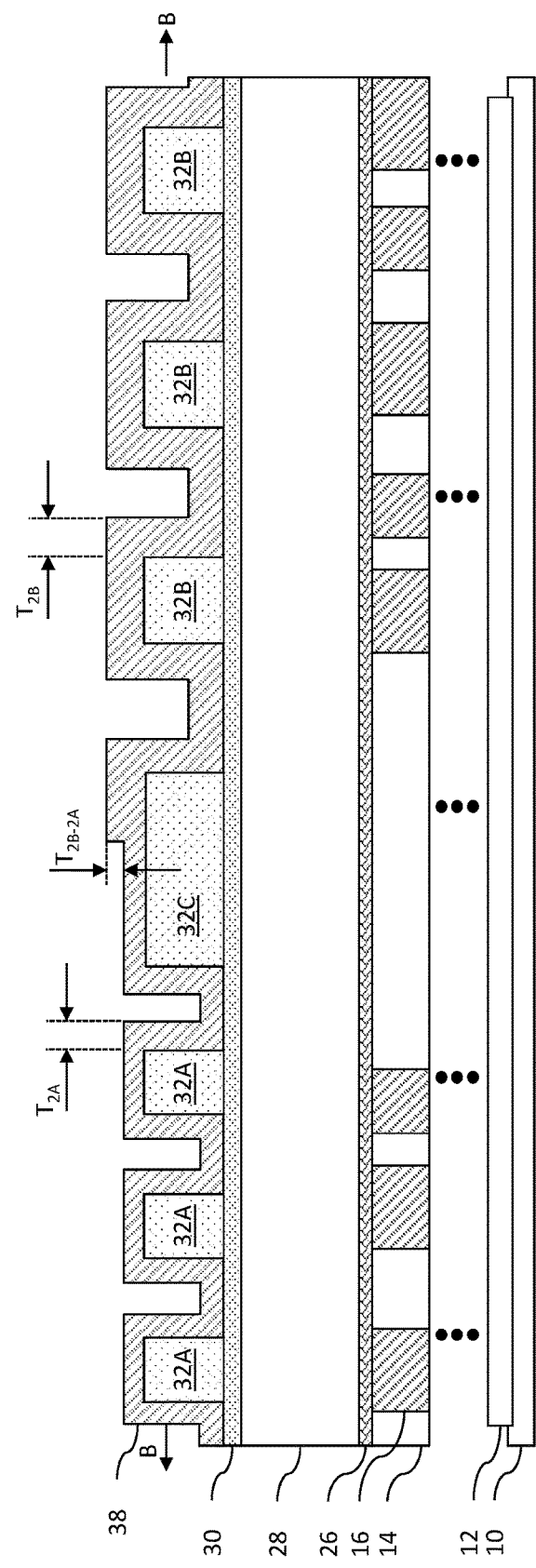
Figure 8B
Figure 8A

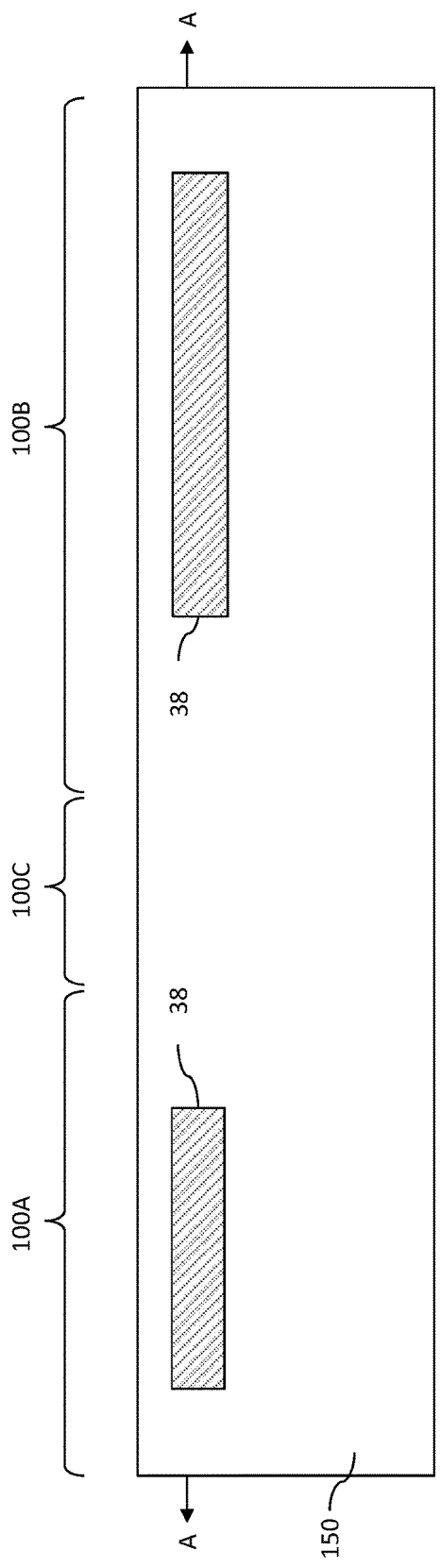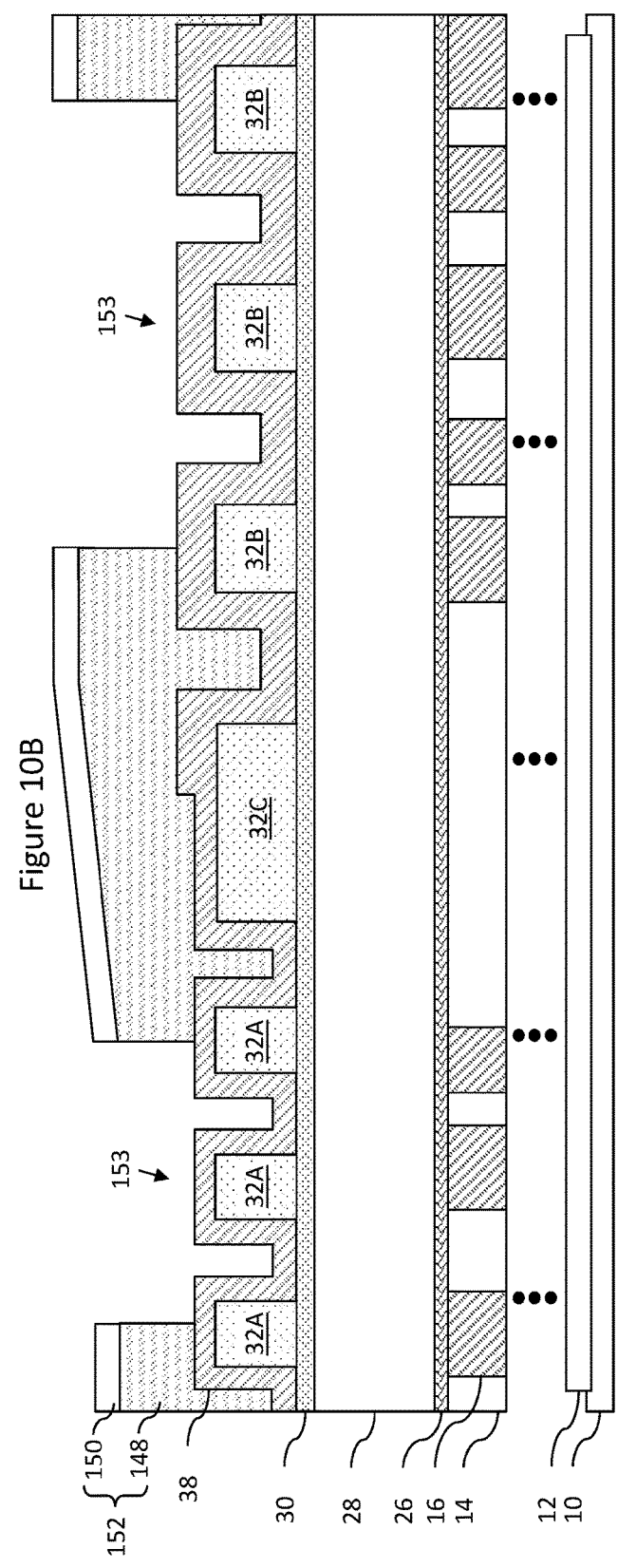
Figure 10B
Figure 10A

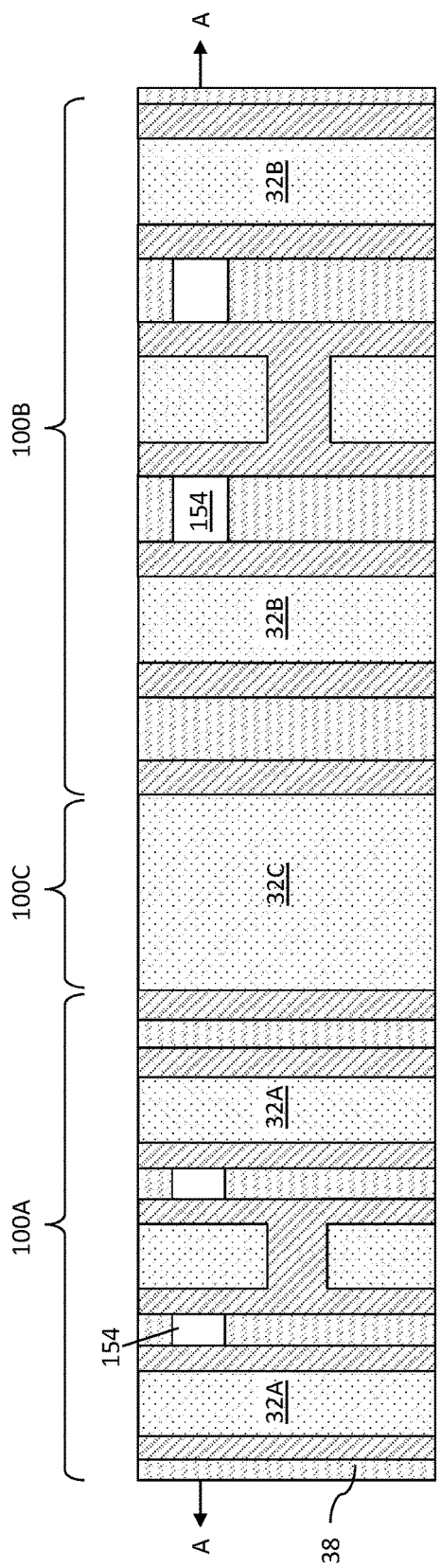
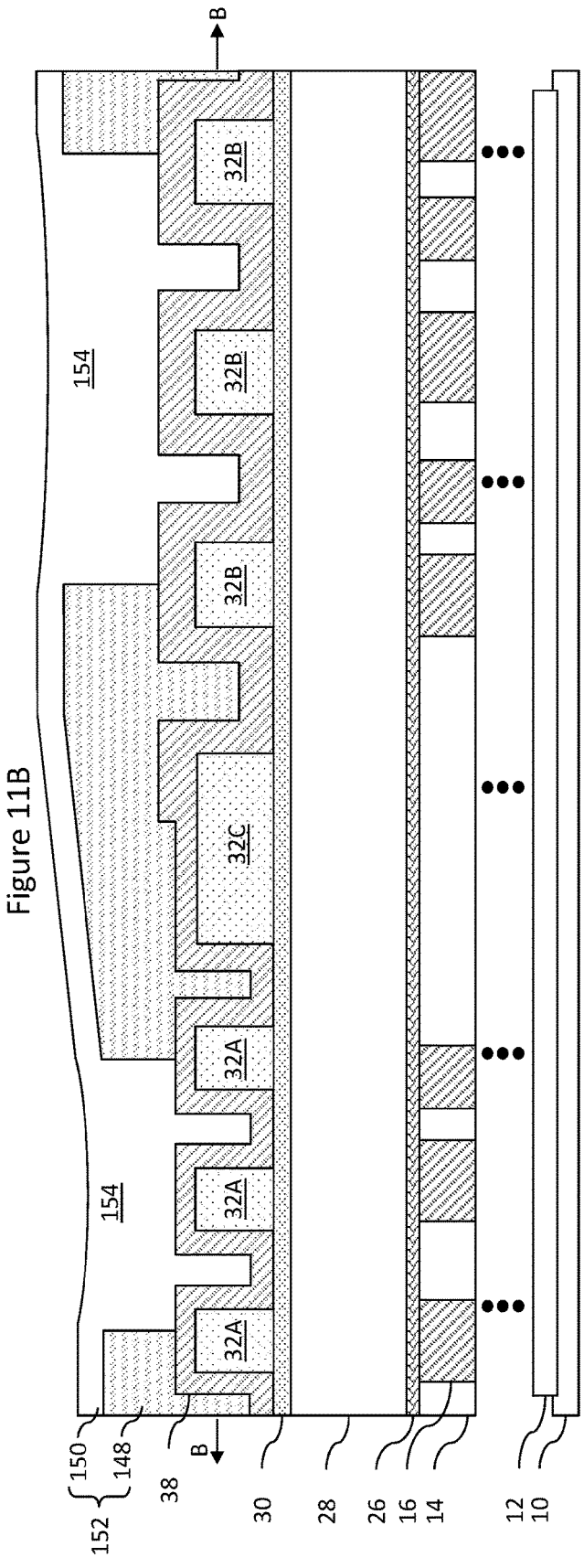
Figure 11B
Figure 11A

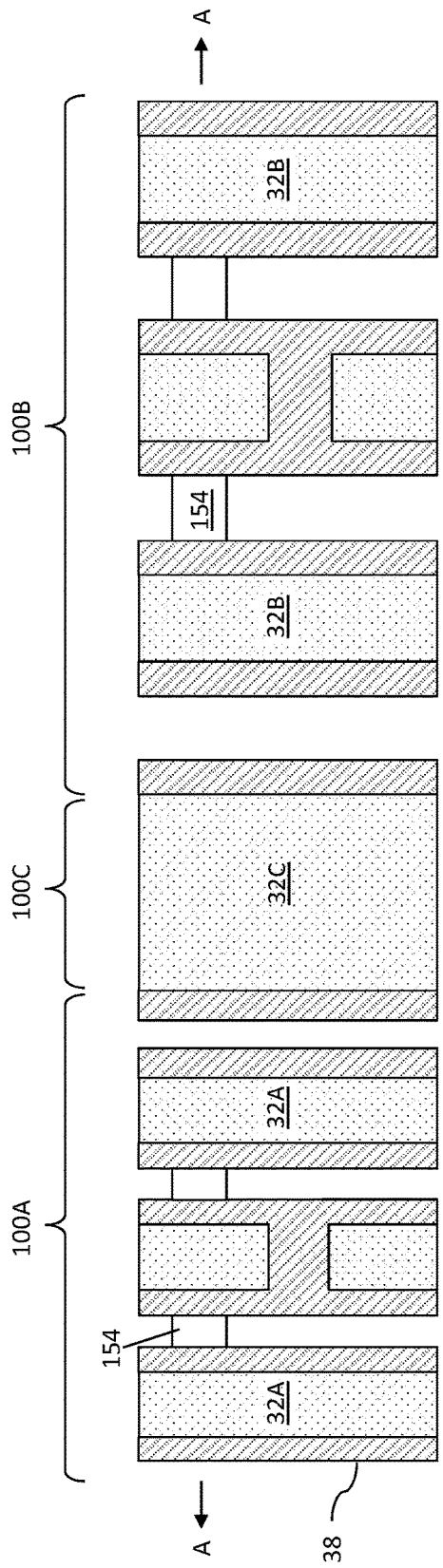
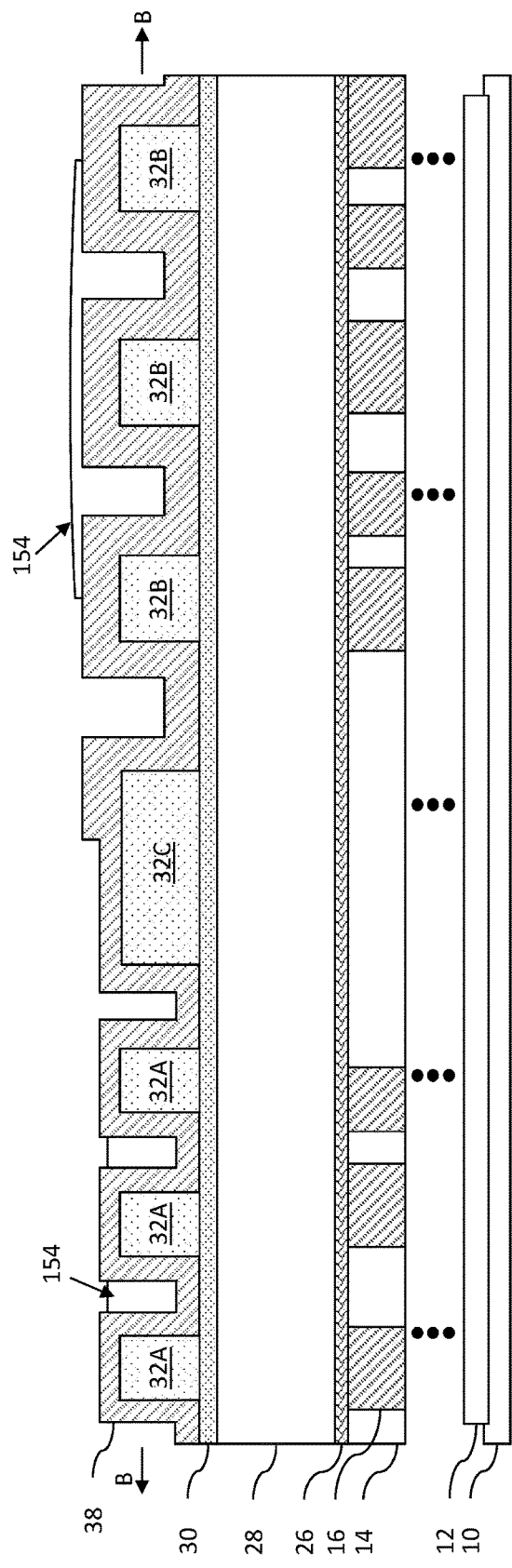
Figure 12B
Figure 12A

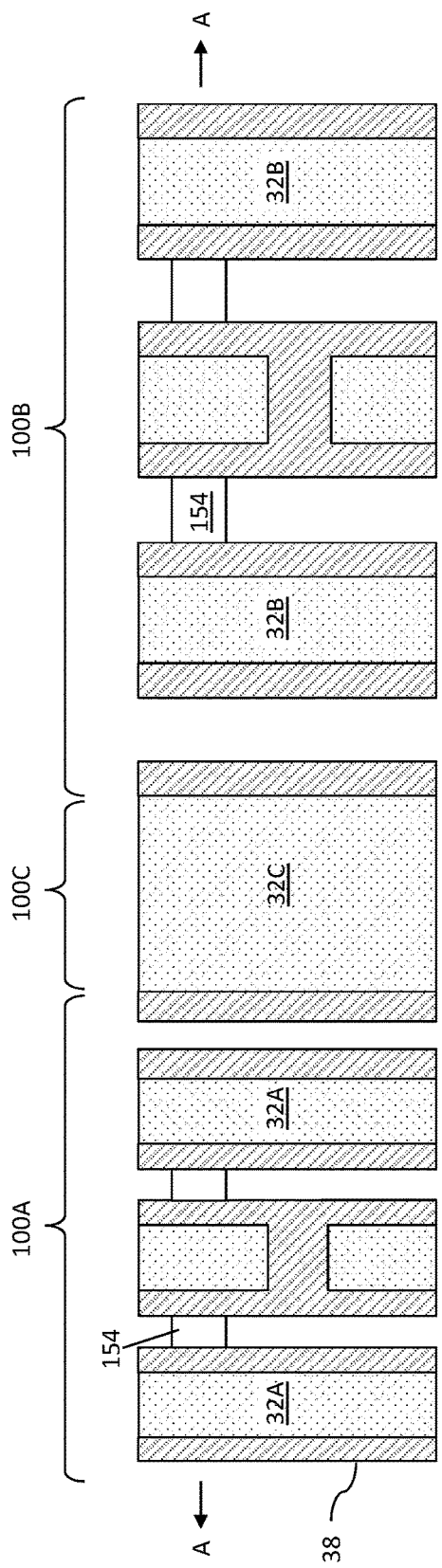
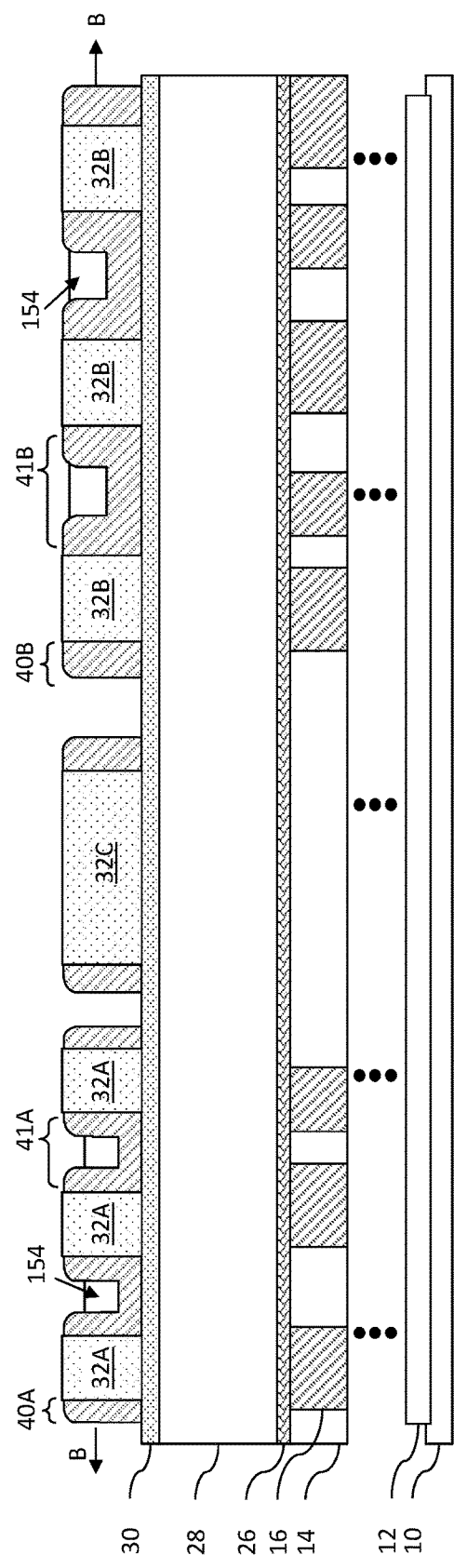
Figure 13B
Figure 13A

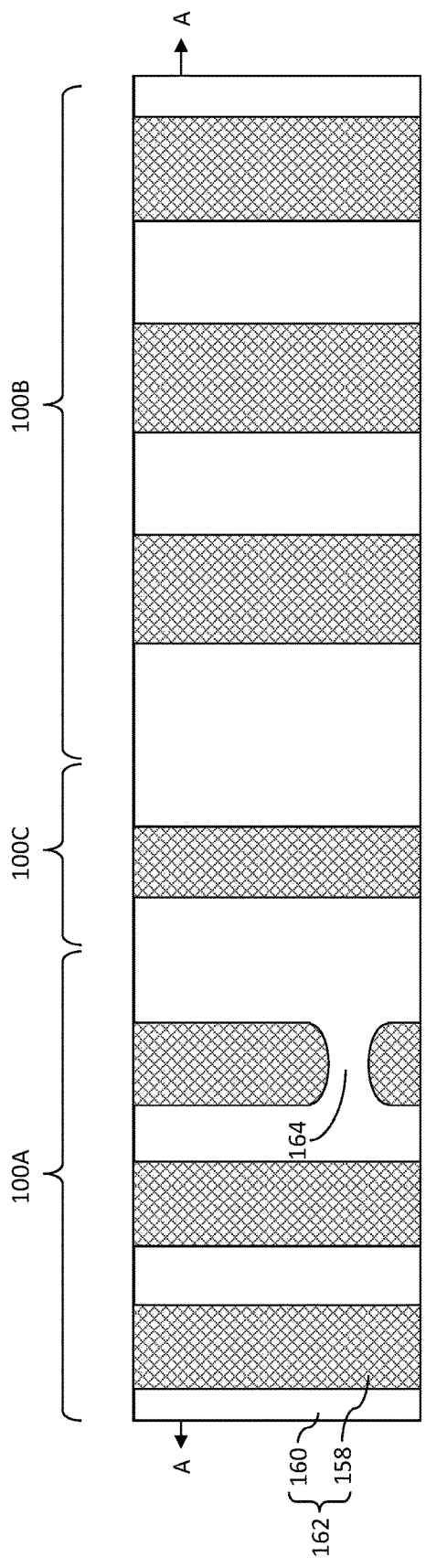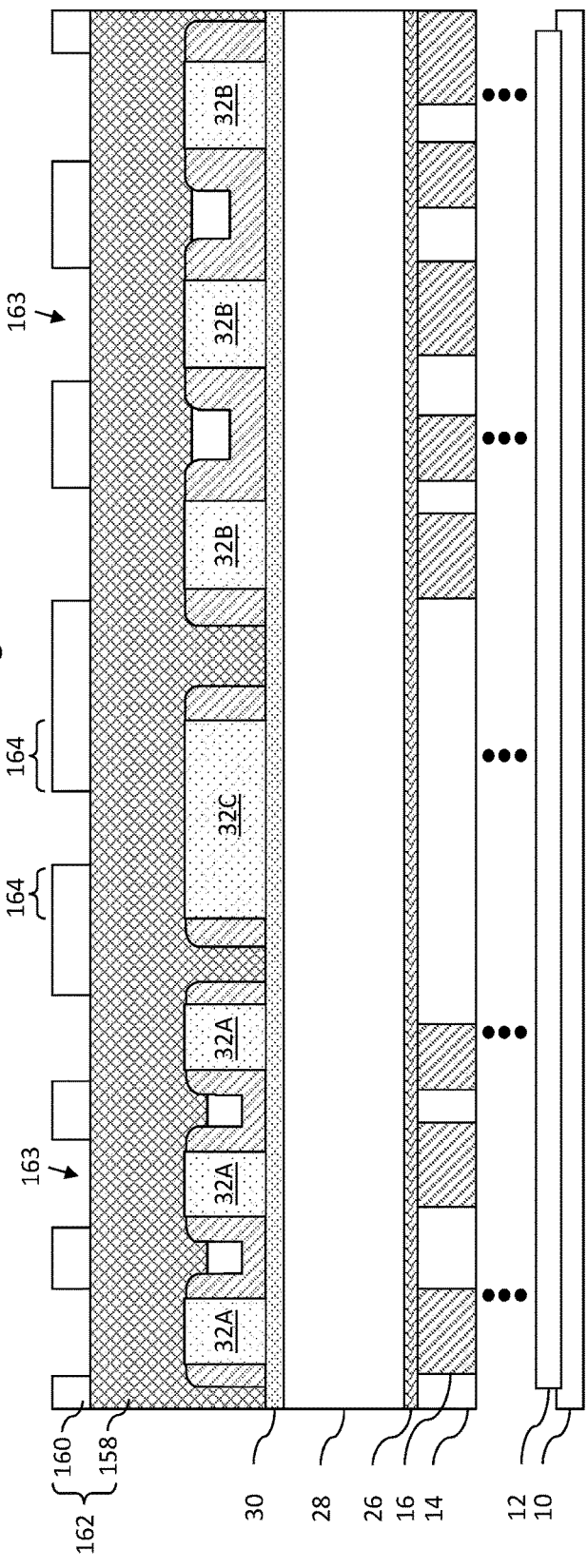
Figure 14B
Figure 14A

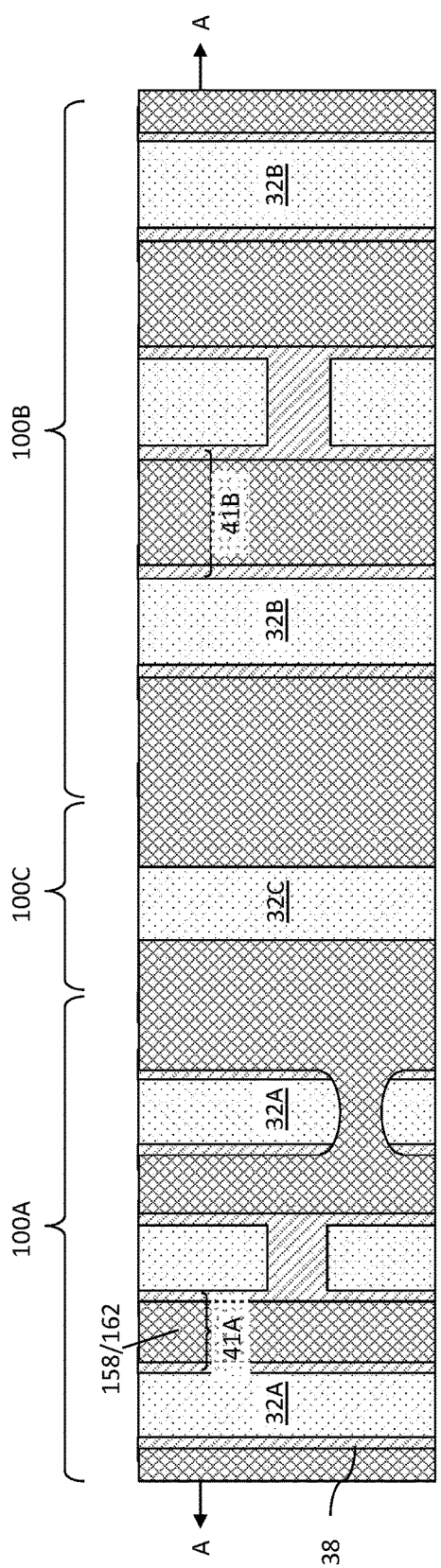
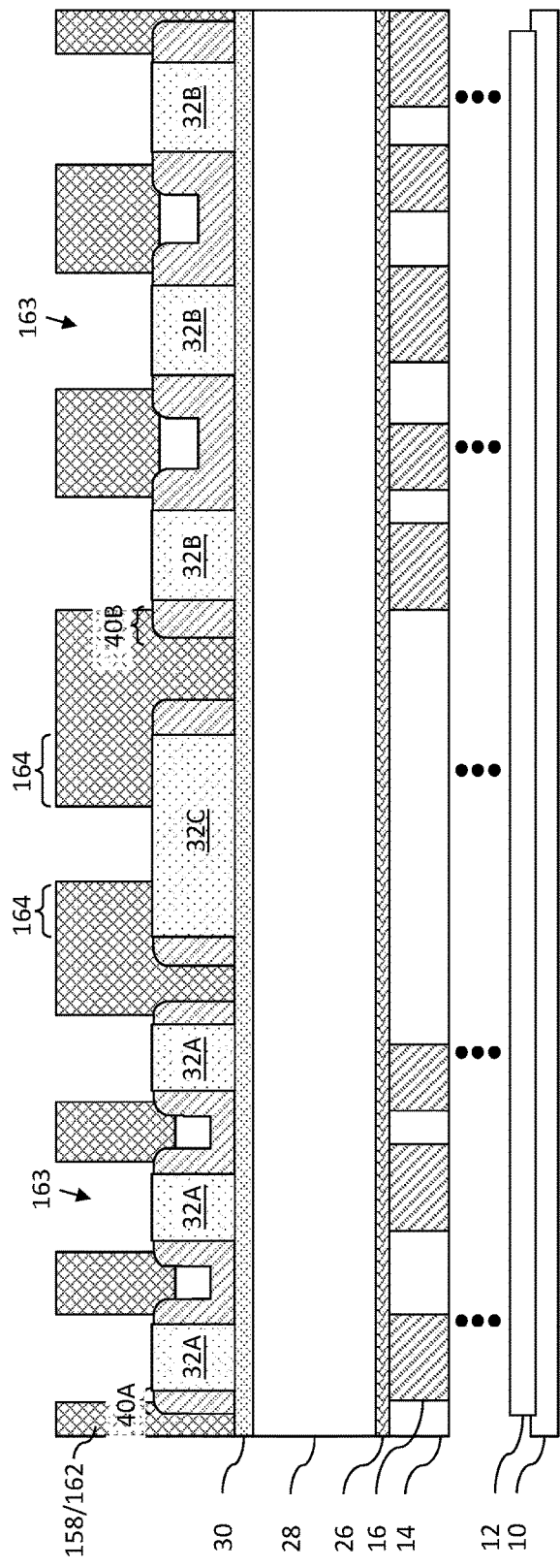
Figure 15B
Figure 15A

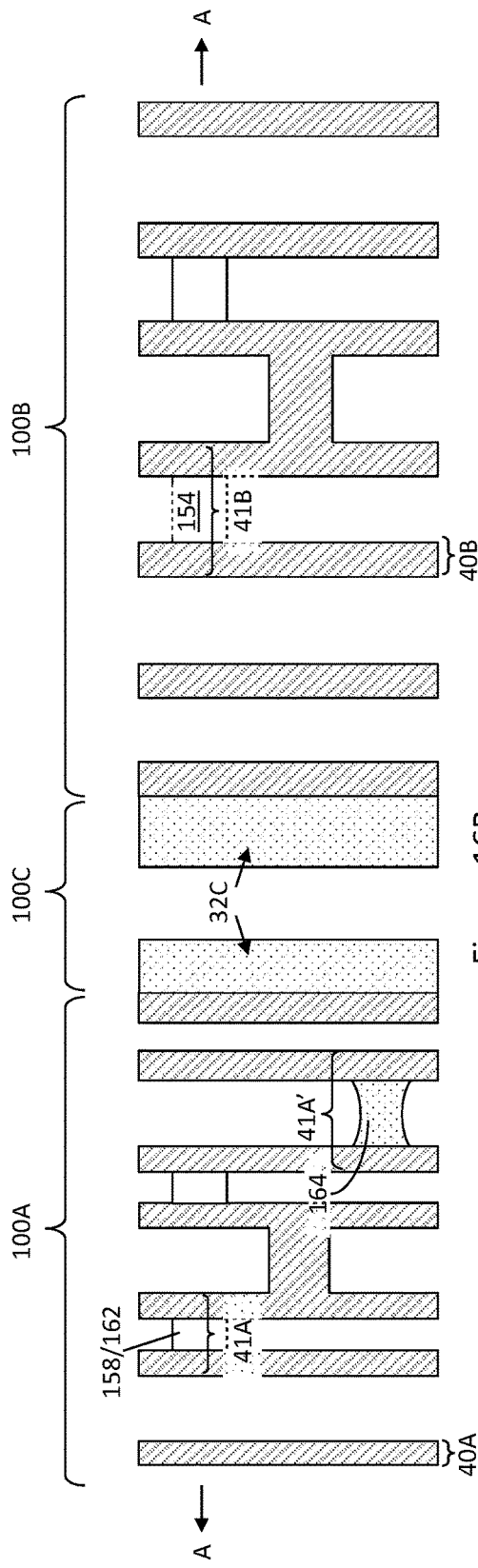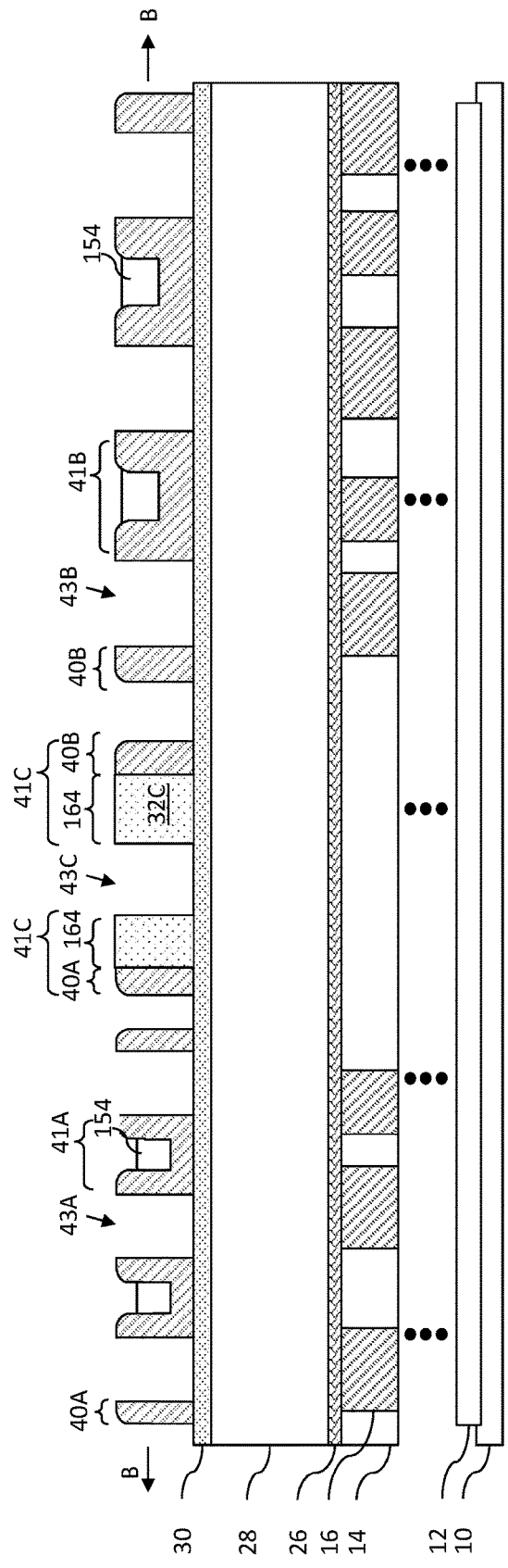
Figure 16B
Figure 16A

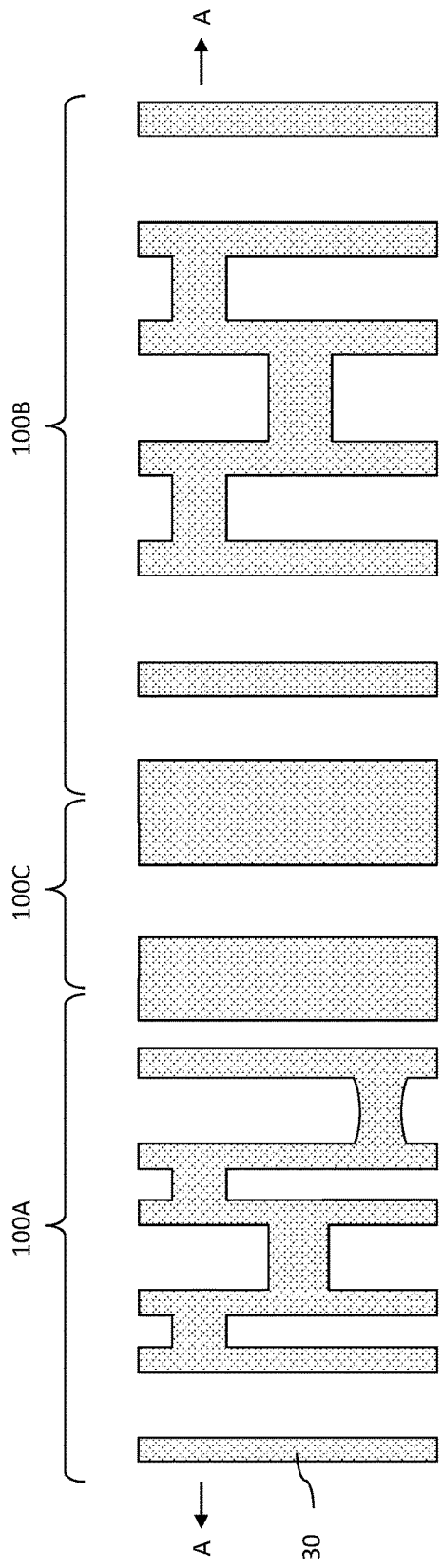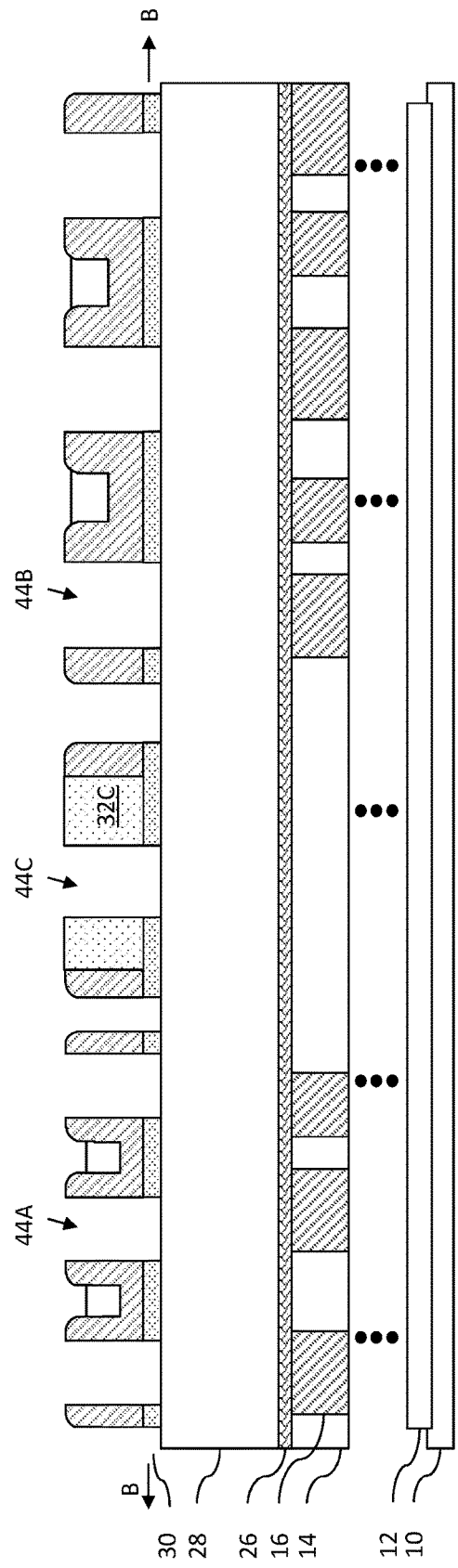
Figure 17B
Figure 17A

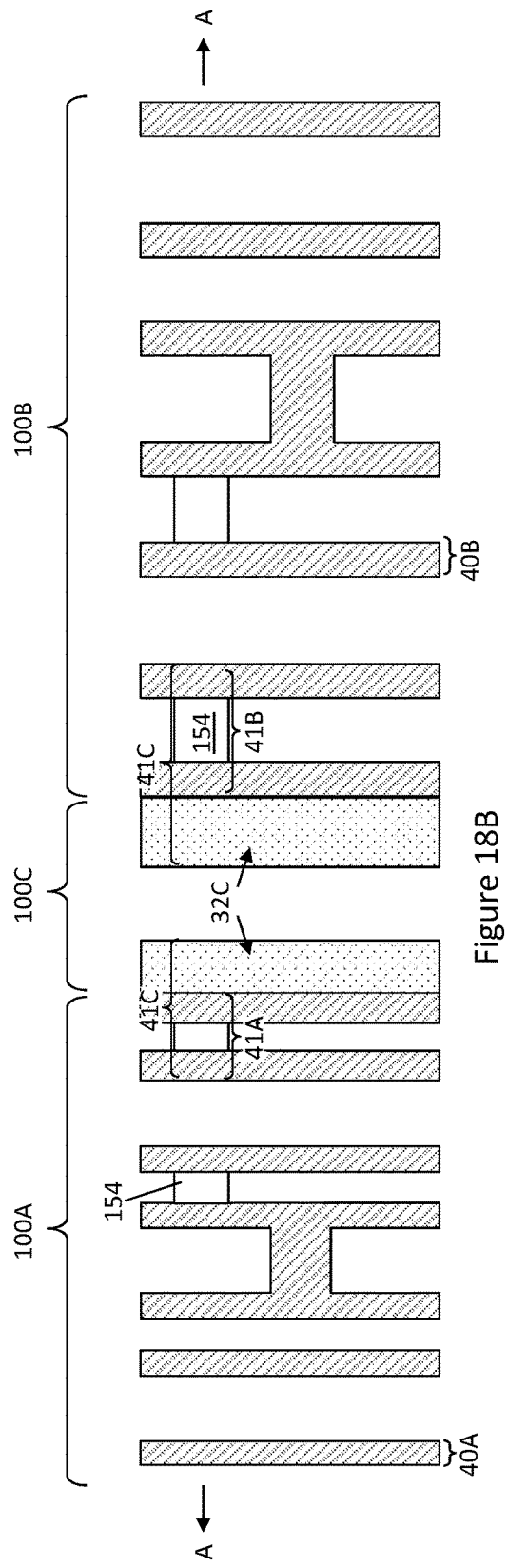
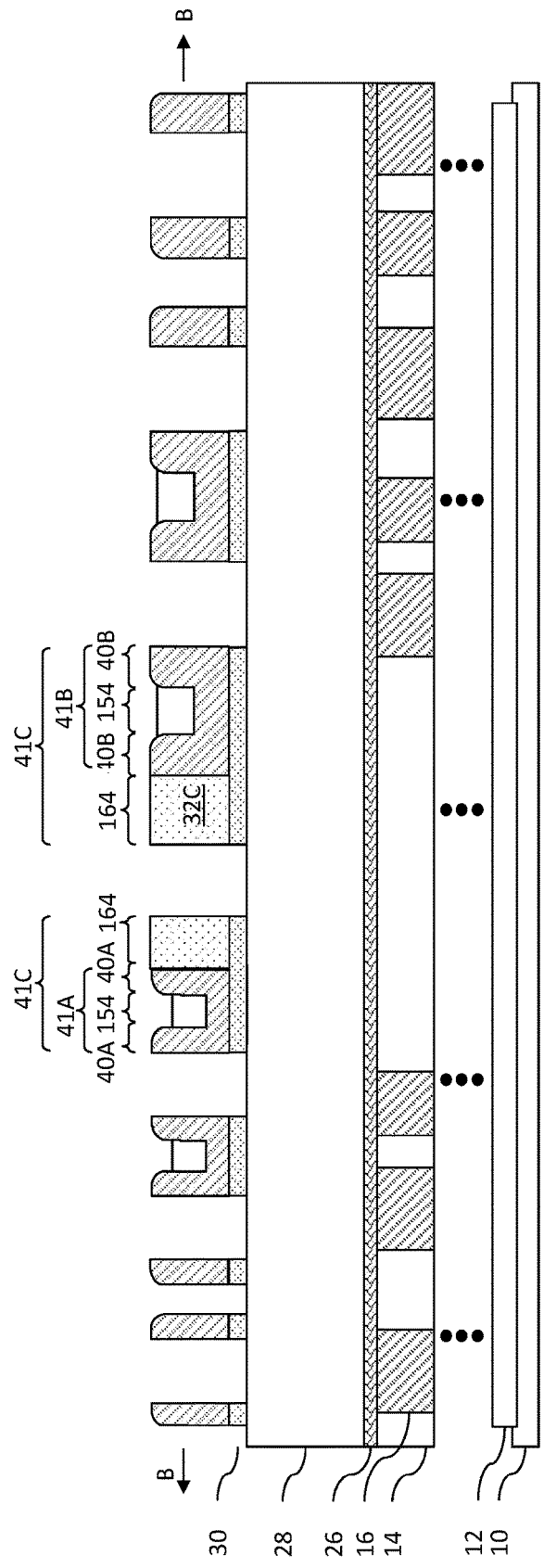
Figure 18B
Figure 18A

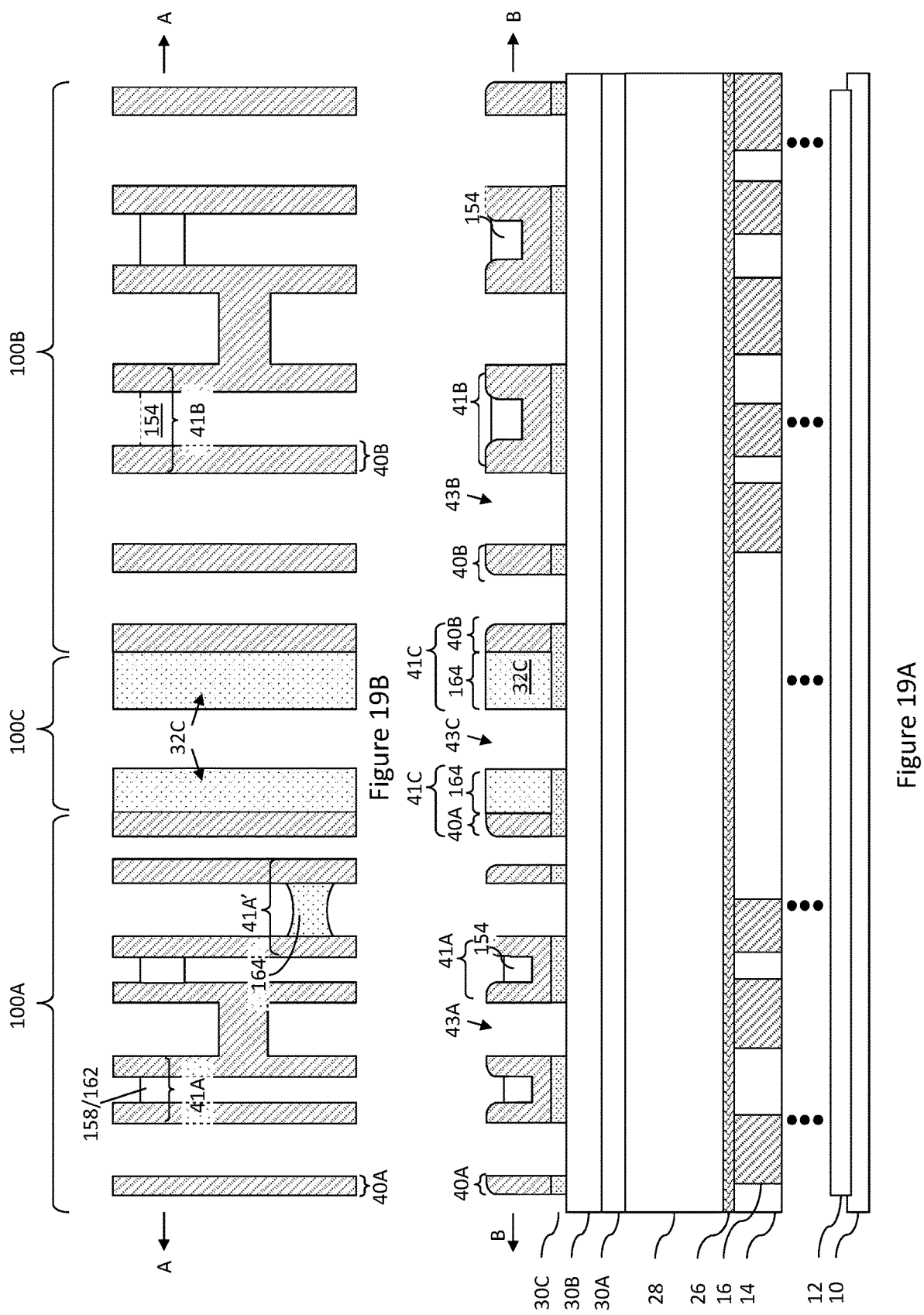

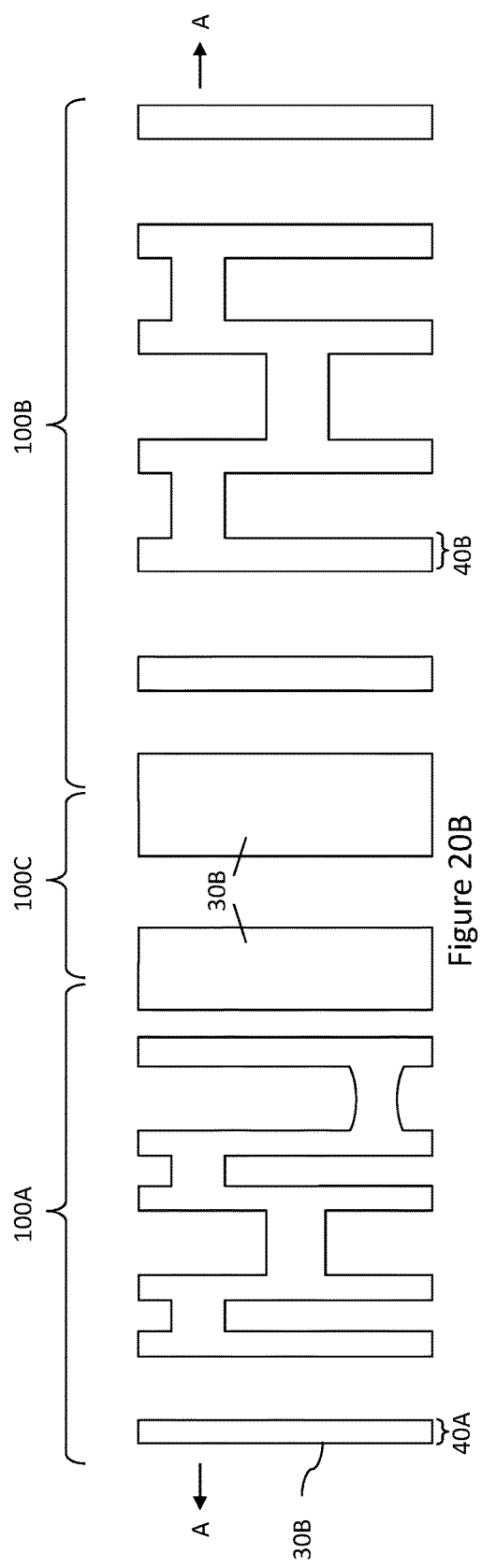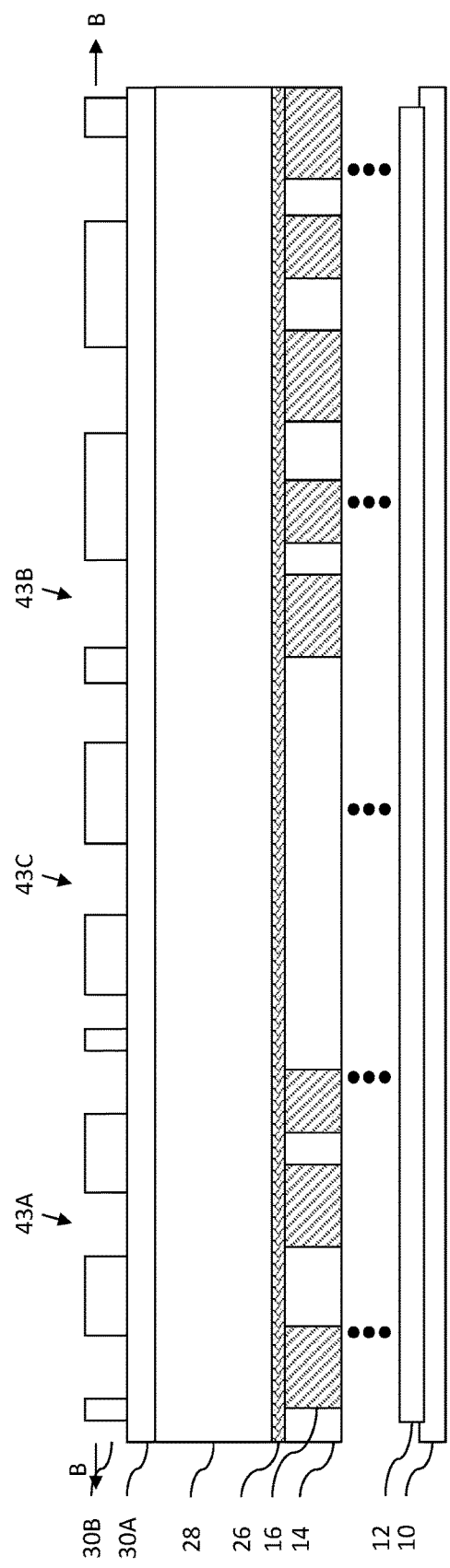
Figure 20B
Figure 20A

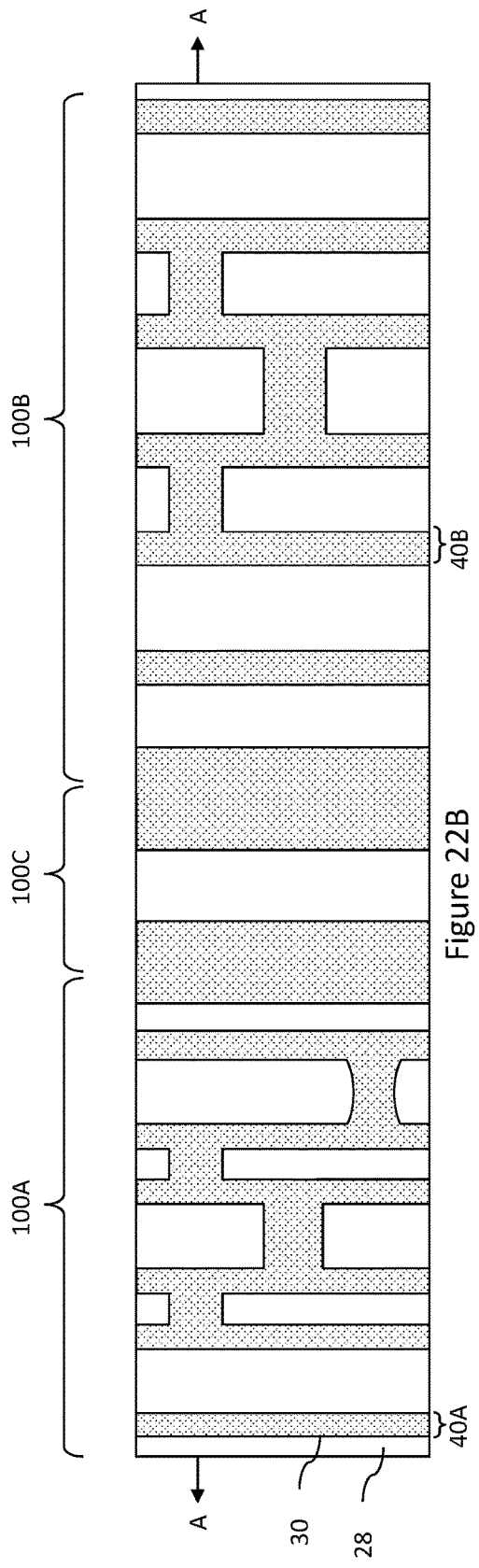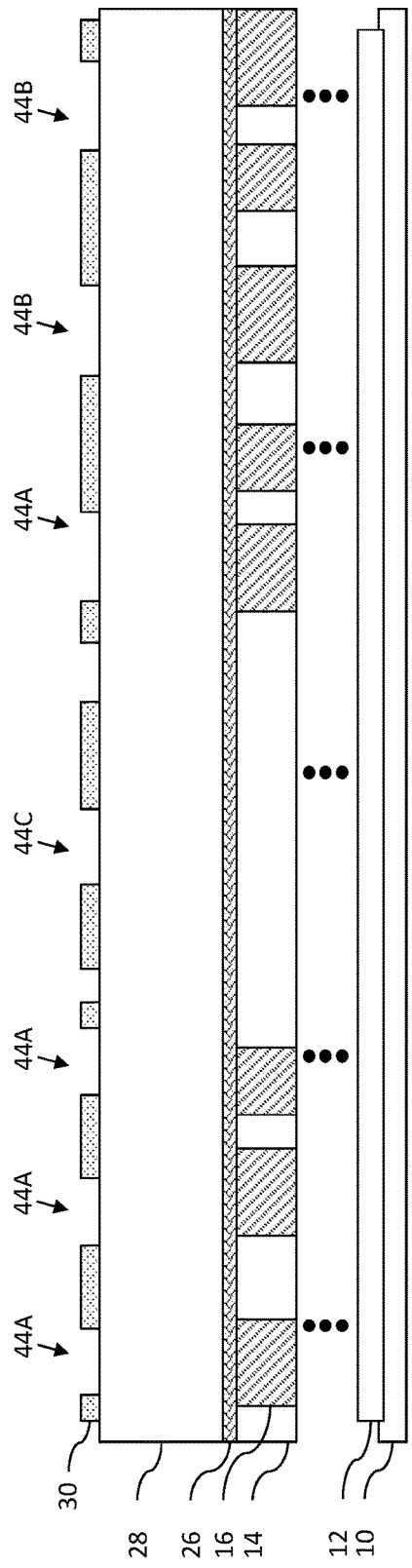

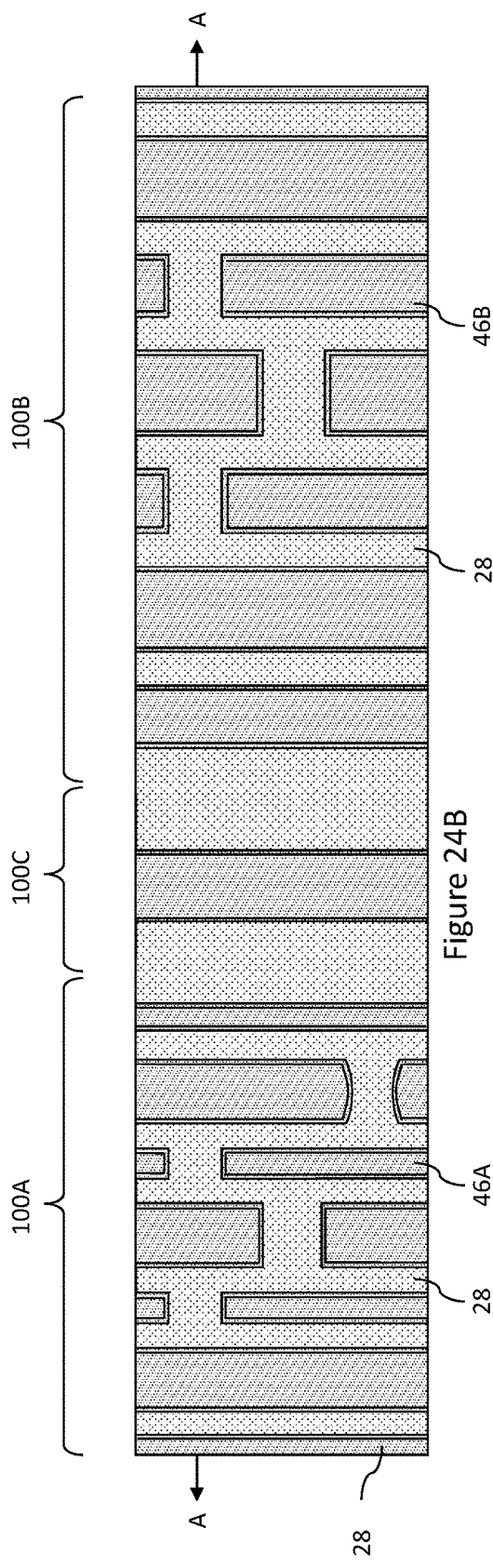
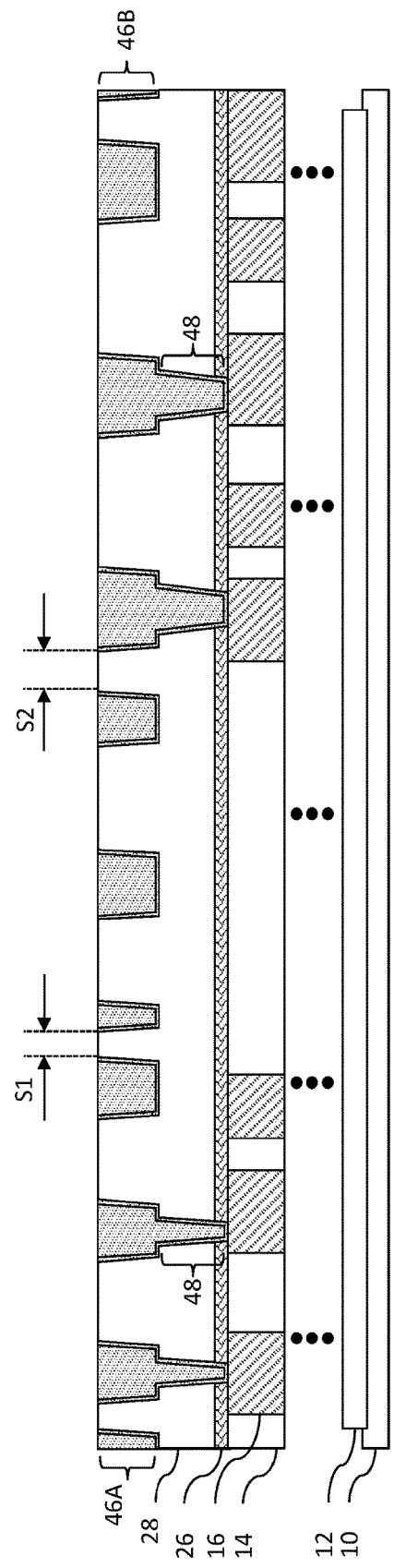

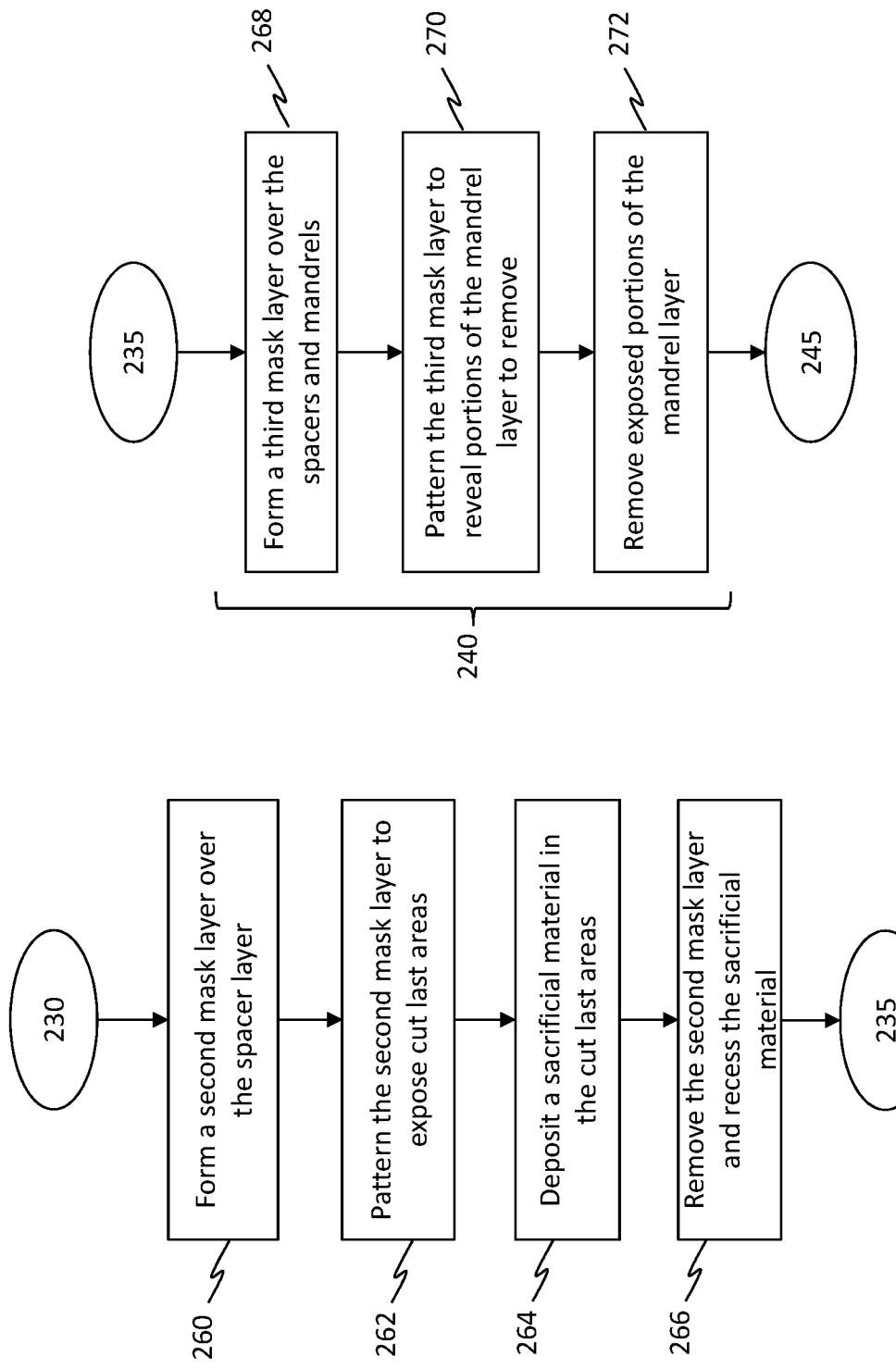

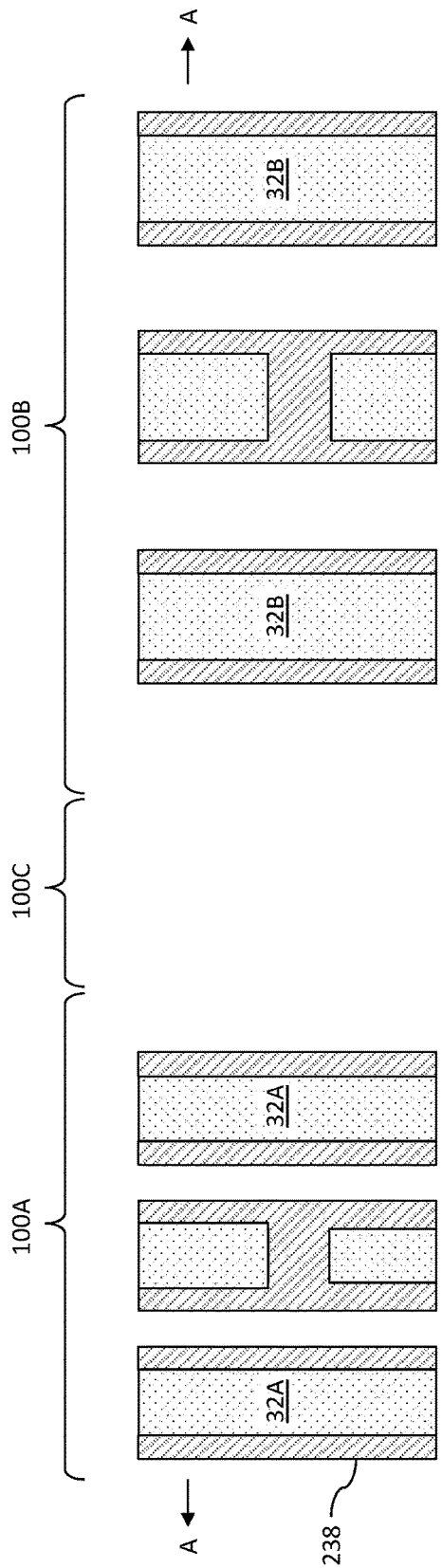
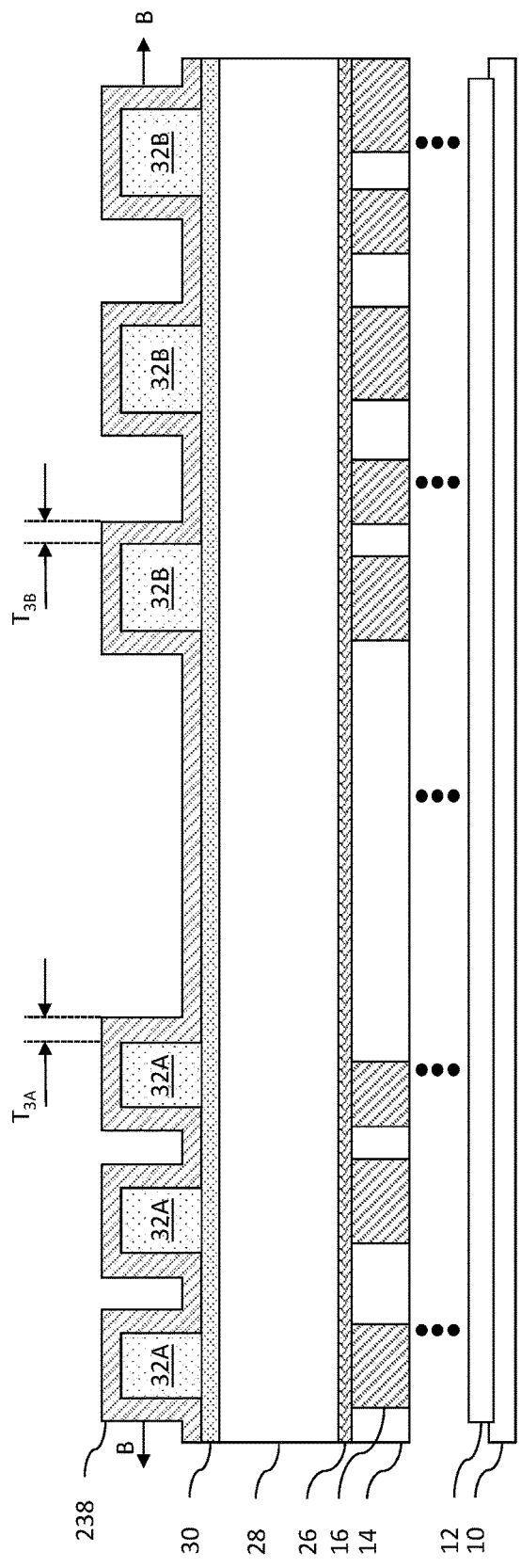
Figure 28B
Figure 28A

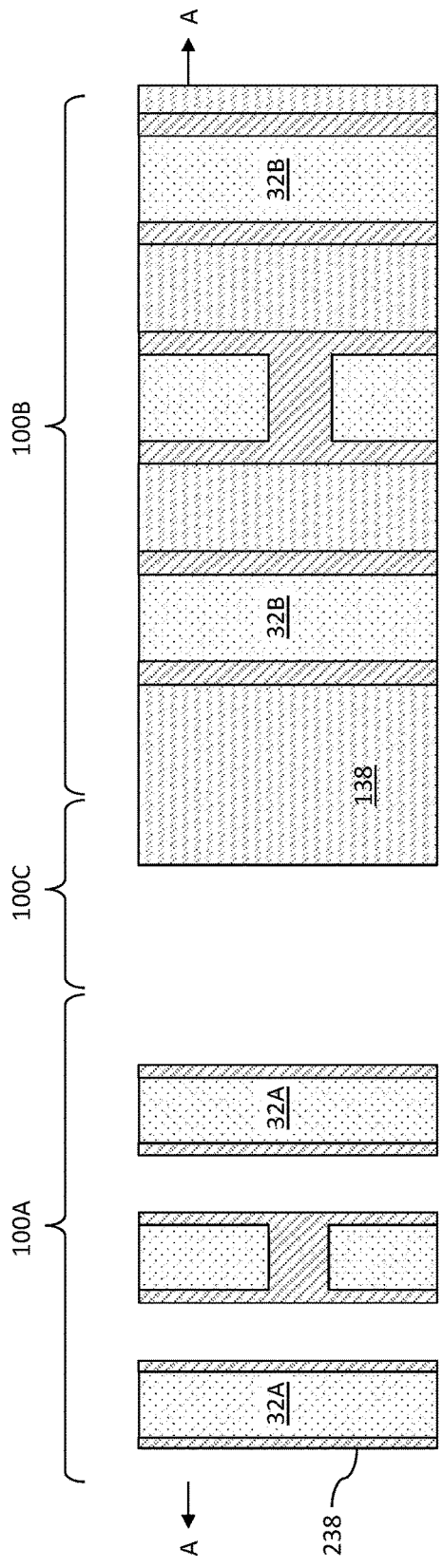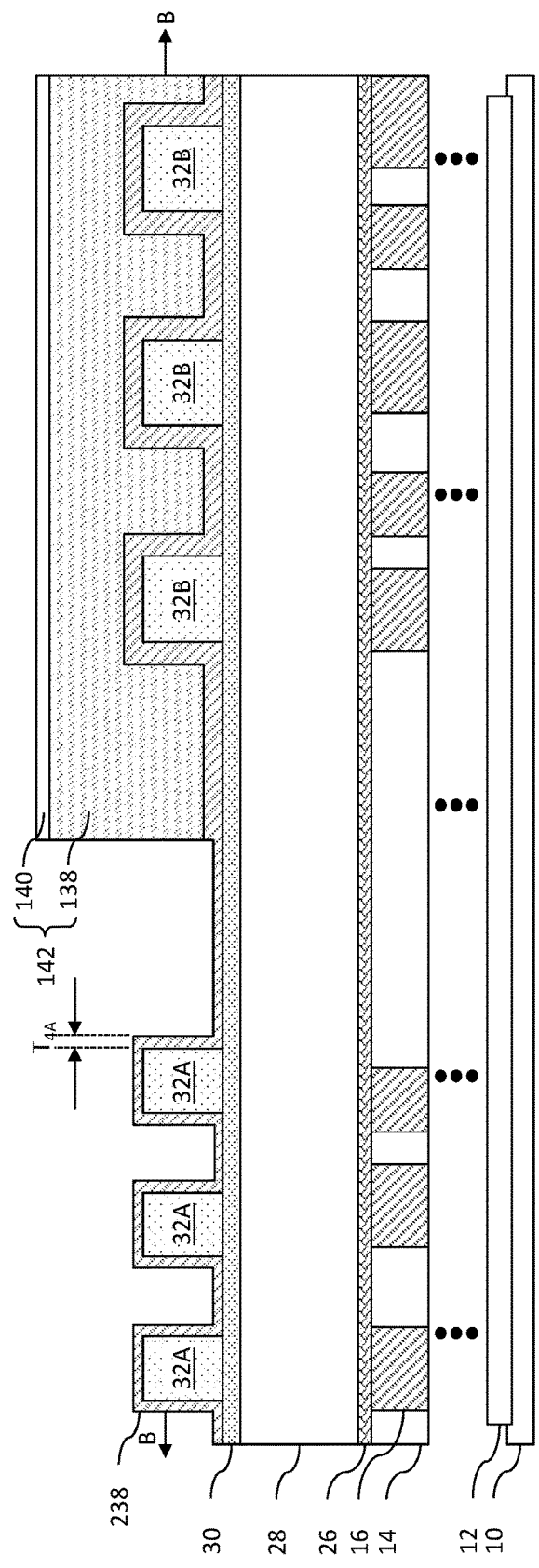

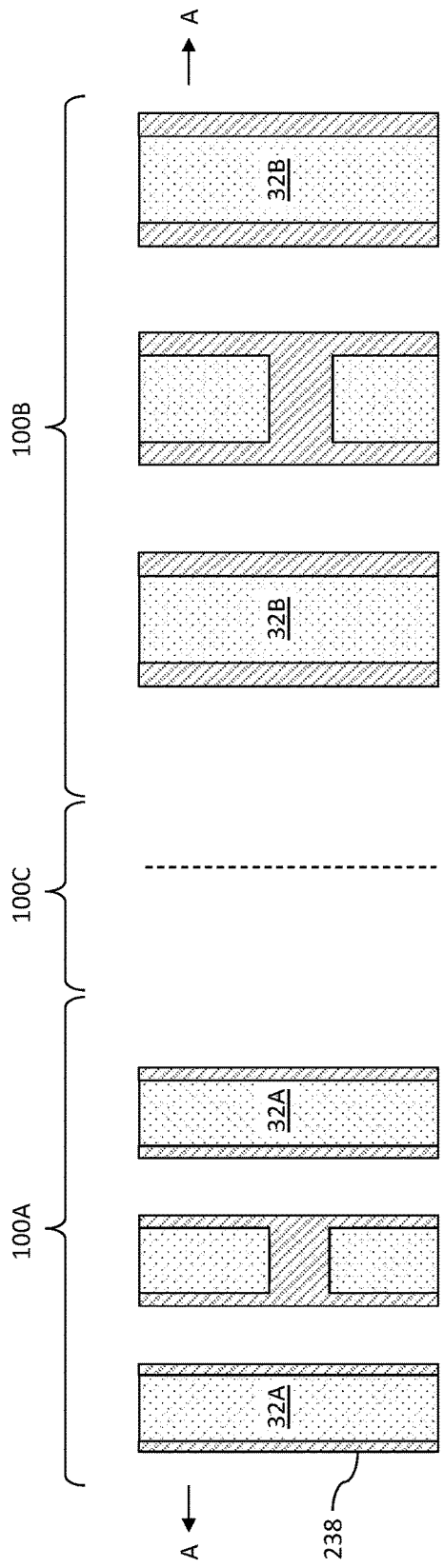
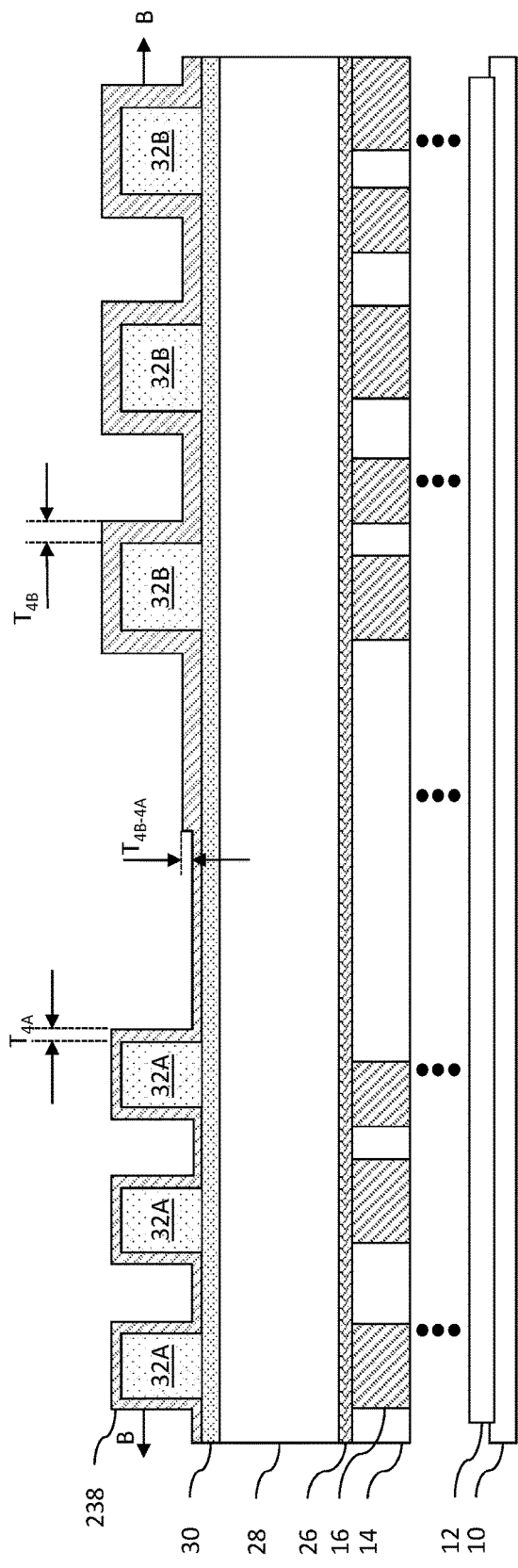
Figure 31B
Figure 31A

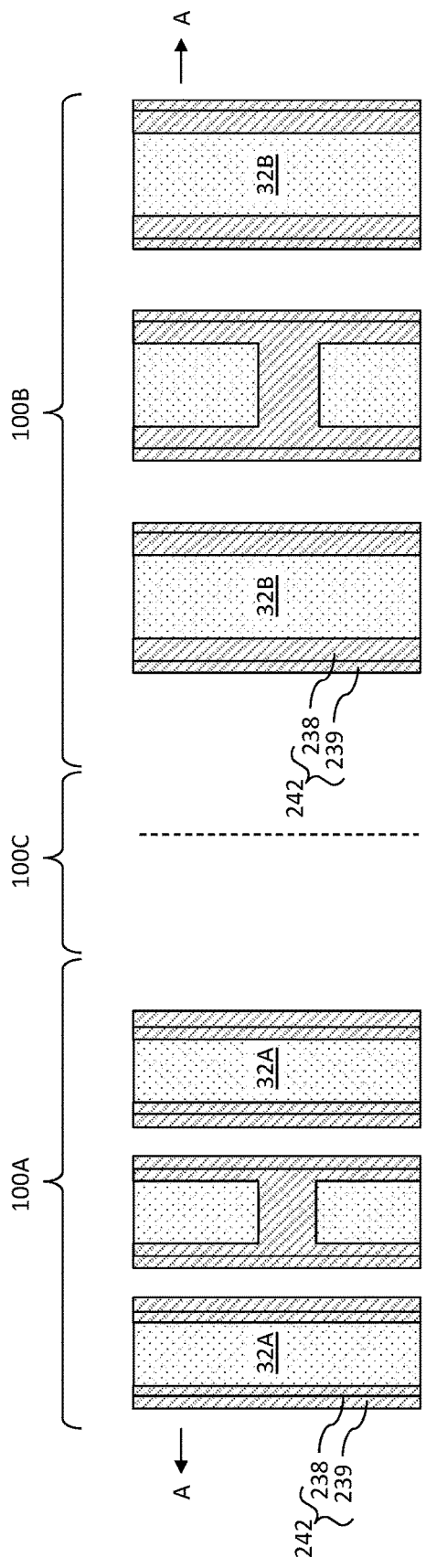
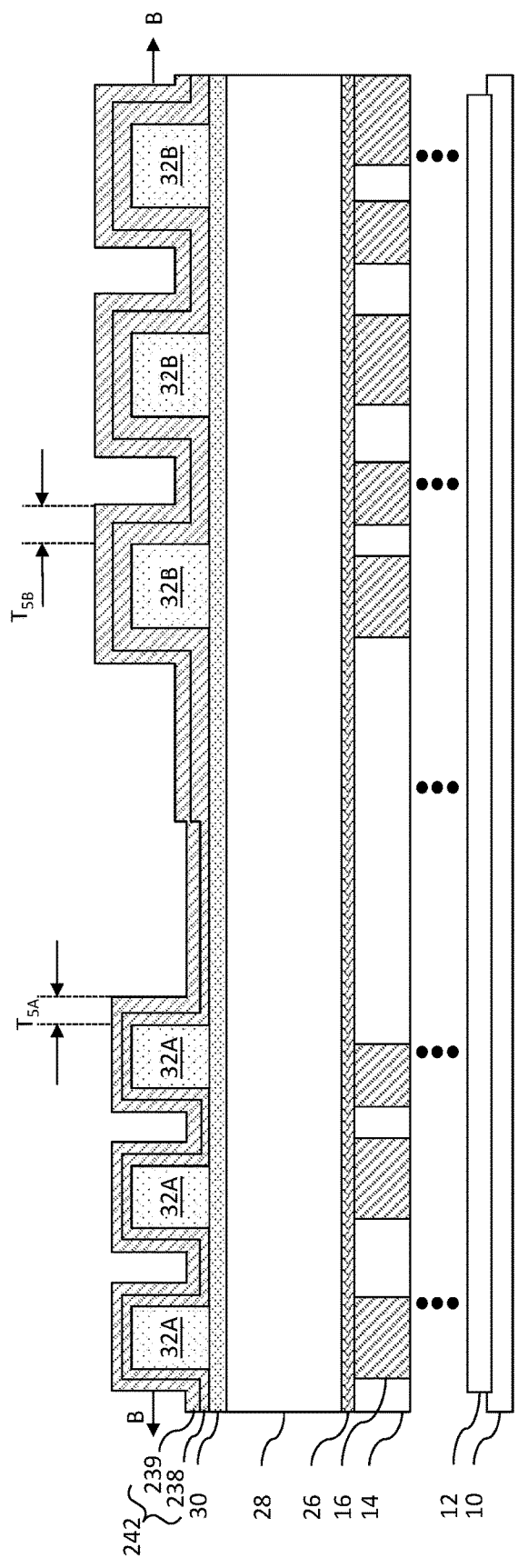
Figure 32B
Figure 32A

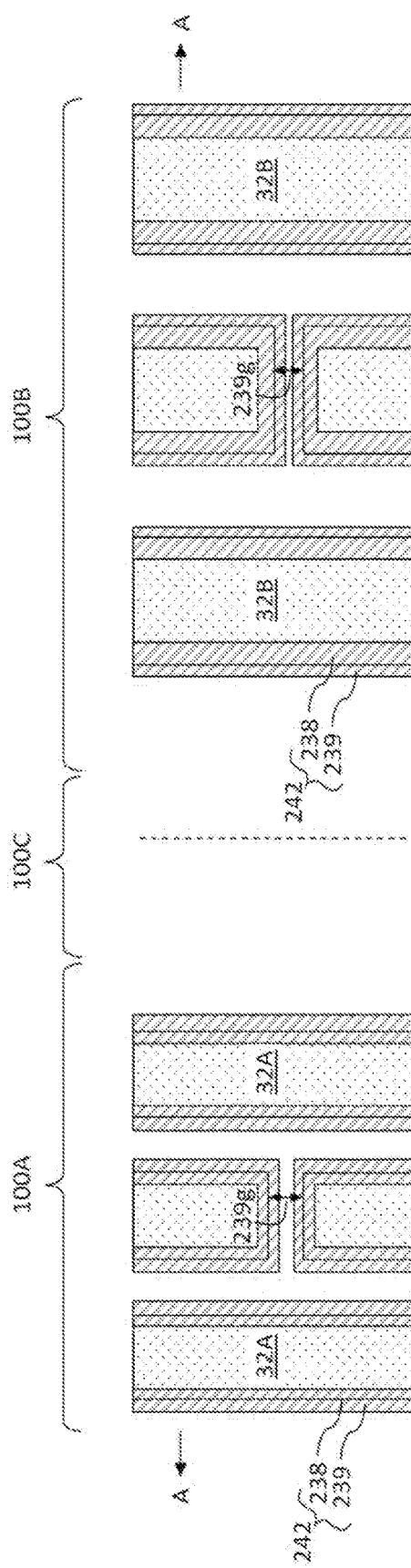
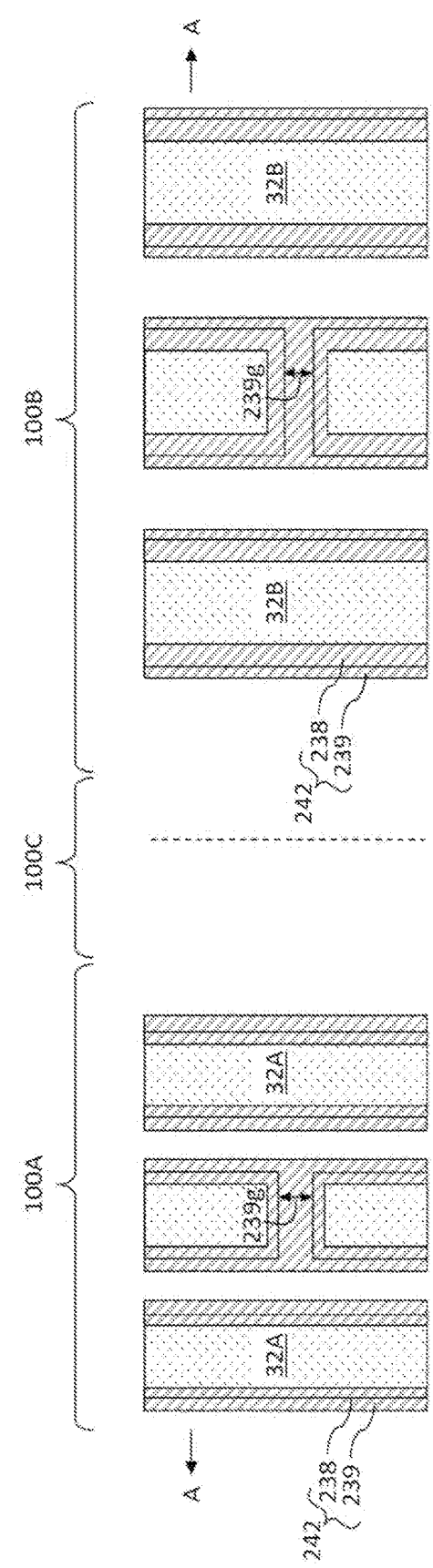
Figure 32C
Figure 32D

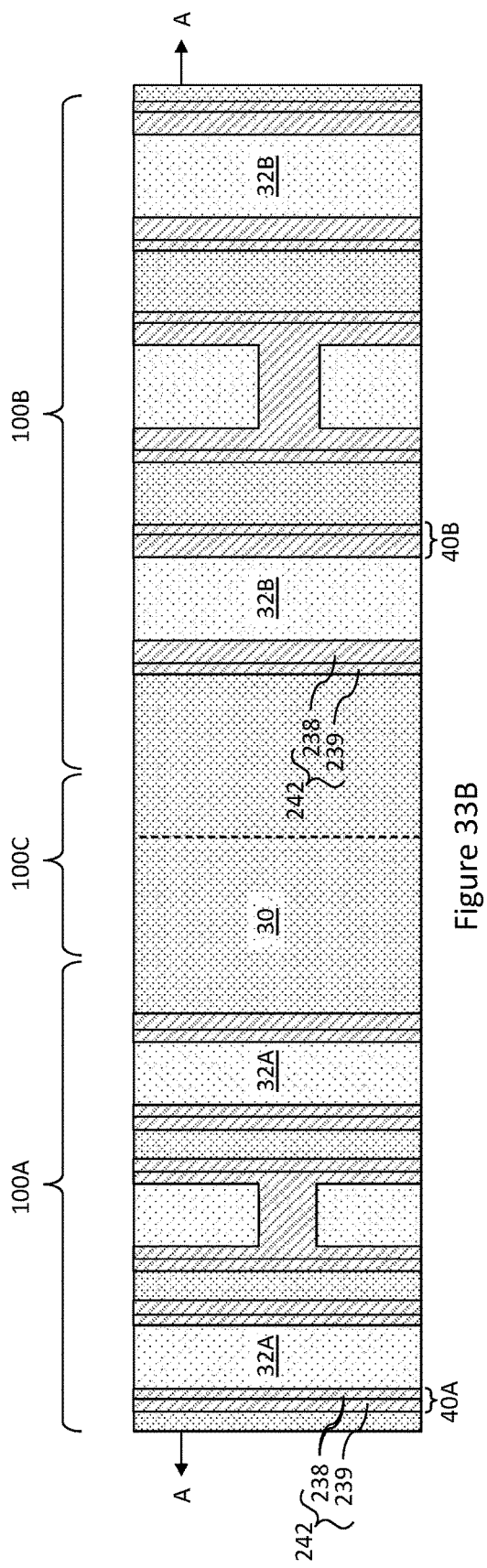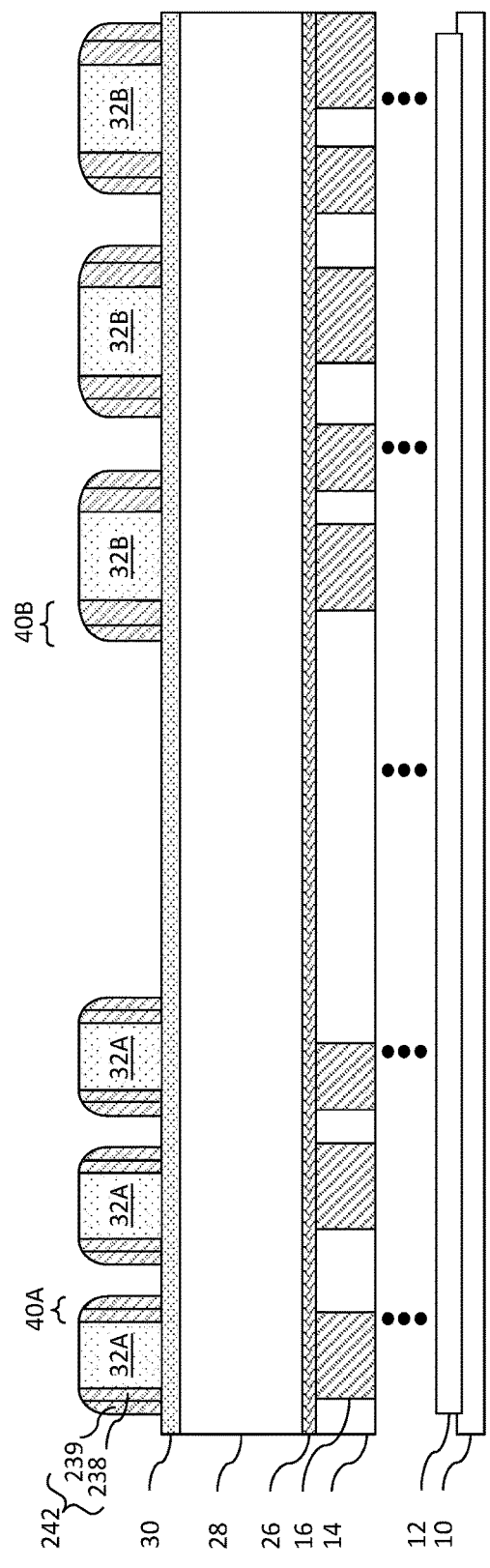

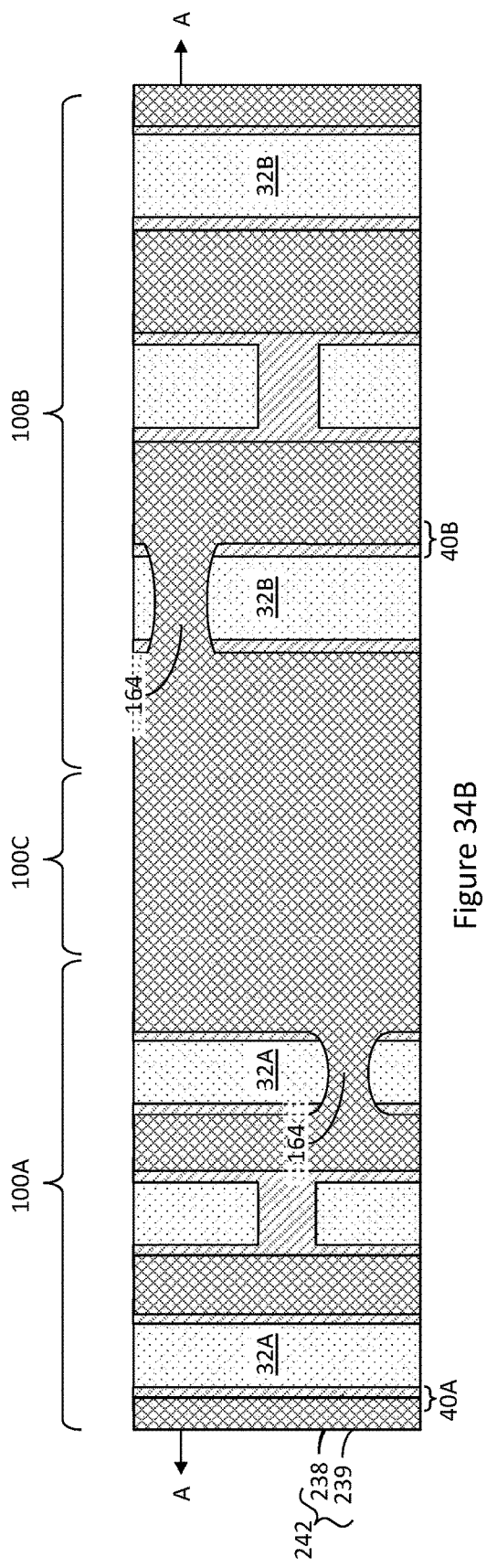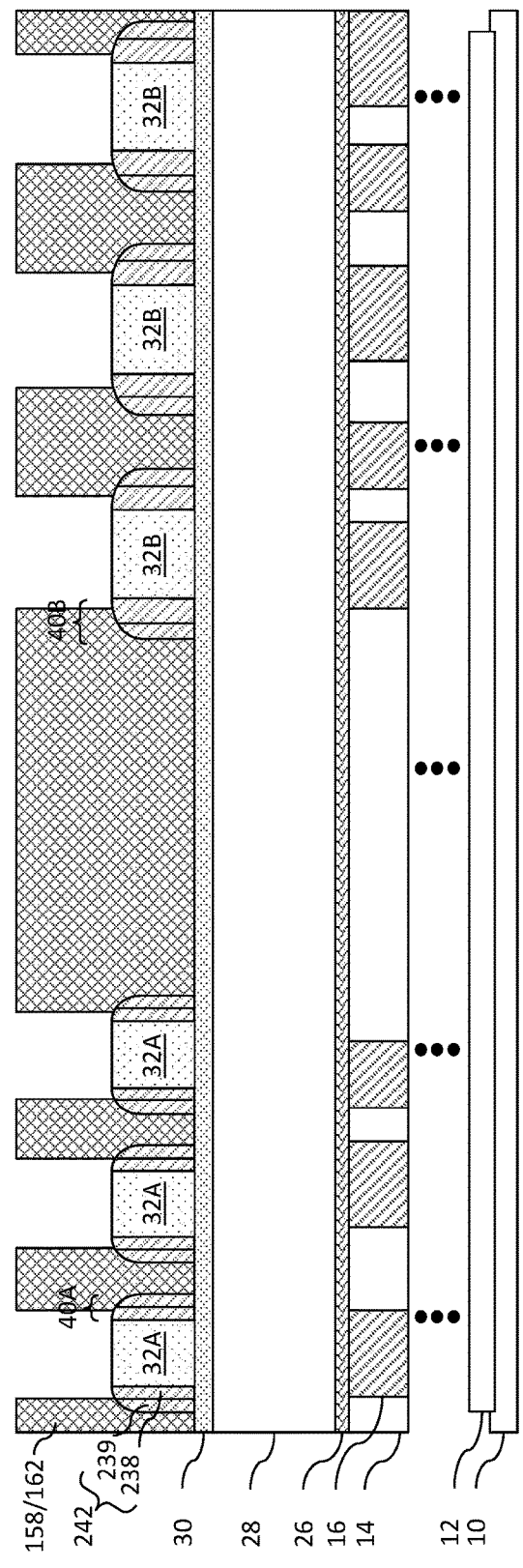

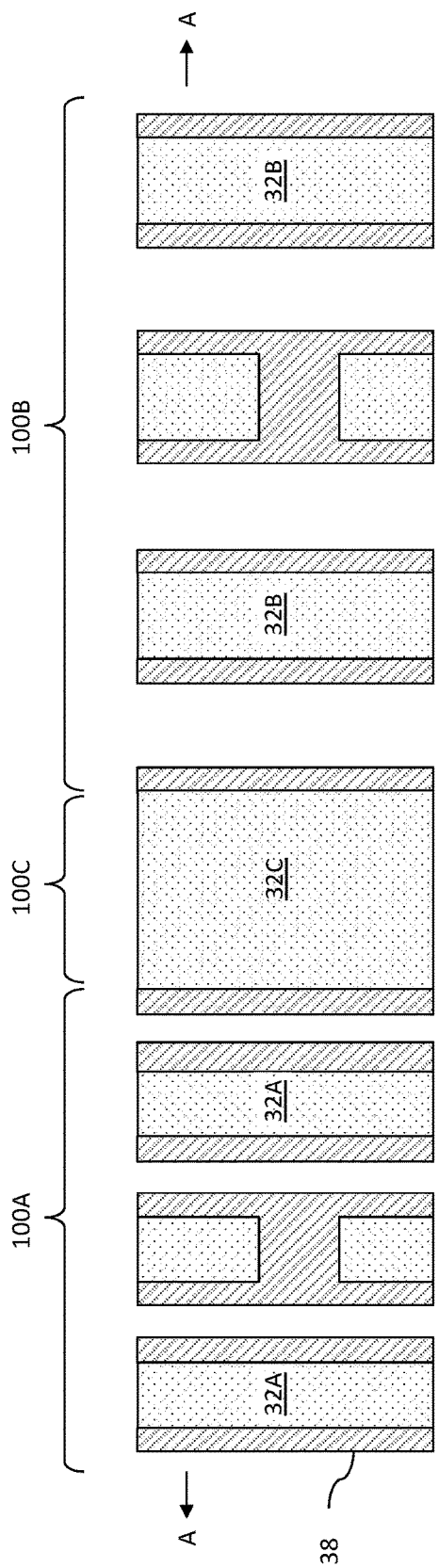
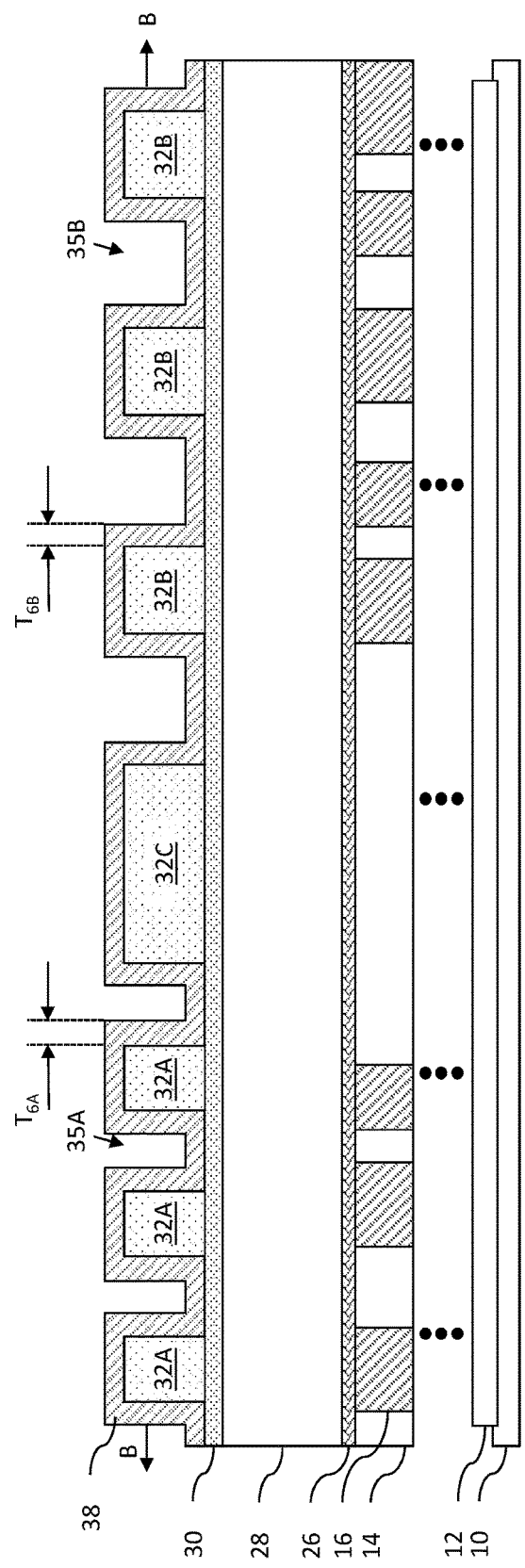
Figure 39B
Figure 39A

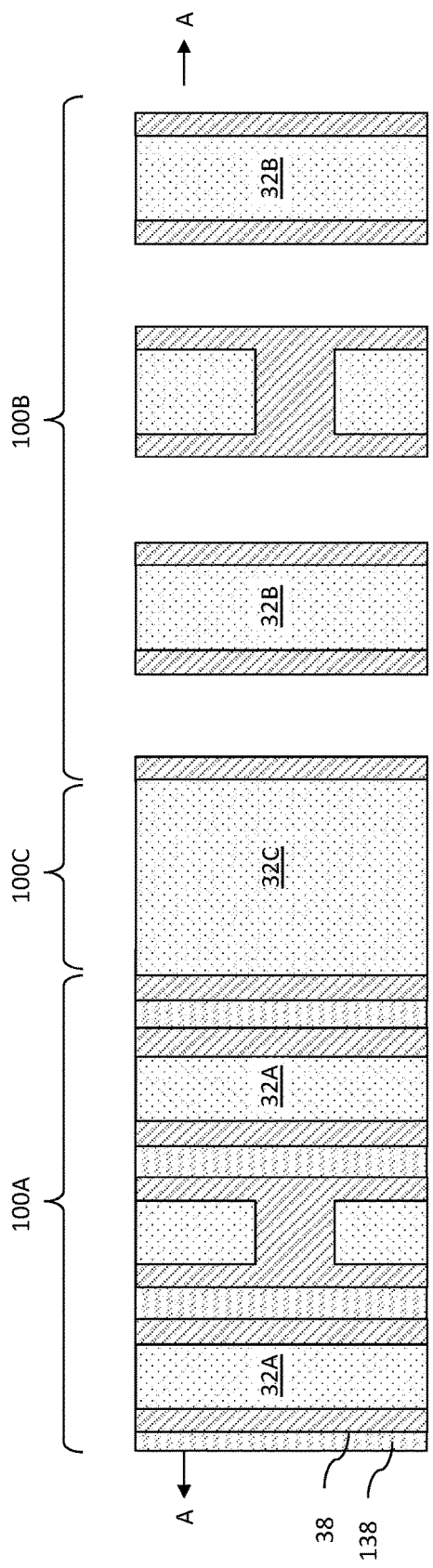
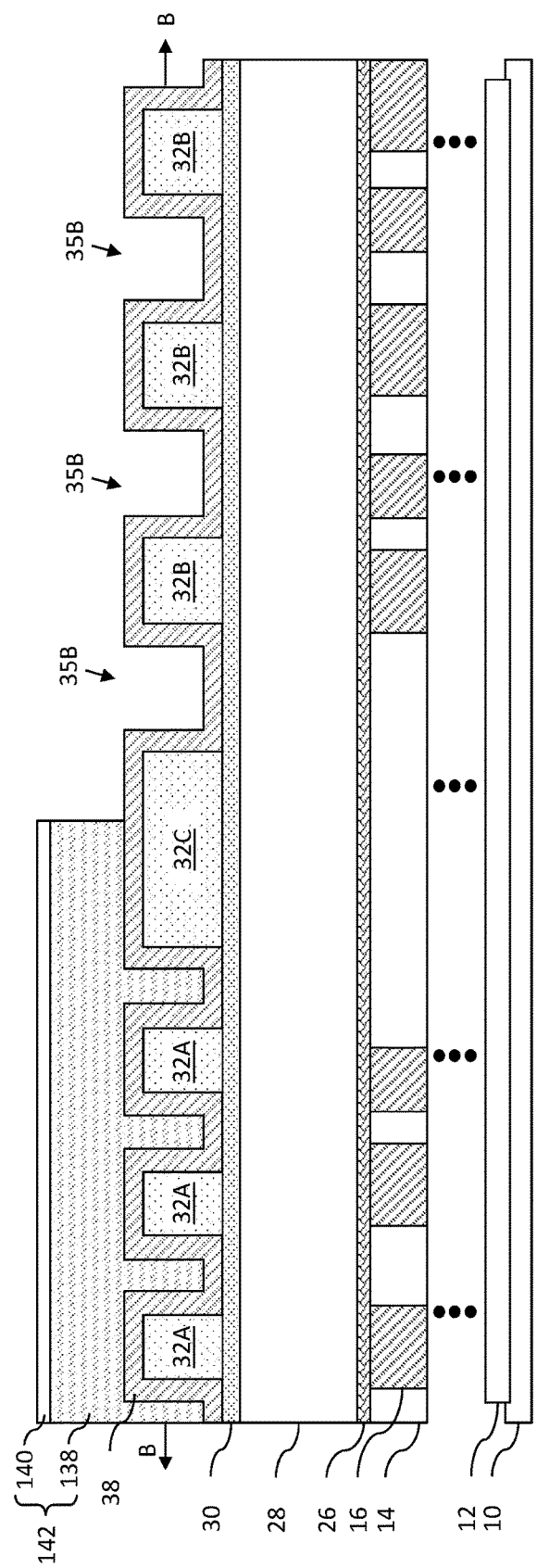
Figure 40B
Figure 40A

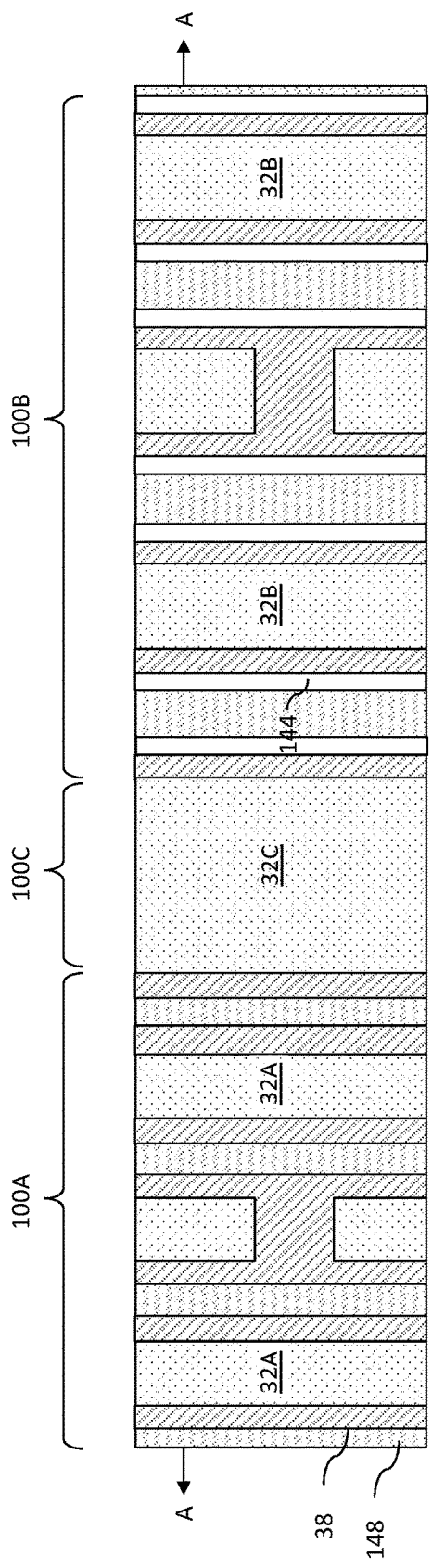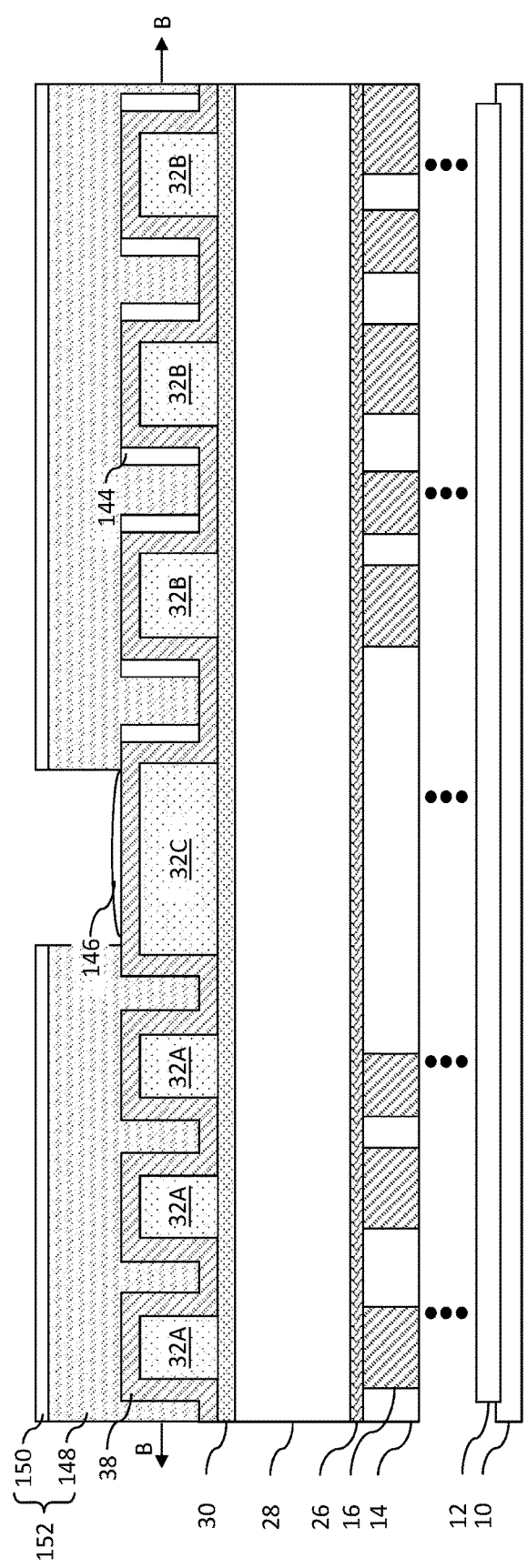

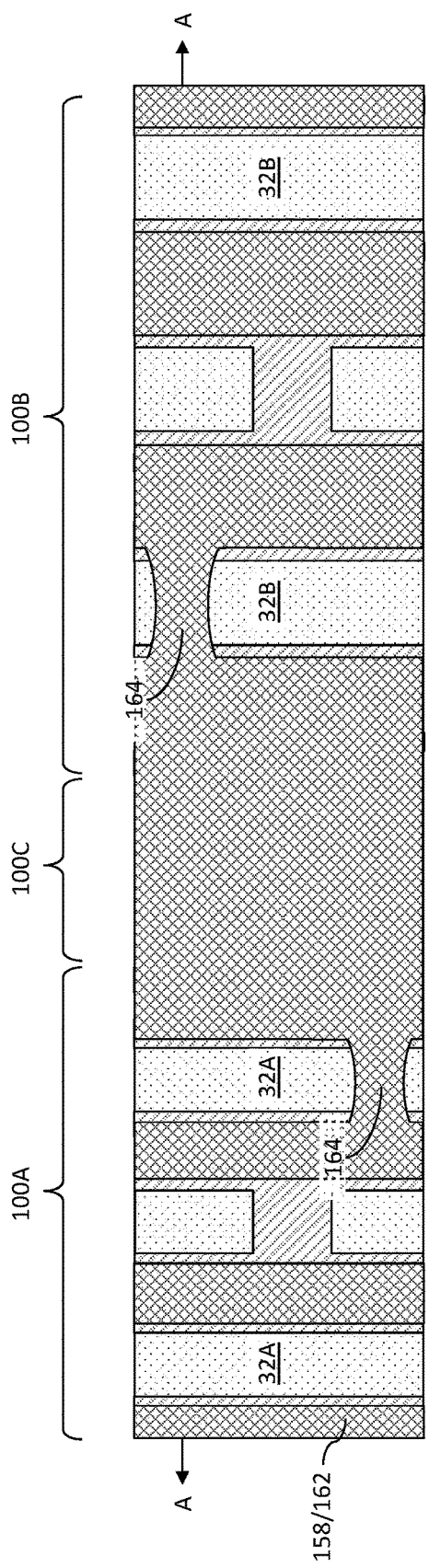
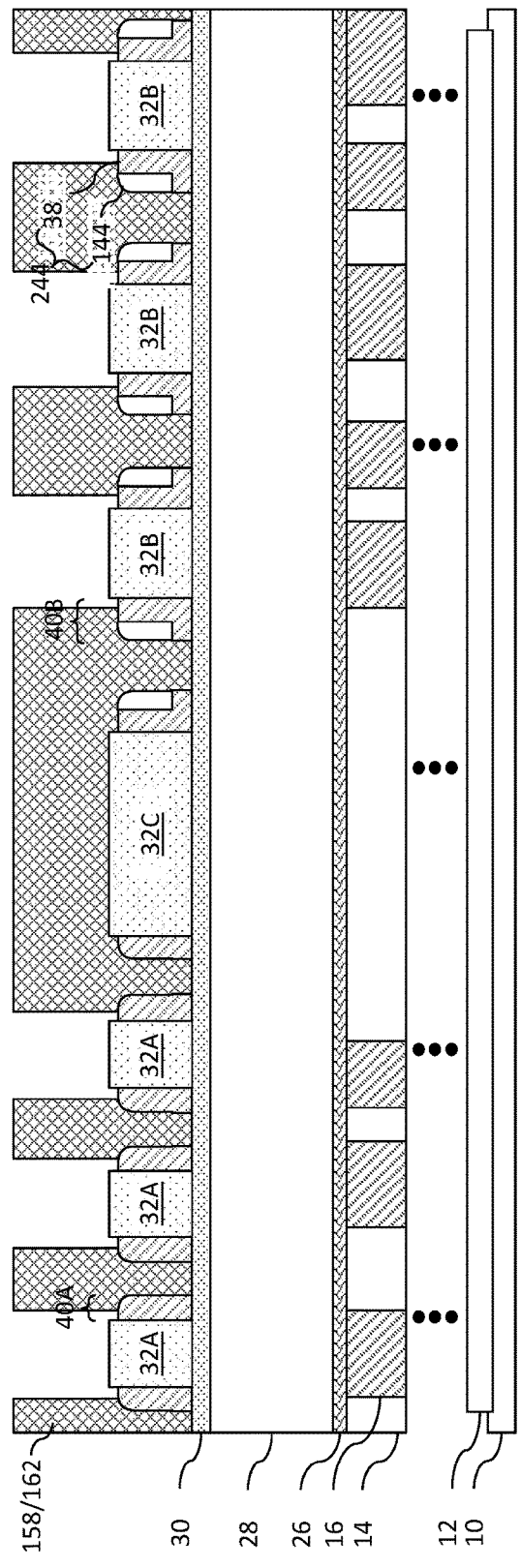
Figure 46B
Figure 46A

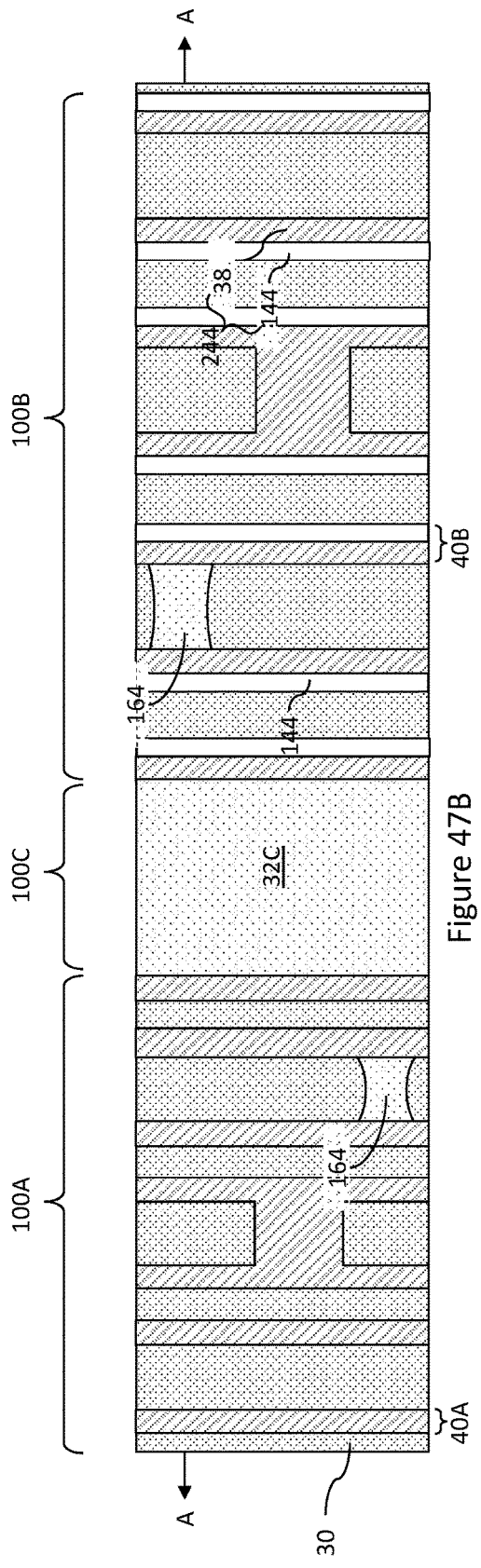
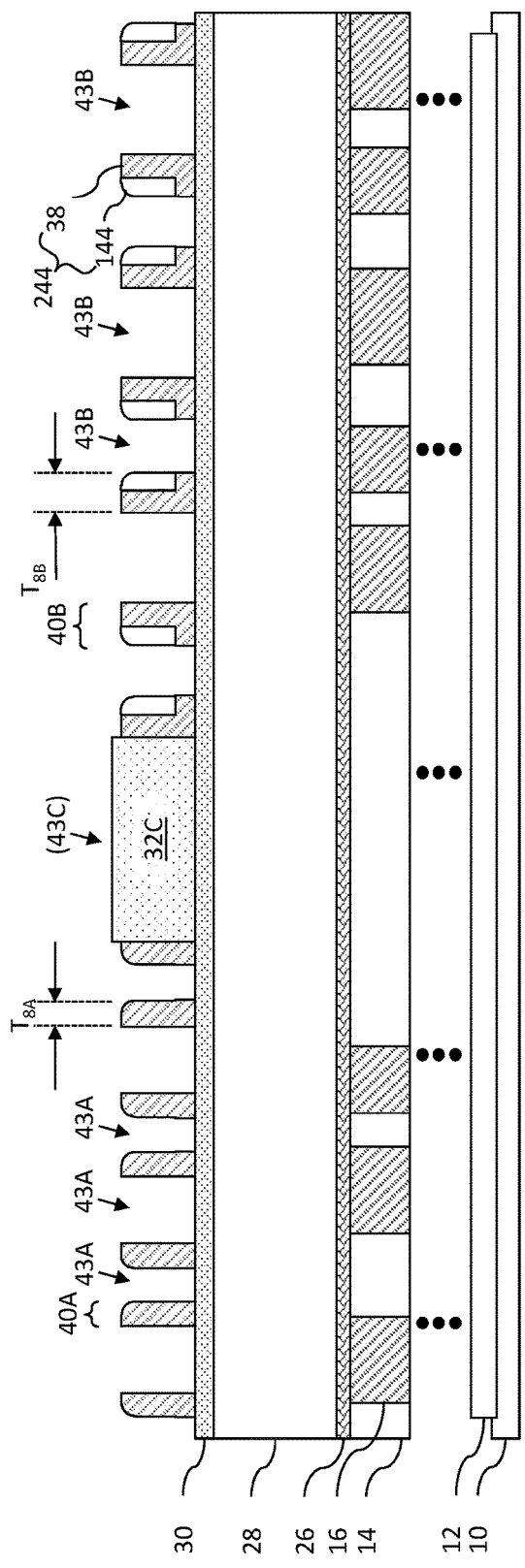
Figure 47B
Figure 47A

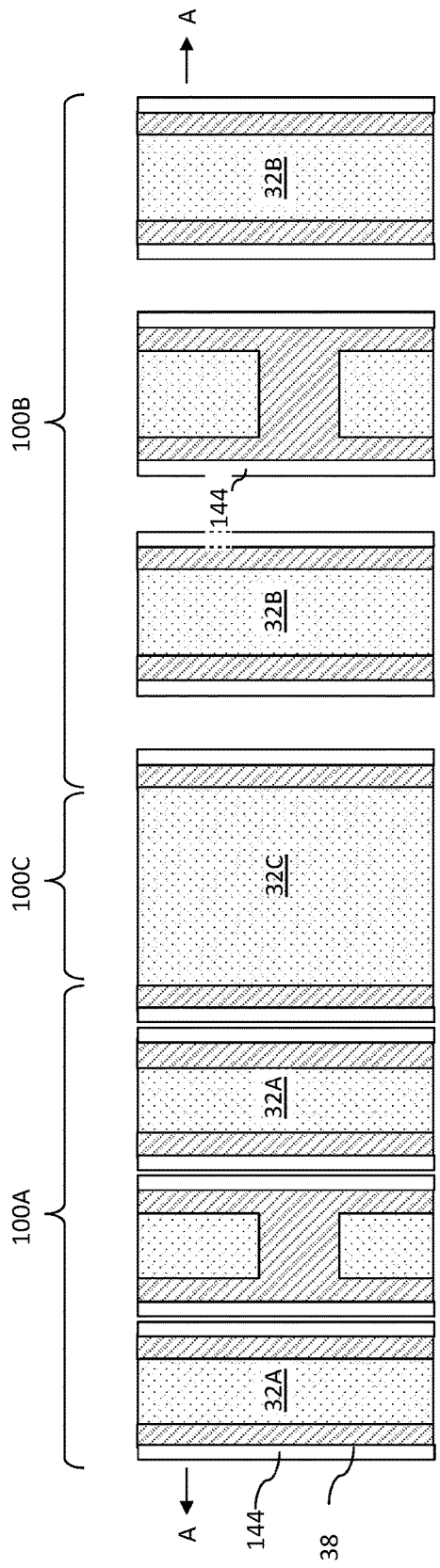
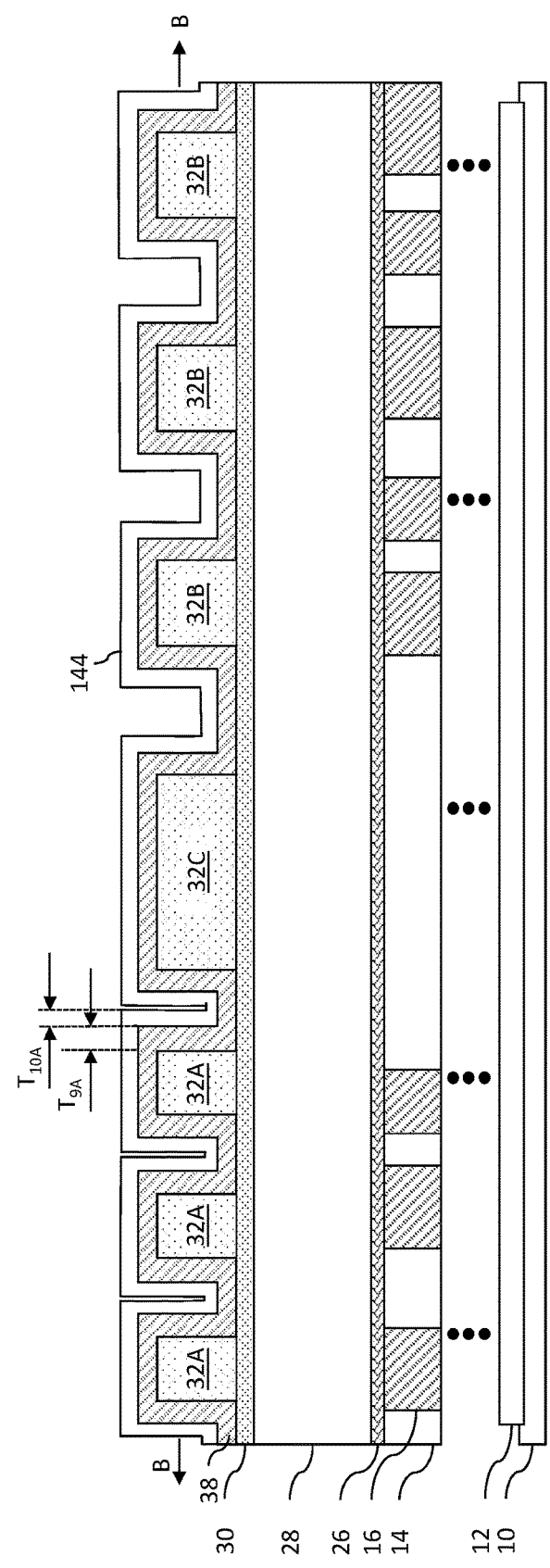
Figure 49B
Figure 49A

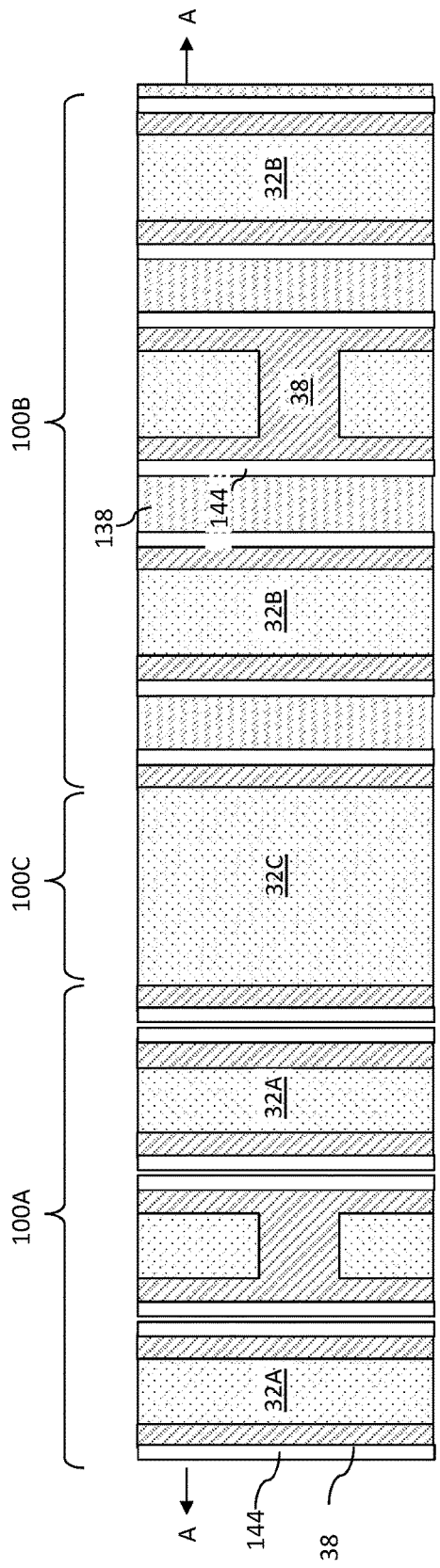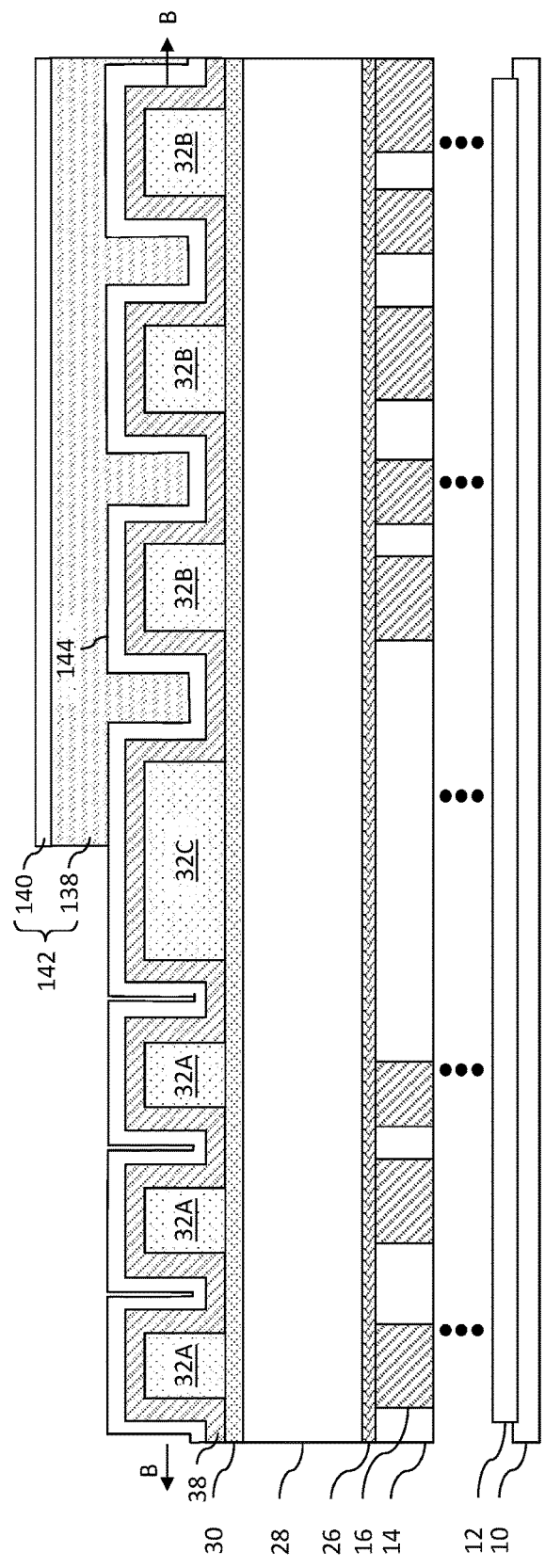

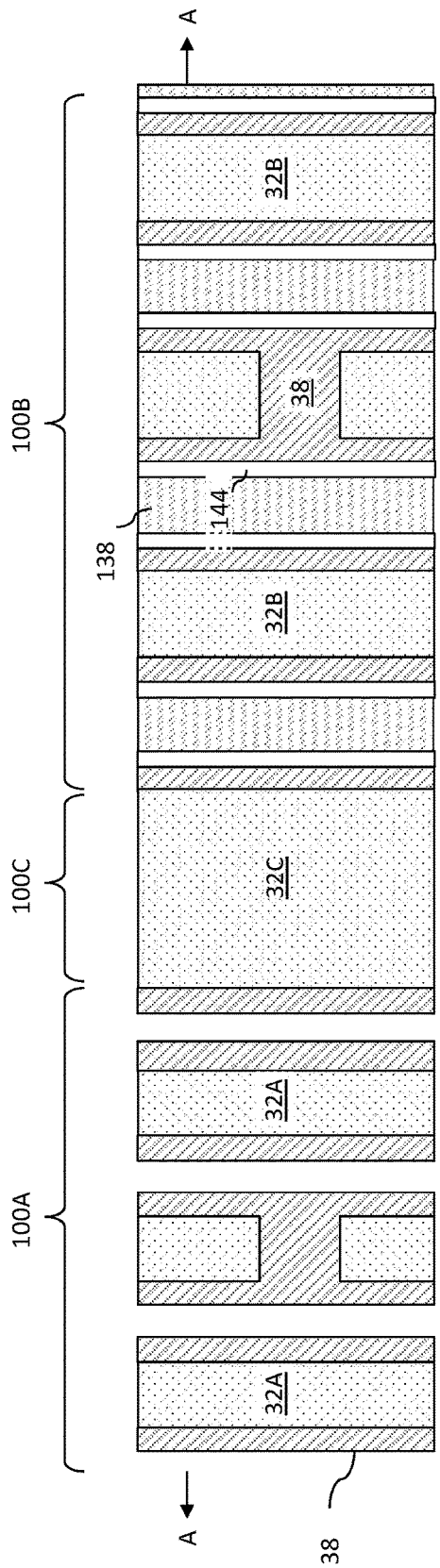
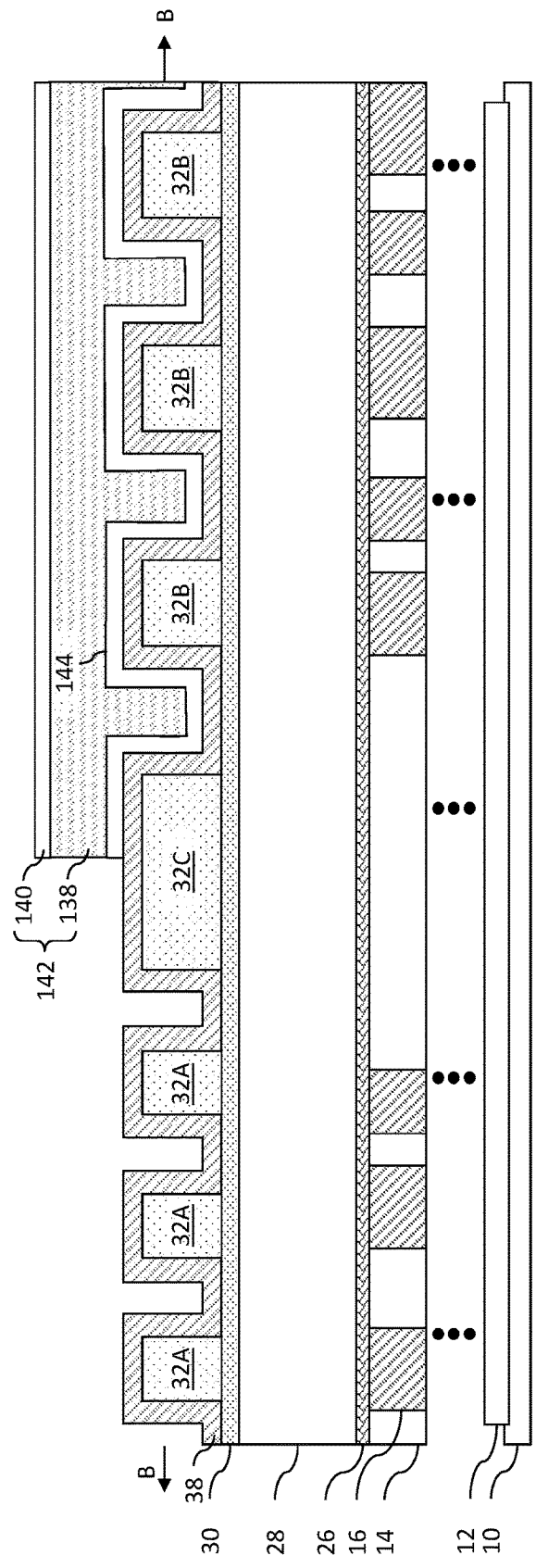
Figure 51B
Figure 51A

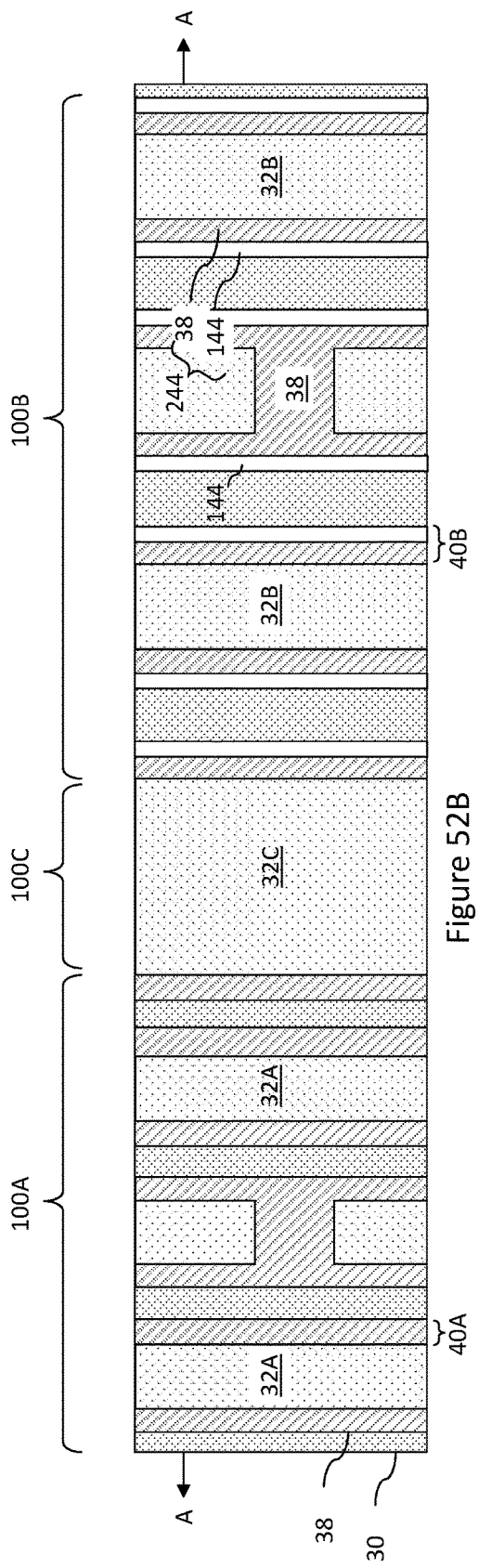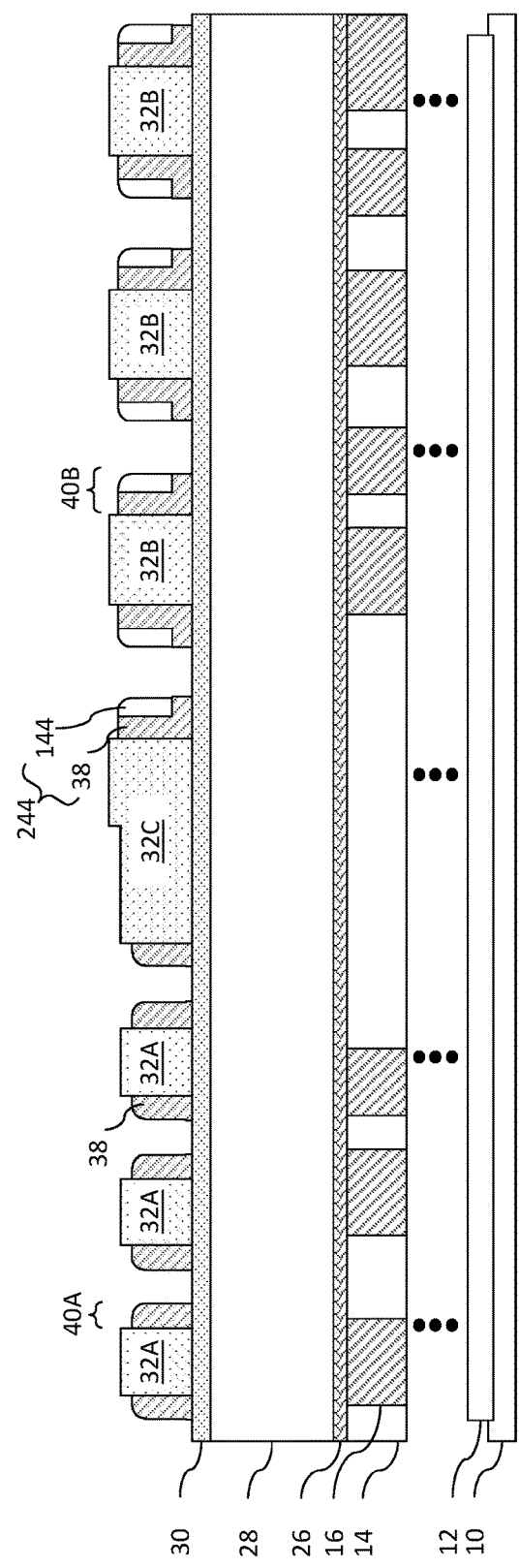

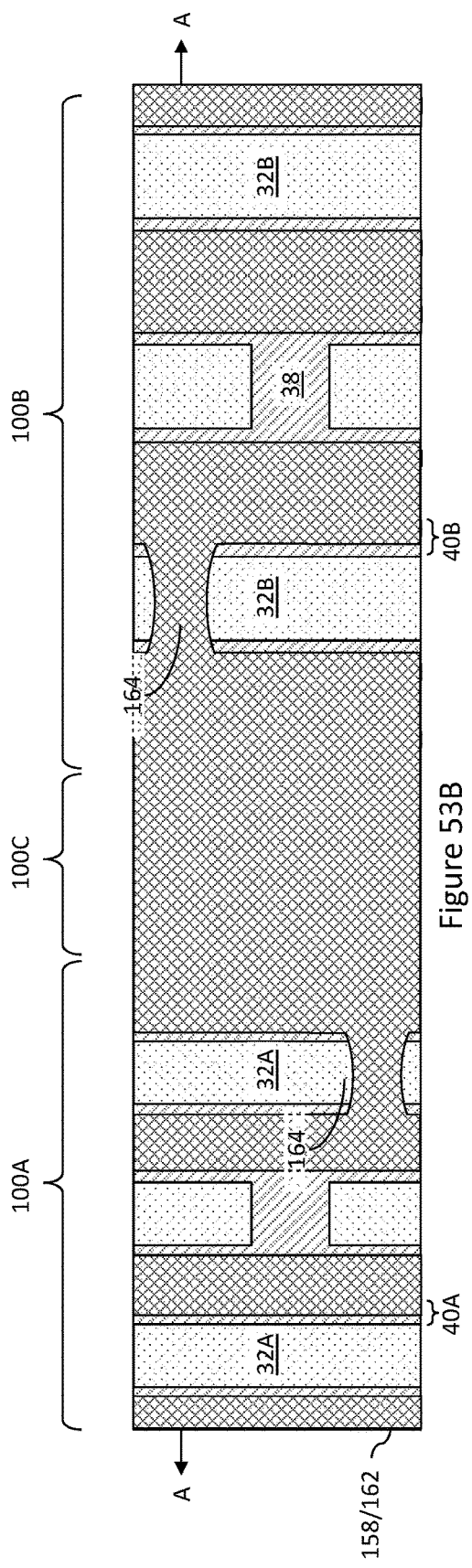
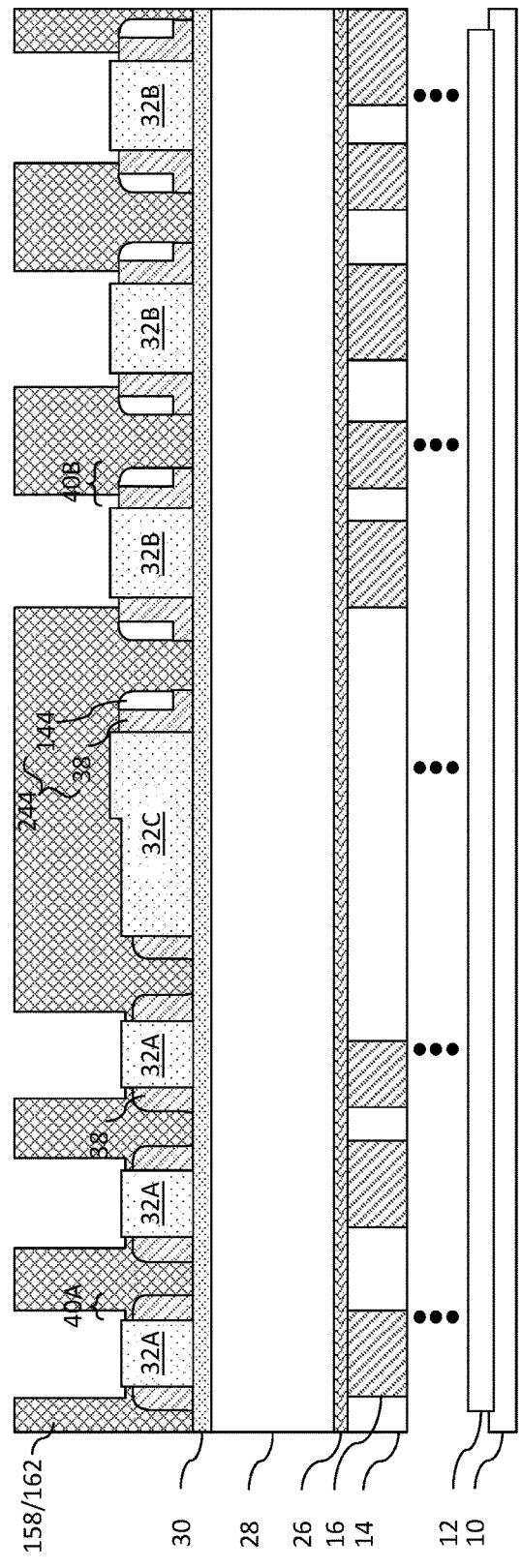

SELF-ALIGNED DOUBLE PATTERNING

PRIORITY CLAIM AND CROSS-REFERENCE

This application is a continuation of application Ser. No. 17/018,705, filed on Sep. 11, 2020 which claims the benefit of the following provisionally filed U.S. patent application: Application Ser. No. 62/927,336, filed Oct. 29, 2019, and entitled "Vary Space Method in Self-Aligned Double Patterning," which applications are hereby incorporated herein by reference.

BACKGROUND

Double patterning is a technology developed for lithography to enhance the feature density. Typically, for forming features of integrated circuits on wafers, the lithography technology is used, which involves applying a photo resist, and defining features on the photo resist. The features in the patterned photo resist are first defined in a lithography mask, and are implemented either by the transparent portions or by the opaque portions in the lithography mask. The features in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. In the double patterning technology, the closely located features are separated to two photolithography masks of a same double-patterning mask set, with both masks used to expose the same photo resist, or used to pattern the same hard mask. In each of the masks, the distances between features are increased over the distances between features in the otherwise a single mask, and hence the optical proximity effect is reduced, or substantially eliminated in the double patterning masks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C through 24A and 24B are cross-sectional views and top views of intermediate stages in the formation of metal lines in accordance with some embodiments.

FIGS. 25-27 illustrates various process flows for forming metal lines in accordance with some embodiments.

FIGS. 28A and 28B through FIGS. 35A and 35B are cross-sectional views and top views of intermediate stages in the formation of metal lines in accordance with some embodiments.

FIGS. 37A and 37B through FIGS. 47A and 47B are cross-sectional views and top views of intermediate stages in the formation of metal lines in accordance with some embodiments.

FIGS. 49A and 49B through FIGS. 54A and 54B are cross-sectional views and top views of intermediate stages in the formation of pillars of sacrificial material in accordance with some embodiments.

DETAILED DESCRIPTION

Figure 1C:
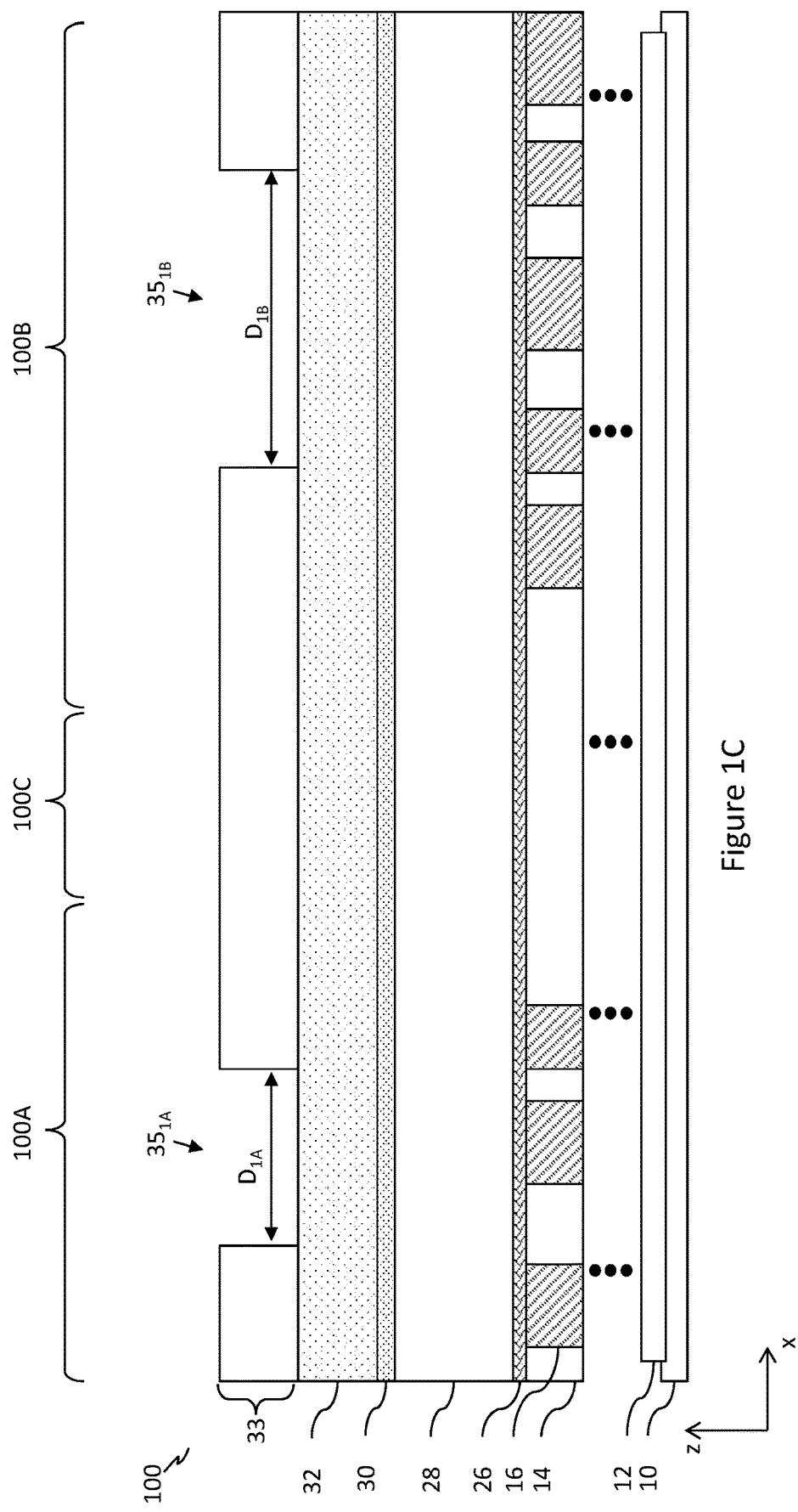

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Features such as metal lines and the methods of forming the same are provided in accordance with various exemplary embodiments. The intermediate stages of forming the features are illustrated in accordance with some embodiments. Some variations of some embodiments are discussed. Throughout the various views and illustrative embodiments, like reference numbers are used to designate like elements.

In general, self-aligned double patterning (SADP) works by using a base pattern, sometimes called a mandrel layer which is patterned using available photolithographic processes. Then, a spacer layer is conformally deposited over the mandrel layer base pattern and etched to remove horizontal portions of the spacer layer. After the mandrel layer base pattern is removed, the remaining vertical portions of the spacer layer then become a mask to pattern an underlying layer. These vertical portions of the spacer layer have a width that is determined by how thick the spacer layer is deposited.

Embodiments are provided which are able to achieve different thicknesses of the spacer layer which is deposited over the mandrel layer. When the spacer layer is etched to remove the horizontal portions, the resulting mask can have different widths in different areas of a single die or wafer. A mask with a greater width provides greater separation between subsequently formed metal lines, while a mask with a smaller width provides less separation between the subsequently formed metal lines. These differences can advantageously be used in die design to achieve smaller die areas where the metal lines need less separation, while maintaining larger separation in other areas of the die. As a result, the total die area can advantageously be reduced. For example, by controlling the widths of the separation between metal lines, capacitance effects between the lines can be controlled. Areas of a device which are sensitive to capacitance effects can use spacers which are thicker to provide more separation, while areas of a device which are less sensitive can use spacers which are thinner to provide less separation. Embodiments provide ways of having thicker or thinner spacers all within the same device die and patterning processes.

FIGS. 1A, 1B, and 1C through 24A and 24B illustrate top views and cross-sectional views of intermediate stages in the formation of features in a target layer in accordance with some example embodiments. FIGS. 28A and 28B through 35A and 35B illustrate top views and cross-sectional views of intermediate stages in the formation of features in a target layer in accordance with other example embodiments. FIGS. 37A and 37B through 47A and 47B illustrate top views and cross-sectional views of intermediate stages in the formation of features in a target layer in accordance with yet other example embodiments. FIGS. 49A and 49B through 54A and 54B illustrate top views and cross-sectional views of intermediate stages in the formation of features in a target layer in accordance with some example embodiments.

In FIGS. 1A, 1B, and 1C through 24A and 24B, FIGS. 28A and 28B through FIGS. 35A and 35B, FIGS. 37A and 37B through FIGS. 47A and 47B, and FIGS. 49A and 49B through FIGS. 54A and 54B, the figure numbers may include letter "A", letter "B", or letter "C." The letter "A" indicates that the respective figure shows a vertical cross-sectional view. The letter "B" indicates that the respective figure shows a top view or a horizontal cross-sectional view through an upper layer. The letter "C" indicates that the respective figure shows a vertical cross-sectional view. The figures having the same digits and different letters "A", "B", and "C" indicate that they are the different views of a same process step. Furthermore, the cross-sectional views in the "A" Figures are obtained from the plane containing line A-A in the respective "B" Figures, (where applicable) the cross-sectional views in the "B" Figures are obtained from the plane containing the line B-B in the respective "A" Figures, and the cross-sectional views in the "C" Figures are obtained from the plane containing the line C-C in the respective "B" Figures.

FIG. 1A illustrates a cross-sectional view of wafer 100 along the line A-A (see FIG. 1B), which includes substrate 10 and the overlying layers. FIG. 1B is a top down view of the wafer 100 of FIGS. 1A and 1C. FIG. 1C illustrates a cross-sectional view of wafer 100 along the line C-C (see FIG. 1B). FIG. 1B includes a first region 100A, a second region 100B, and a third region 100C. The first region 100A will have metal features including metal lines and vias formed at a first pitch and the second region 100B will have metal features including metal lines and vias formed at a second pitch. In other words, the spacing between the lines and/or widths of the lines will be different in the first region 100A than in the second region 100B. The optional third region 100C is a region which has no metal lines formed therein. The wafer may have multiples of each of the first region 100A, second region 100B, and third region 100C.

Substrate 10 may be formed of a semiconductor material such as silicon, silicon germanium, or the like. In accordance with some embodiments of the present disclosure, substrate 10 is a crystalline semiconductor substrate such as a crystalline silicon substrate, a crystalline silicon carbon substrate, a crystalline silicon germanium substrate, a III-V compound semiconductor substrate, or the like. Active devices 12, which may include transistors therein, are formed at a top surface of substrate 10.

Dielectric layer 14 is formed over substrate 10. In accordance with some embodiments of the present disclosure, dielectric layer 14 is an Inter-Metal Dielectric (IMD) or an Inter-Layer Dielectric (ILD), which may be formed of a dielectric material having a dielectric constant (k value) lower than 3.8, lower than about 3.0, or lower than about 2.5, for example. Dielectric layer 14 may include a silicon oxide layer, such as a tetraethyl orthosilicate (TEOS) formed silicon oxide, or the like. In accordance with some embodiments of the present disclosure, conductive features 16, which may be metallic features such as copper lines or tungsten contact plugs, or the like, are formed in dielectric layer 14. In some embodiments, etch stop layer 26 formed over dielectric layer 14. Etch stop layer 26 may be formed of a dielectric material such as silicon carbide, silicon nitride, silicon oxy-carbide, silicon oxy-nitride, or the like. In some embodiments, etch stop layer 26 may be omitted.

Dielectric layer 28 is further formed over etch stop layer 26. Dielectric layer 28 may be an IMD layer, which is formed of a dielectric material having a dielectric constant (k value) lower than 3.8, lower than about 3.0, or lower than about 2.5, for example. Dielectric layer 14 may include a silicon oxide layer, such as a TEOS formed silicon oxide, or the like. Dielectric layer 28 may be a compound including carbon, and may have pores therein. In accordance with alternative embodiments of the present disclosure, dielectric layer 28 is a non-low-k dielectric layer having a k value equal to or higher than 3.8. Throughout the description, layer 28 is also referred to as the target layer 28. A plurality of patterned features is to be formed within target layer 28 in accordance with some embodiments of the present disclosure.

In accordance with other embodiments, layer 28 is a semiconductor substrate. In accordance with these embodiments of the present disclosure, one or more of the additional layers underlying layer 28 may be omitted. Hence, the illustrated substrate 10, dielectric layer 14, and conductive features 16 as shown in FIG. 1A may not exist in accordance with these embodiments.

Over target layer 28 resides hard mask 30, which may be formed of a dielectric material such as silicon oxide (such as TEOS formed oxide), silicon nitride, Nitrogen-Free Anti-Reflective Coating (NFARC, which is an oxide), silicon carbide, silicon oxynitride, silicon oxy-carbide, or the like. The formation methods include Plasma Enhance Chemical Vapor Deposition (PECVD), High-Density Plasma (HDP) deposition, Chemical Vapor Deposition (CVD), Atomic Layer Deposition (ALD), or the like.

In some embodiments, the hard mask 30 may include multiple layers (see, e.g., FIGS. 19A and 19B). A bottom layer of the hard mask 30 may be a nitrogen free anti-reflective coating (NFARC) and may be between about 6 nm and 30 nm thick. The next layer may be a hard mask material such as a nitride, such as silicon nitride, titanium nitride, tantalum nitride, and so forth and may be formed between about 20 nm and 25 nm thick. The next layer may be an oxide layer, such as a TEOS formed silicon oxide, silicon carbide, silicon oxycarbide, and so forth, and the like, and may be formed between about 20 nm and about 30 nm.

Hard mask 32 is formed over hard mask 30. In accordance with some embodiments of the present disclosure, hard mask 32 is in contact with hard mask 30, with no additional layer formed between hard mask 32 and hard mask 30. In accordance with some embodiments of the present disclosure, hard mask 32 is formed of amorphous silicon or another material that has a high etching selectivity relative to the underlying hard mask 30. For example, the etching selectivity, which is the ratio of the etching rate of hard mask 32 to the etching rate of hard mask 30, is greater than about 20 or greater than about 50 when hard mask 32 is etched. Throughout the description, hard mask 32 is also referred to as the mandrel layer 32.

FIGS. 1A, 1B, and 1C also illustrate a first photolithography process. Over the mandrel layer 32 is formed a photo mask 33 which has been patterned to form openings $35_{1A}$ and $35_{1B}$. It should be understood that, unless otherwise specified, any reference to a photo mask used herein may include a single photo resist or a tri-layer photo mask. Accordingly, photo mask 33 may include a single photo resist or a tri-layer photo mask. The tri-layer may include an under layer (sometimes referred to as a bottom layer), a middle layer over the under layer, and an upper layer over the middle layer. In accordance with some embodiments of the present disclosure, the under layer and the upper layer are formed of photo resists, which are formed of organic materials. The middle layer may be formed of an inorganic material, which may be a nitride (such as silicon nitride), an oxynitride (such as silicon oxynitride), an oxide (such as silicon oxide), or the like. The middle layer has a high etching selectivity with relative to the upper layer and the under layer, and hence the upper layer is used as an etching mask for the patterning of the middle layer, and the middle layer is used as an etching mask for the patterning of the under layer.

Photo mask 33 is applied and patterned to form openings $35_{1A}$ in the first region 100A and openings $35_{1B}$ in the second region 100B, for example, in a photo lithography process. The respective step is illustrated as step 205 in the process flow shown in FIG. 25. In accordance with some embodiments of the present disclosure, openings $35_1$ are in between areas that have the top-view shapes of strips, which are parallel to each other. Multiple openings may be formed apart from each other at different widths and different pitches. The pitches and widths for the first region 100A and the second region 100B are discussed in further detail with respect to FIGS. 3A, 3B, and 3C. The openings $35_{1A}$ in the first region 100A and the openings $35_{1B}$ in the second region 100B represent cross areas where metal features, such as metal lines may be formed going in the x direction. The openings $35_{1A}$ in the first region 100A may have a length dimension $D_{1A}$ between about 44 nm and about 100 nm and a width dimension $D_{2A}$ between about 6 nm and about 20 nm. The openings $35_{1B}$ in the second region 100B may have a length dimension $D_{1B}$ between about 50 nm and about 120 nm and a width dimension $D_{2B}$ between about 6 nm and about 20 nm. The dimension $D_{2A}$ may be the same value as the dimension $D_{2B}$. The pitch between an adjacent opening $35_{1A}$ in the first region 100A may be between about 20 nm and about 38 nm. The pitch between an adjacent opening $35_{1B}$ in the second region 100B may greater than the pitch in the first region 100A and may be between about 25 nm and about 45 nm. As noted above, pitches are illustrated below with respect to FIGS. 3A, 3B, and 3C.

Figure 2C:
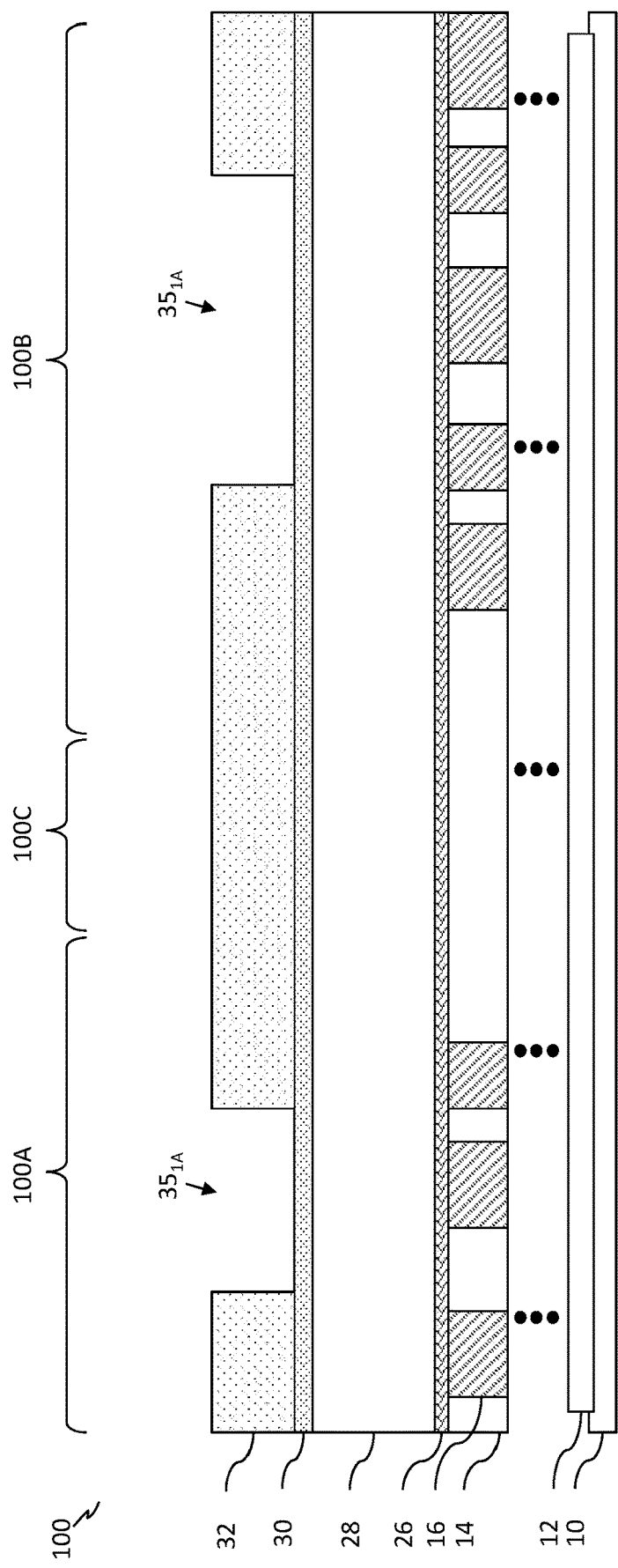

In FIGS. 2A, 2B, and 2C, an etching process is performed to extend the openings $35_{1A}$ and openings $35_{1B}$ in photo mask 33 into the mandrel layer 32. The respective step is illustrated as step 210 in the process flow shown in FIG. 25. The remaining photo mask 33 is then removed, for example, in an ashing step. The resulting structure is shown in FIGS. 2A, 2B, and 2C. The etching is anisotropic, so that the openings $35_{1A}$ and openings $35_{1B}$ in the mandrel layer 32 have the same or similar sizes as the respective openings in photo mask 33. In accordance with some embodiments of the present disclosure, openings $35_{1A}$ and openings $35_{1B}$ may include rectangular shaped openings. In some embodiments, a trimming process may be used prior to etching the mandrel layer 32, where the trimming process is an anisotropic etching process to further reduce the width of each of the patterns of the photo mask 33.

In accordance with some embodiments, the etching of the mandrel layer 32 is performed in a process chamber (not shown), which includes process gases such as $CF_4$, HBr, $Cl_2$, $O_2$, or combinations thereof. The flow rate of the process gases may be in the range between about 3 sccm and about 500 sccm. The pressure of the process gases may be in the range tween about 5 mTorr and about 50 mTorr. It is appreciated that the values recited in the present disclosure are examples, and different values may be adopted.

Figure 3C:
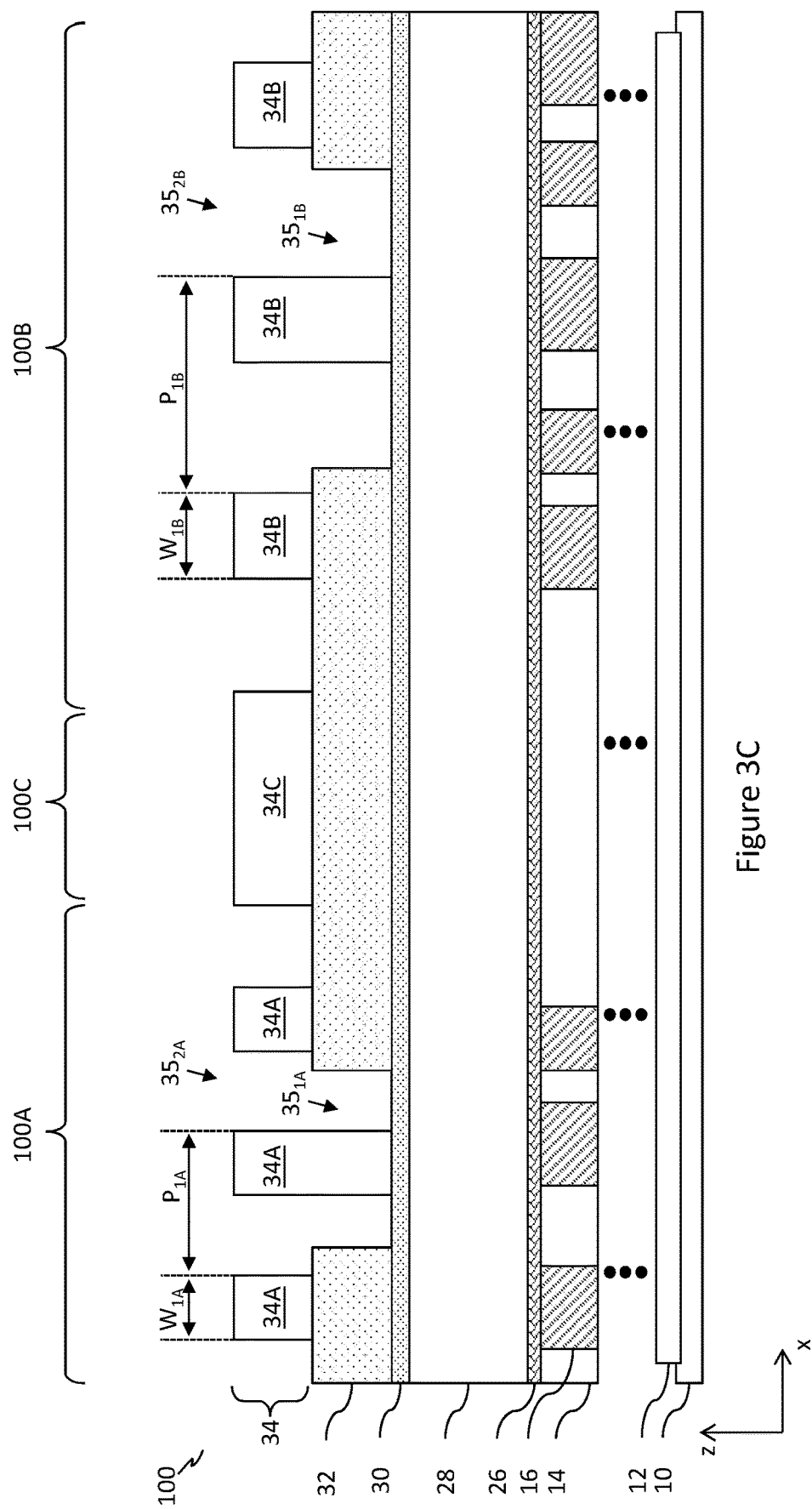

In FIGS. 3A, 3B, and 3C, a second photolithography process is illustrated. Over the mandrel layer 32 and in the openings $35_{1A}$ and $35_{1B}$ is formed a photo mask 34 which has been patterned into the photo mask 34A in the first region 100A, the photo mask 34B in the second region 100B, and the photo mask 34C in the third region 100C. The respective step is illustrated as step 205 (following from step 210) in the process flow shown in FIG. 25. Openings $35_{2A}$ in the first region 100A and openings $35_{2B}$ in the second region 100B are formed in photo mask 34. In accordance with some embodiments of the present disclosure, openings $35_{2A}$ and openings $35_{2B}$ have the top-view shapes of strips, which are parallel to each other. Whereas the openings $35_{1A}$ and $35_{1B}$ are orientated in the x-direction, the openings $35_{2A}$ and $35_{2B}$ are orientated in the y-direction.

The patterned features, such as strips, of the photo mask 34A and the photo mask 34B are formed at two different widths and two different pitches. The pitch $P_{1A}$ of the patterned features of the photo mask 34A may be between about 20 nm and about 38 nm. The widths $W_{1A}$ of the patterned features of the photo mask 34A may be between about 15 nm and about 45 nm. The pitch $P_{1B}$ of the patterned features of the photo mask 34B may be between about 25 nm and about 45 nm. The widths $W_{1B}$ of the patterned features of the photo mask 34B may be between about 20 nm and about 55 nm. The pitch $P_{1B}$ may be about 5 nm to about 20 nm, larger than the pitch $P_{1A}$ The widths $W_{1B}$ may be between about 5 nm and about 30 nm larger than the widths $W_{1A}$ The relatively smaller pitch $P_{1A}$ and width $W_{1A}$ of the photo mask 34A may be used to form metal lines in a subsequent process which are closer together than metal lines formed based on the relatively larger pitch $P_{1B}$ and width $W_{1B}$.

It should be understood that, although the description includes two different widths and two different pitches, any number of widths and pitches may be used by adapting the processes as described below.

In FIGS. 4A and 4B, an etching process is performed to transfer the patterns in photo mask 34A and photo mask 34B into mandrels 32A and mandrels 32B, respectively, and to extend openings $35_{2A}$ and openings $35_{2B}$ into the mandrel layer 32. Mandrels 32B are in the second region 100B and correspond to a fine pitch, and mandrels 32A are in the first region 100A and correspond to a finer pitch. In the mandrel layer 32 one or more large mandrel pieces 32C may also be etched. The respective step is illustrated as step 210 in the process flow shown in FIG. 25. The remaining photo mask 34 is then removed, for example, in an ashing step. The resulting structure is shown in FIGS. 4A and 4B. The etching may be done using processes and materials similar to those discussed above with respect to FIGS. 2A, 2B, and 2C.

In some embodiments, a baking process may be performed to bake the wafer 100. In embodiments which use the baking process, the baking process is performed for a period of time between about 5 minutes and about 20 minutes. The baking temperature may be in the range between about 250° C. and about 500° C. The baking process may restore or repair the material of the mandrels 32A, 32B, and 32C, which may result from the etching.

It should be appreciated that while the patterning process described above uses a first patterning step to form lines and openings in the mandrel layer 32 in one direction and a second patterning step to form lines and openings in the mandrel layer 32, in the perpendicular direction, these steps may be combined in some embodiments. They may also be done in reverse order. In some embodiments, a separate layer over the mandrel layer (for example, an under layer of photo mask 34) may be patterned first in each direction to form a combined pattern mask, and then the mandrel layer etched using the combined pattern mask.

Figure 5B:
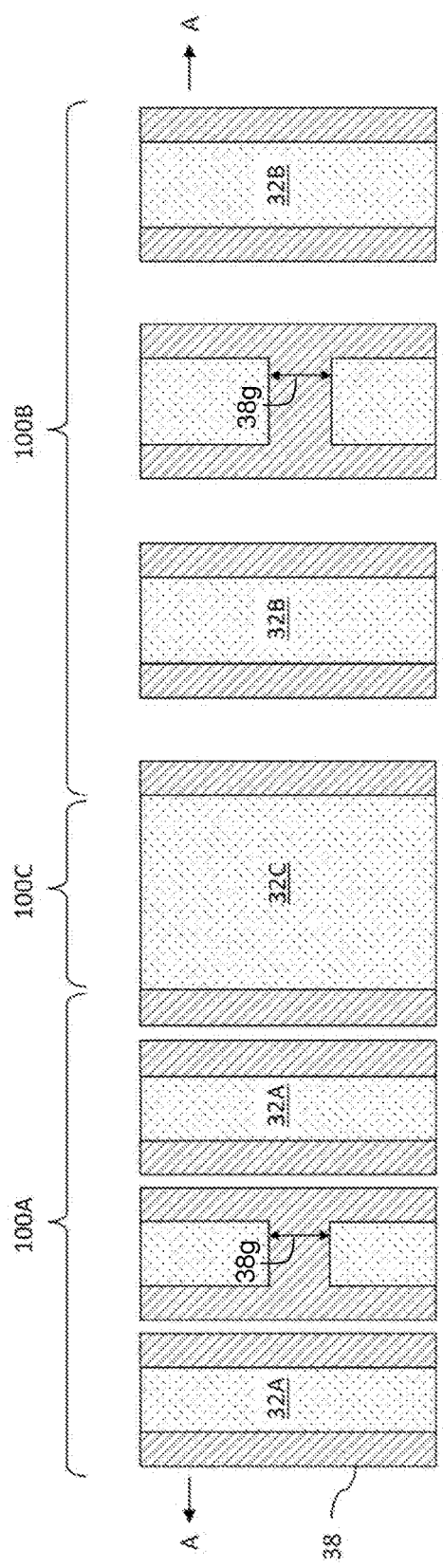
Figure 5A:
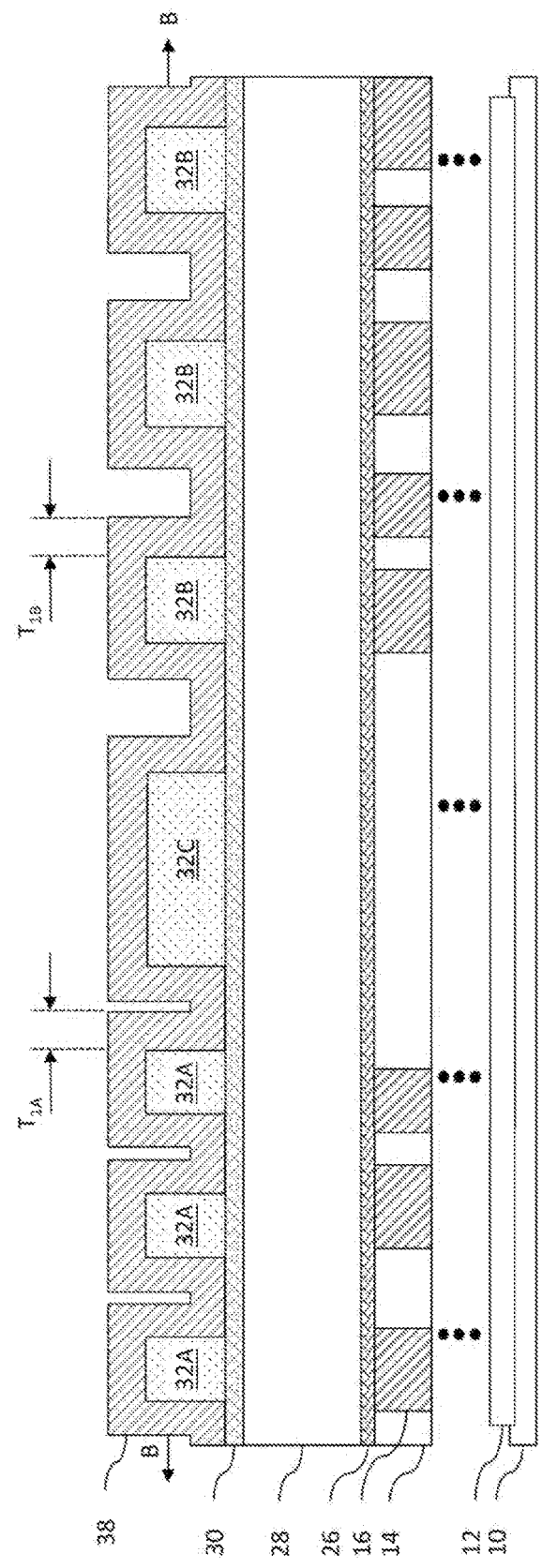

FIG. 5A is a vertical cross-section along the line A-A indicated in FIG. 5B, and FIG. 5B is a horizontal cross-section (rather than a top-down view) along the line B-B indicated in FIG. 5A. A similar horizontal cross-section is also used in FIGS. 6B, 7B, 8B, 11B, 12B, 13B, 16B, 17B, 18B, 19B, 20B, and 21B. In FIGS. 5A and 5B, a spacer layer 38 is blanket formed over the wafer 100. The respective step is illustrated as step 215 in the process flow shown in FIG. 25. The material of spacer layer 38 may be selected to have a high etching selectivity relative to hard mask 30. For example, the material of spacer layer 38 may be selected from AlO, AlN, AlON, TaN, TiN, TiO, Si, $SiO_2$, SiN, and other metals and metal alloys.

As also shown in FIGS. 5A and 5B, the spacer layer 38 is formed as a conformal layer, and the thicknesses of the horizontal portions and vertical portions of spacer layer 38 are close to each other, for example, with a difference smaller than about 20 percent. Spacer layer 38 may be deposited using a conformal deposition method such as CVD or ALD. In accordance with some embodiments, the thickness $T_{1A}$ of spacer layer 38 over the mandrels 32A is in the range between about 50 Å and about 250 Å, such as between about 100 Å and about 200 Å. The thickness $T_{1B}$ of the spacer layer 38 over the mandrels 32B is the same thickness as the thickness $T_{1A}$. Because the pitches are different in the first region 100A from the pitches in the second region 100B, the spacer layer 38 can be altered so that the thickness $T_{1B}$ is greater than the thickness $T_{1A}$, as described herein. As illustrated in FIG. 5B, the spacer layer 38 may merge together across the gaps 38g. In other embodiments, the spacer layer 38 may not merge across the gap 38g (see, e.g., FIG. 28C).

In FIGS. 6A and 6B, a photo mask 142 may be formed over the wafer 100 and patterned to expose the first region 100A, while remaining over the second region 100B. The respective step is illustrated as step 220 in the process flow shown in FIG. 25. In some embodiments, photo mask 142 may be a tri-layer photo mask, including under layer 138 and middle layer 140. The upper layer is patterned and used to pattern the middle layer 140, which is then used to pattern the under layer 138. The materials and processes used to form and pattern the photo mask 142 may be similar to those discussed above with respect to FIGS. 1A and 1B and are not repeated.

In FIGS. 7A and 7B, a trim process is performed to reduce the thickness $T_{1A}$ of the spacer layer 38 in the first region 100A. The respective step is illustrated as step 225 in the process flow shown in FIG. 25. The trim process may be performed using a dry etch or wet etch process which will isotropically attack the material of the exposed spacer layer 38 in a substantially uniform manner. Where a dry etch is used, example etchants for trimming the spacer layer 38 may include a fluorine reactive gas, such as, a carbon-fluro-based etchant ($C_xF_y$), $NF_3$, $SF_6$, $Cl_2$, HBr, or the like. Other process gases may be used in combination with the carbon-fluro-based etchants, such as, oxygen ($O_2$), nitrogen ($N_2$), argon (Ar), combinations thereof, or the like. In an embodiment, the process gases used to pattern the spacer layer 38 may be free of hydrogen. Where a wet etch is used, example etchants for trimming the spacer layer 38 may include a HF solution or another suitable etchant.

The trimming process may remove between about 20 Å and about 70 Å, such as between about 25 Å and about 35 Å from the thickness $T_{1A}$ of the spacer layer 38. The resulting thickness $T_{2A}$ may be between about 25 Å and about 250 Å, such as between about 75 Å and about 175 Å.

In FIGS. 8A and 8B, the photo mask 142 may be removed by any suitable technique. The respective step is illustrated as step 230 in the process flow shown in FIG. 25. In some embodiments, the photo mask 142 may be removed by a cleaning or etching, and in other embodiments an ashing process may be used to remove the photo mask 142. The spacer layer 38 in the second region 100B has a thickness $T_{2B}$ which is unchanged from the thickness $T_{1B}$. The spacer layer 38 in the first region 100A, however, now has a thickness $T_{2A}$ which is thinner than the previous thickness $T_{1A}$ and is also thinner than the thickness $T_{2B}$. At the edge of where the photo mask 142 was over the spacer layer 38, a step may form with a height of $T_{2B}$-$T_{2A}$, corresponding to the amount that was trimmed from the spacer layer 38 in the first region 100A.

FIGS. 9A and 9B through 12A and 12B illustrate an optional process for forming a recovery material or sacrificial material over portions of the spacer layer. This may be done as a line cut process to fill in portions of the spacer layer 38 which will ultimately result in line breaks in subsequently formed metal lines. The respective steps are illustrated as steps 260, 262, 264, and 266 in the process flow shown in FIG. 26. These same processes may be used in any of the embodiments described herein, for example, before or after the spacer layer 38 is etched to form spacers.

Figure 9A:
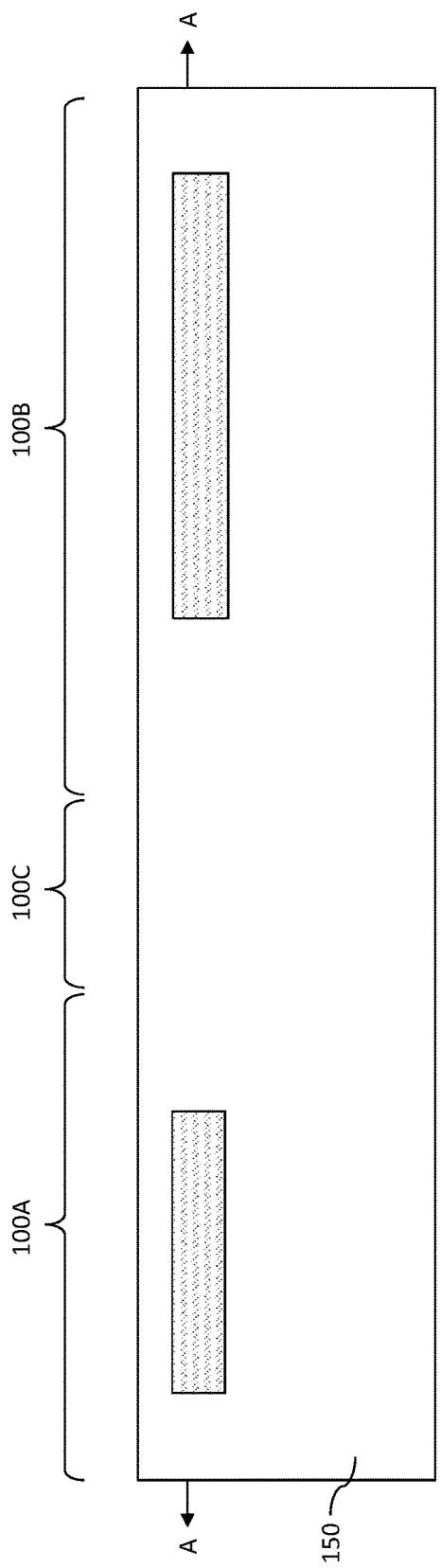
Figure 9B:
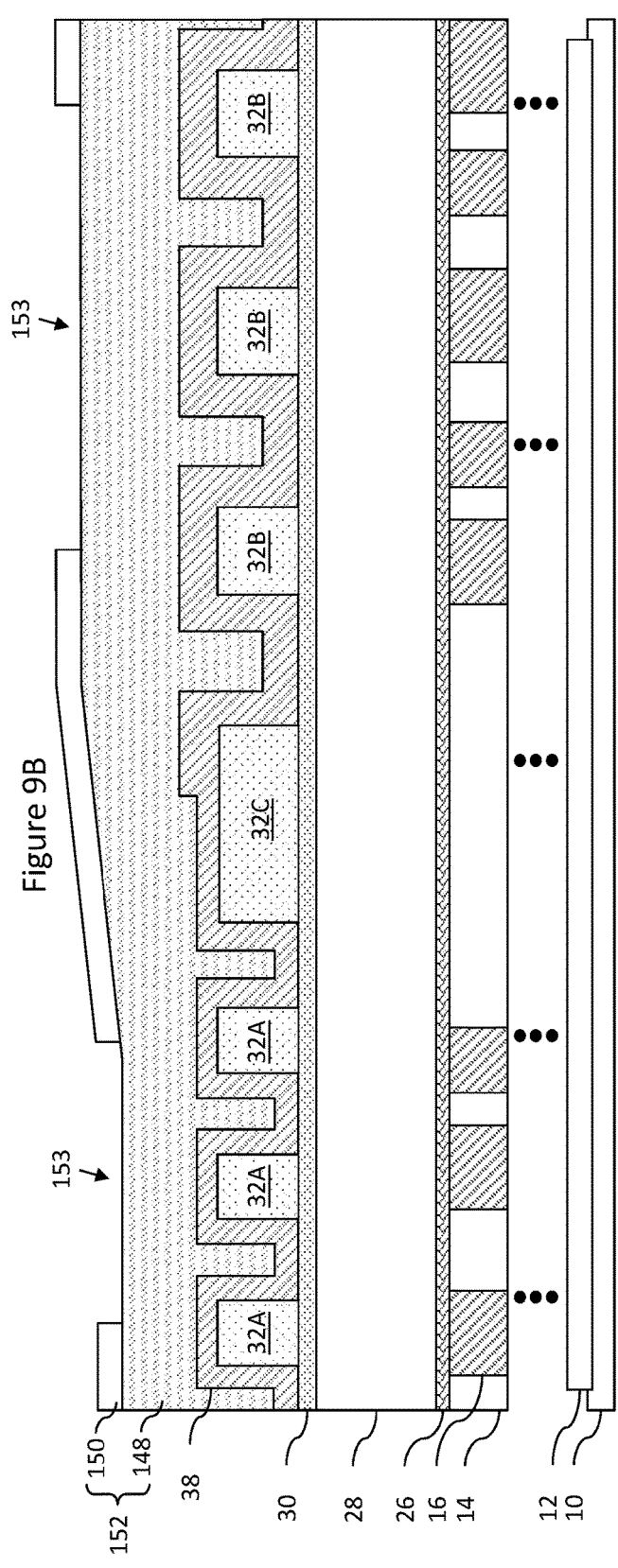

In FIGS. 9A and 9B, which include a cross-sectional view and top-down view, a photo mask 152 is formed over the wafer 100 and patterned. An upper layer 150 (or middle layer) of the photo mask 152 is patterned to form openings 153 which correspond to cut line areas of the subsequently formed metal lines. The respective step is illustrated as step 260 in the process flow shown in FIG. 26. The photo mask 152 may be formed and patterned using processes and materials similar to those discussed above with respect to the photo mask 34 of FIGS. 1A and 1B, which are not repeated.

In FIGS. 10A and 10B, which include a cross-sectional view and top-down view, the openings 153 are extended into the under layer 148 of the photo mask 152, exposing the spacer layer 38. The openings 153 may be extended using processes and materials similar to those discussed above with respect to FIGS. 1A and 1B. In some embodiments, the spacer layer 38 may already be etched into spacers, and in some embodiments, the mandrels 32A and 32B may be removed already, for example if this process follows from step 235 or step 240 of FIG. 25. As illustrated in FIGS. 10A and 10B, the openings 153 may span multiple mandrels 32A and/or 32B. In addition, it should be understood that although the openings 153 are illustrated as formed in the x-direction, they may be also be formed in a perpendicular direction (y-direction) as well, in the same or in a separate step. The upper layer 150 of the photo resist 152 may be removed in the process of patterning the under layer 148 or may be removed by a separate etch process.

In FIGS. 11A and 11B, which include a vertical cross-sectional view and a horizontal cross-sectional view, a sacrificial material 154 (sometimes also referred to as a reverse material) is deposited over the bottom layer 148 and into the openings 153. The respective step is illustrated as step 264 in the process flow shown in FIG. 26. In some embodiments, the sacrificial material 154 is also deposited over the middle layer 150. In other embodiments, the middle layer 150 is removed prior to depositing the sacrificial material 154. In various embodiments, the sacrificial material 154 comprises an inorganic material. For example, the sacrificial material 154 may be an inorganic oxide, such as, titanium oxide, tantalum oxide, silicon oxide, and the like. In some embodiments, the inorganic material is a low temperature oxide (LTO). As used herein, the term "LTO" refers to an oxide deposited using a relatively low process temperature (e.g., 200° C. or less). In some embodiments, the sacrificial material 154 may comprise a nitride, such as silicon nitride or silicon oxynitride, or the like. The sacrificial material 154 may be selected to have sufficient etch selectivity to the spacer layer 38 relative a same etch process. For example, a ratio of an etch rate of the sacrificial material 154 to an etch rate of the spacer layer 38 relative a same etch process is at least 0.7 in some embodiments.

The sacrificial material 154 may be formed using a semiconductor film deposition process, such as, CVD, PVD, ALD, or the like. The semiconductor film deposition process may be a conformal process, which forms on sidewalls and a bottom surface of openings 153 (see FIGS. 10A and 10B). As deposition continues, portions of the sacrificial material 154 on opposing sidewalls of the openings 153 may merge, which fills the openings 153. As a result of the semiconductor film deposition process, a top surface of the sacrificial material 154 may not be planar, such as illustrated in FIGS. 11A and 11B.

In FIGS. 12A and 12B, which include a cross-sectional view and top-down view, the photo mask 152 is removed and the sacrificial material 154 is trimmed in an etch back process. The respective step is illustrated as step 266 in the process flow shown in FIG. 26. First, a planarization process (e.g., a chemical mechanical polish (CMP), dry etching, combinations thereof, or the like) is performed to remove excess portions of the sacrificial material 154 outside of the openings 153. In embodiments where the sacrificial material 154 is formed over the middle layer 150, the planarization process may also remove the middle layer 150. After the planarization process, the bottom layer 148 is exposed, and top surfaces of the sacrificial material 154 and the bottom layer 148 may be flat and co-planar. In some embodiments, the planarization process may also remove the divots formed in the sacrificial material 154.

The bottom layer 148 is next removed using an ashing process. After the bottom layer 148 is removed, pillars of the sacrificial material 154 remain. The remaining sacrificial material 154 mask select areas of the spacer layer 38. In some embodiments, the sacrificial material 154 may span from a first sidewall portion of the spacer layer 38 on a first mandrel 32A or 32B to a second sidewall portion of the spacer layer 38 on a second respective mandrel 32A or 32B.

The sacrificial material 154 may then be trimmed in an etch back process in order to achieve a desired profile. In some embodiments, trimming the sacrificial material 154 recesses the sacrificial material 154 below a topmost surface of the spacer layer 38, such as, below a top surface of the mandrels 32A and 32B. Trimming the sacrificial material 154 may expose portions of the spacer layer 126 over the mandrels 124. In some embodiments, trimming the sacrificial material 154 may also reduce a width of the sacrificial material 154 in at least cross-section B-B (FIG. 12B).

Trimming the sacrificial material 154 may include a dry etch process or a combination of dry and wet etch processes. Embodiment dry etch processes for trimming the sacrificial material 154 may comprise using carbon-fluoro-based etchants (e.g., $CF_4$). Other process gases may be used in combination with the carbon-fluoro-based etchants, such as, oxygen ($O_2$), nitrogen ($N_2$), argon (Ar), combinations thereof, or the like. Embodiment wet etch processes for trimming the sacrificial material 154 may comprise using diluted hydrofluoric acid as an etchant. A desired shape of the sacrificial material 154 may be achieved, for example, by controlling the concentrations and duration of the trimming process.

In FIGS. 13A and 13B, which include a vertical cross-sectional view and a horizontal cross-sectional view, respectively, an anisotropic etching is performed to remove the horizontal portions of spacer layer 38, while the vertical portions of spacer layer 38 remain. The respective step is illustrated as step 235 in the process flow shown in FIG. 25. The remaining portions of spacer layer 38 are referred to as spacers 40A and spacers 40B hereinafter, where the spacers 40A are in the first region 100A and the spacers 40B are in the second region 100B. In some embodiments, etching the spacer layer 38 utilizes a dry etch process using a suitable etchant, such as, $CH_4$, $Cl_2$, combinations thereof, and the like. Other process gases, e.g., nitrogen ($N_2$) may be used as in combination with the etchant during the dry etch process. The dry etch process may anisotropic and etch exposed, lateral portions of the spacer layer 38 without significantly removing vertical portions of the spacer layer 38.

As shown in FIG. 13A, spacers 40A are on the sidewalls of mandrels 32A and spacers 40B are on the sidewalls of mandrels 32B. Referring to FIG. 13B, spacers 40A and spacers 40B may include lengthwise portions in the x-direction and y-direction, and may form various shapes. In some embodiments, spacers 40A and spacers 40B may include lengthwise portions at non-zero angles to the x-direction and y-direction, or may include curvilinear sections, rounded sections, circular sections, and so forth.

In embodiments which utilize the sacrificial material 154, spacers 41A and 41B include a portion of the spacer layer 38 on a sidewall of the mandrels 32A and 32B, respectively, and a portion of the sacrificial material 154 which fills the gap in the spacer layer 38. As a result, the spacers 41A and 41B will define a line cut in a subsequently formed metal line.

FIGS. 14A and 14B through FIGS. 16A and 16B illustrate an optional keep process for retaining portions of the mandrel layer 32 to use in helping to pattern the underlying hard mask 30. In embodiments where the keep process is not used, the portions of the exposed mandrels 32A and 32B may be removed using an etch process. The respective step is illustrated as step 240 in the process flow 200 shown in FIG. 25. The optional keep process includes the steps illustrated as steps 268, 270, and 272 as the step 240 in the process flow shown in FIG. 27. These same processes may be used in any of the embodiments described herein for removing the mandrels.

In FIGS. 14A and 14B, which include a cross-sectional view and top-down view, a photo mask 162 is formed over the wafer 100 and patterned. An upper layer 160 (or middle layer) of the photo mask 162 is patterned to form openings 163 which correspond to the areas of the mandrel layer 32 which should be removed. The areas left covered, such as keep area 164 correspond to further line cuts in the subsequently formed metal lines. The respective step is illustrated as step 268 in the process flow shown in FIG. 27. The photo mask 162 may be formed and patterned using processes and materials similar to those discussed above with respect to the photo mask 34 of FIGS. 1A and 1B, which are not repeated.

In FIGS. 15A and 15B, which include a vertical cross-sectional view and a horizontal cross-sectional view, the openings 163 are extended into the under layer 158 of the photo mask 162, exposing the mandrel layer 32. Portions of the spacers 40A and 40B may also be exposed. Areas of the mandrel layer 32 which are retained, the keep areas 164, are continued to be cover by the photo mask 162. The openings 163 may be extended using processes and materials similar to those discussed above with respect to FIGS. 1A and 1B. The keep areas 164 may span multiple mandrels 32A and/or 32B, and may also cover portions of the mandrel layer 32C. The upper layer 160 of the photo resist 162 may be removed in the process of patterning the under layer 158 or may be removed by a separate etch process.

In FIGS. 16A and 16B, which include a cross-sectional view and a top view, respectively, the mandrel layer 32 is selectively etched in an etching step to remove the exposed mandrels 32A, 32B, and 32C, thereby forming openings 43A in the first region 100A, openings 43B in the second region 100B, and opening 43C in the third region 100C. The respective step is illustrated as step 272 in the process flow shown in FIG. 27. In accordance with some embodiments, the etching is performed using a wet etch or a dry etch. The respective etchant may include an HF solution or a mixture of $NF_3$ and $NH_3$ gases, and the appropriate etchant depends from the material of the mandrel layer 32. In embodiments which do not use the keep process to form keep areas 164, the etching may be performed without using any photo resist to cover wafer 100.

Several different spacer widths can be achieved by this process. The spacers 40A have a width which is about the same as the thickness $T_{2A}$ after the trimming process. The spacers 40B have a width which is about the same as the thickness $T_{2B}$ The spacers 41A include a width which is twice the width of the spacers 40A plus the width between mandrels 32A. The spacers 41C include the width of the spacers 40A or spacers 40B plus the width of the keep areas 164 in the third region 100C. The spacers 41C include the spacers 40A plus the keep area 164.

In FIGS. 17A and 17B, which include a cross-sectional view and a top view, respectively, the spacers 40A, 40B, 41A, 41B, and 41C (FIGS. 16A and 16B) are together used as a mask to etch the hard mask 30. The respective step is illustrated as step 245 in the process flow shown in FIG. 25. The hard mask 30 is etched to include patterned hard mask 30 in each of the first region 100A, the second region 100B, and the third region 100C. Where the hard mask 30 is patterned, openings 44A are formed in the first region 100A, openings 44B are formed in the second region 100B, and openings 44C are formed in the third region 100C. The openings 44A, openings 44B, and openings 44C correspond to openings which will be made in the target layer 28. The openings 44A, openings 44B, and openings 44C correspond to the spacing between the openings in the target layer 28. Because different widths are able to be used for the spacers 40A and 40B, the subsequently formed metal lines can have flexible spacing.

Referring to FIGS. 18A and 18B, which include a cross-sectional view and a top view, respectively, similar to FIGS. 17A and 17B, where the sacrificial material 154 is illustrated in another position, adjacent to the mandrel 32C and an associated keep area 164. By combining the several techniques described above, a spacer 41C may include a keep area 164, spacers 40A, and sacrificial material 154.

Referring to FIGS. 19A and 19B, which include a cross-sectional view and a top view, respectively, the hard mask layer 30 is illustrated as being three distinct layers, in accordance with some embodiments. As discussed above with respect to FIG. 1A, mask 30A may be a NFARC, mask 30B may be a hard mask, and mask 40A may be an oxide, or the like. Each mask layer of the hard mask 30 may be etched in turn to extend the openings 43A, 43B, and 43C there through using respective suitable etchants.

Referring to FIGS. 20A and 20B, the openings 43A, 43B, and 43C in the mask 30C are transferred to the underlying layer 30B. Any suitable technique may be used, such as an appropriate etching process. The remaining spacers layer 38, sacrificial material 154, and mandrel layer 30 may also be removed by etching, grinding, or by a CMP process.

Figure 21B:
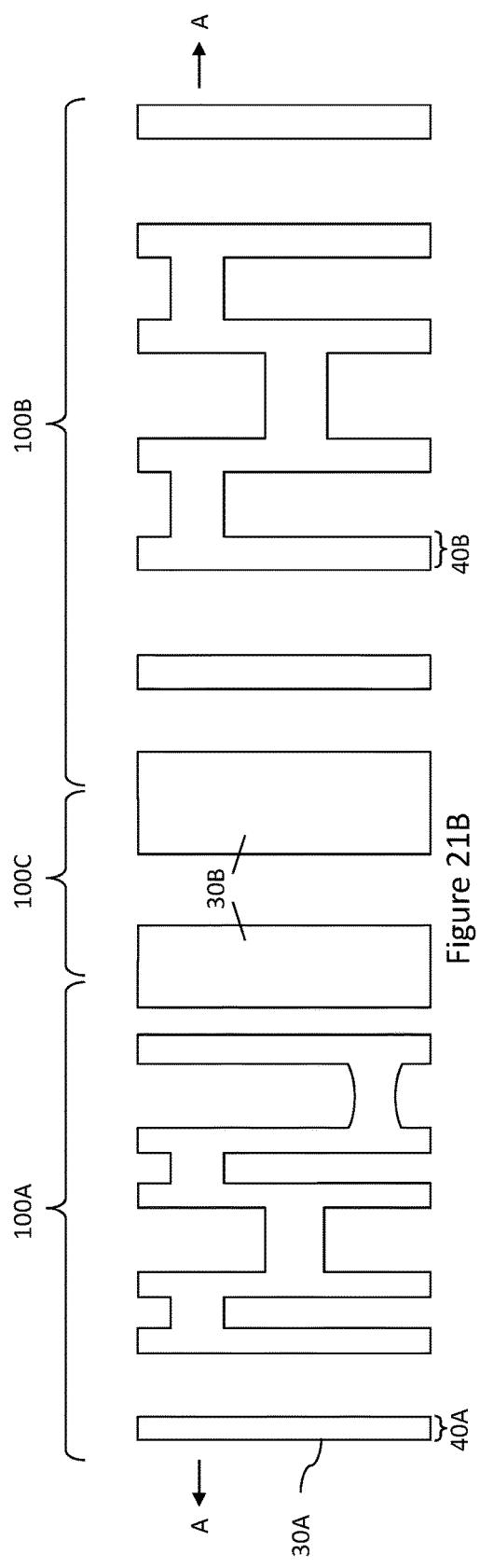
Figure 21A:
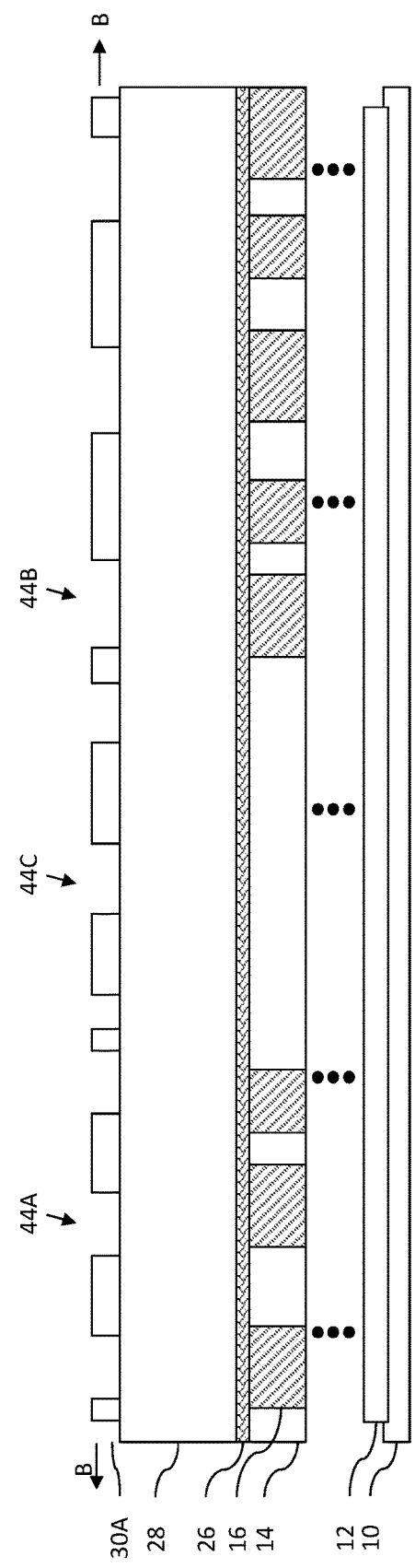

Referring to FIGS. 21A and 21B, the openings 43A, 43B, and 43C in the mask 30B are transferred to the underlying layer 30A. Any suitable technique may be used, such as an appropriate etching process.

FIGS. 22A and 22B illustrate the process after FIGS. 17A and 17B or after FIGS. 21A and 21B. The openings 44A, 44B, and 44C define areas of the target layer 28 which will be removed.

Figure 23B:
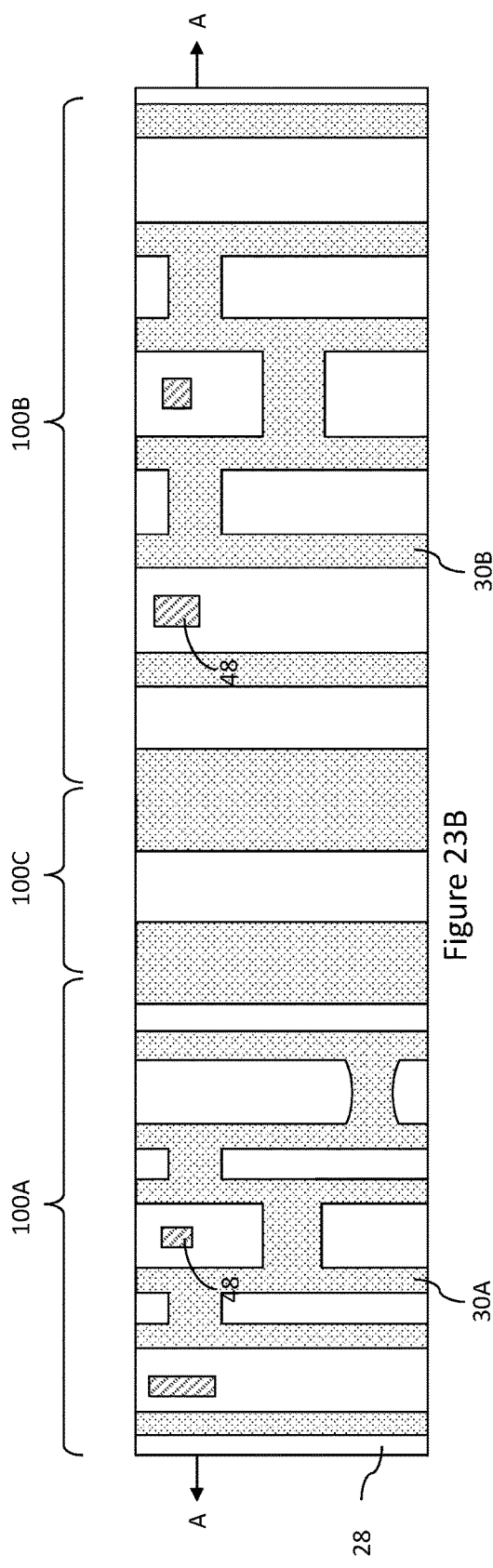
Figure 23A:
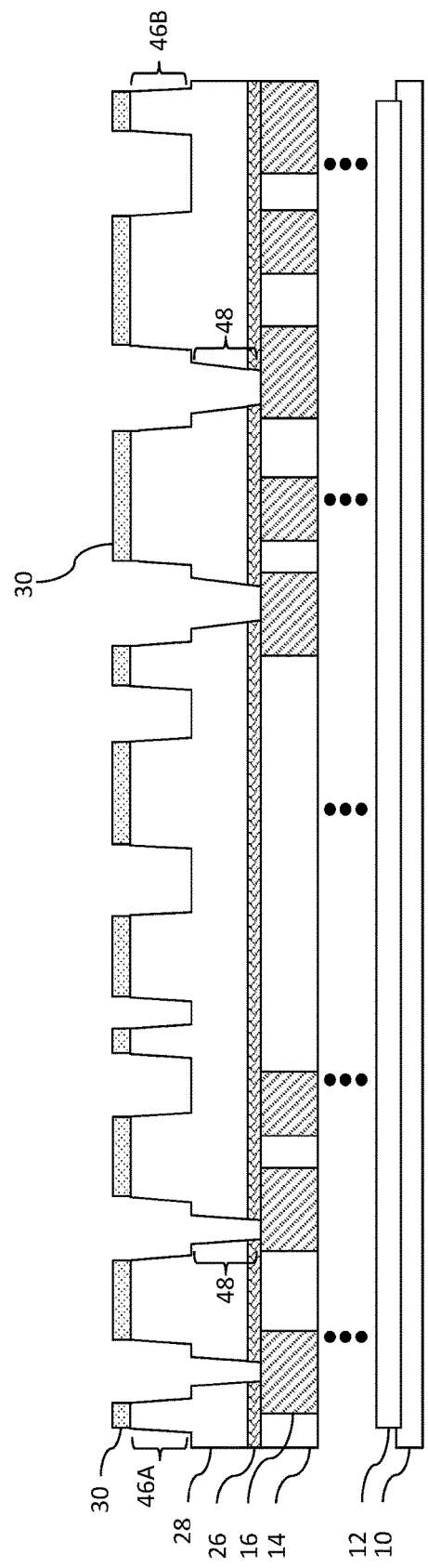

In FIGS. 23A and 23B, the patterned hard mask 30 or 30A are used as an etching mask to etch the target layer 28, so that trenches 46A and trenches 46B are formed. The respective step is illustrated as step 250 in the process flow shown in FIG. 25. Prior to etching the target layer 28, a mask layer may be deposited and patterned to protect the third region 100C, in some embodiments. Additional process steps may also be performed to define and etch target layer 28 to form via openings 48 underlying trenches 46. Etch stop layer 26 is also etched. Conductive features 16 are exposed through via openings 48. Next, the patterned hard mask 30 or 30A are removed. Alternatively, the patterned hard mask 30 or 30A are removed during or after the subsequent planarization for forming metal lines 50 and vias 52 as shown in FIGS. 23A and 23B.

In FIGS. 24A and 24B trenches 46 and via openings 48 are filled with a conductive material(s) to form metal lines 50 and vias 52. The respective step is illustrated as step 255 in the process flow shown in FIG. 25. The formation may use a dual damascene process, wherein a conductive barrier layer such as titanium nitride, titanium, tantalum nitride, tantalum, or the like is formed on the sidewalls and the bottoms of trenches 46 and via openings 48. The remaining portions of trenches 46 and via openings 48 are then filled with a conductive material, which may include copper or copper alloy, or another conductive material. A Chemical Mechanical Polish (CMP) is then performed to remove excess portions of the barrier layer and the filling metal, forming metal lines 50 and vias 52 as shown in FIGS. 23A and 23B. Metal lines 50 and vias 52 are electrically connected to the underlying conductive features 16. The CMP may be stopped on target layer 28, as shown in FIG. 24A, or may be stopped on the patterned hard mask 30A and 30B if the patterned hard mask 30A and 30B has not been removed yet.

In accordance with alternative embodiments of the present disclosure, target layer 28 is a semiconductor substrate. Accordingly, the process step shown in FIGS. 1A, 1B, and 1C through 24A and 24B may be used to form trenches in target layer 28, and filling the trenches with a dielectric material to form Shallow Trench Isolation (STI) regions.

FIG. 24B illustrates a top view of metal lines 50 formed in target layer 28. Metal lines 50 include two spacings S1 and S2, with spacing S2 being greater than spacing S1. Spacing S2 is determined by the thickness $T_{2B}$ (FIG. 8A) of the spacers 40B. Advantageously, spacing S1 can be adjusted by adjusting the trimming amount of the spacer layer 38 in the first region 100A, as discussed above. Accordingly, the embodiments of the present disclosure have the flexibility in adjusting spacings between metal lines to have different values.

In the process discussed above with respect to FIGS. 1A, 1B, and 1C through FIG. 25, when the spacer layer 38 is formed (see FIGS. 5A and 5B), due to the relative thickness of the spacer layer 38, there is a risk that the vertical legs of the spacer layer 38 may merge together in the first region 100A. Also, due to the sizing and spacing of the spacer layer 38, when the trimming process is performed (see FIGS. 7A and 7B), the spacer layer 38 may suffer from a horning effect at 90 degree angles, where the spacer layer 38 at the corner forms a horn shape. This horn shape may cause defects in subsequent patterning steps and in the formation of the metal lines 50.

The horning may be reduced or eliminated in other embodiments. FIGS. 28A and 28B through FIG. 36 illustrate cross-sectional views of intermediate stages in the formation of features such as metal lines in accordance with some embodiments of the present disclosure. The processes of FIGS. 28A and 28B through FIG. 36 reduce or eliminate horning effects. Unless specified otherwise, the materials and the formation methods of the components in these embodiments are essentially the same as the like components, which are denoted by like reference numerals in the embodiments shown in FIGS. 1A, 1B, and 1C through 25. The details regarding the formation process and the materials of the like components shown in FIGS. 28A and 28B through FIG. 36 may thus be found in the discussion of the embodiment shown in FIGS. 1A, 1B, and 1C through FIGS. 24A and 24B.

Figure 28C:
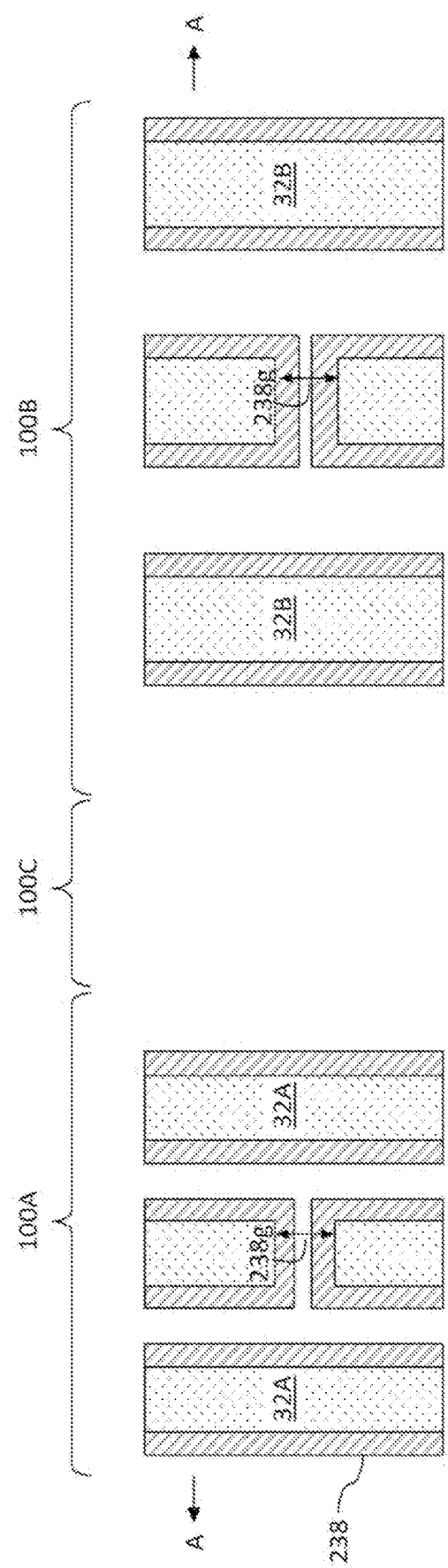

FIG. 28A is a vertical cross-section along the line A-A indicated in FIG. 28B, and FIG. 28B is a horizontal cross-section (rather than a top-down view) along the line B-B indicated in FIG. 28A. FIG. 28C is similar to the illustration of FIG. 28B, except the spacer layer 238 is not merged at the gap 238g. A similar horizontal cross-section is also used in FIGS. 29B, 30B, 31B, and 32B. FIGS. 28A and 28B illustrate the wafer 100 of FIGS. 5A and 5B after the deposition of a spacer layer 38 over the mandrels 32A and 32B. The respective step is illustrated as step 315 in the process flow shown in FIG. 36. Thus, the step 305 is substantially the same as the step 205 of FIG. 25 and the step 310 is substantially the same as step 210. Accordingly, the substrate 10, devices 12, dielectric layer 14, conductive features 16, etch stop layer 26, target layer 28, hard mask 30, and mandrels 32A and 32B refer to features which are similar to what are shown in FIGS. 1A, 1B, and 1C and FIGS. 2A, 2B, and 2C, and hence are not repeated herein.

The spacer layer 238 may be formed using processes and materials similar to the spacer layer 38 of FIGS. 5A and 5B, except that it is not deposited as thickly as the spacer layer 38. Because it is not deposited as thickly, the risk of undesired merge and horning effects are reduced or eliminated. In accordance with some embodiments, the thickness $T_{3A}$ of spacer layer 238 over the mandrels 32A is in the range between about 30 Å and about 200 Å, such as between about 70 Å and 140 Å. The thickness $T_{3B}$ of the spacer layer 238 over the mandrels 32B is the same thickness as the thickness $T_{3A}$.

Figure 29B:
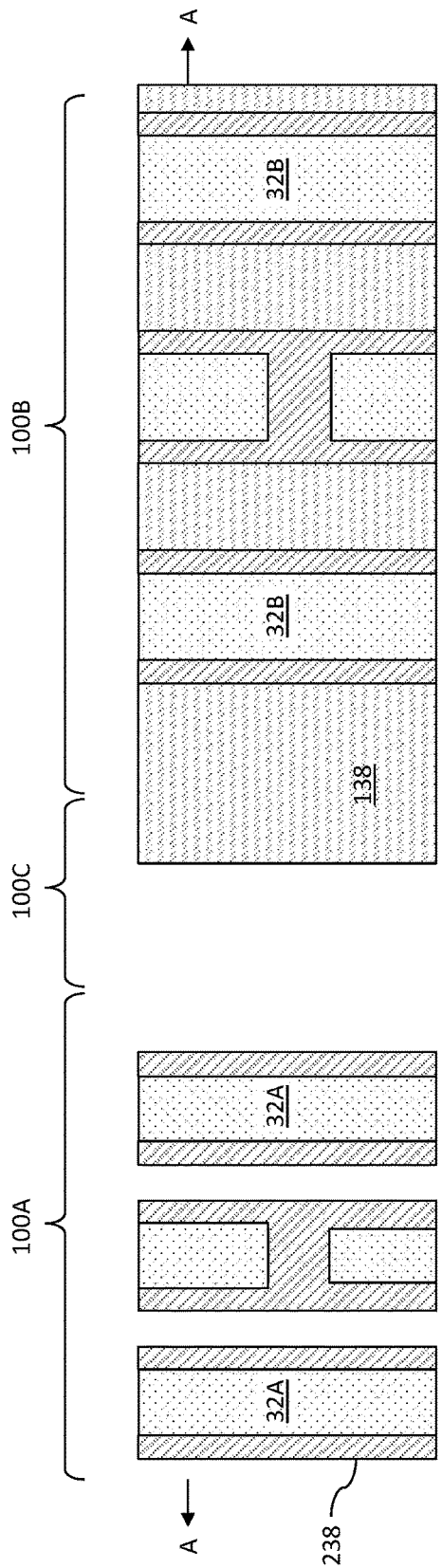
Figure 29A:
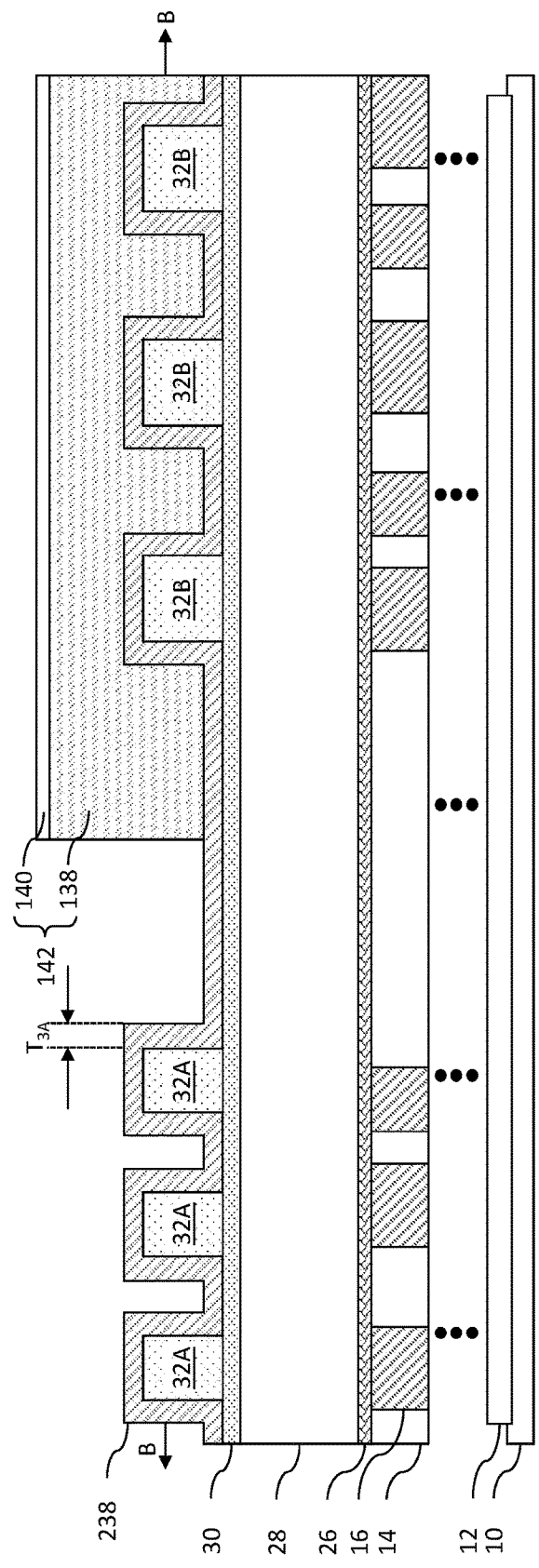

In FIGS. 29A and 29B, a photo mask 142 may be formed over the wafer 100 and patterned to expose the first region 100A, while remaining the second region 100B. The respective step is illustrated as step 320 in the process flow shown in FIG. 36. The photo mask 142 may be made using processes and materials similar to those discussed above with respect to FIGS. 6A and 6B, which are not repeated.

In FIGS. 30A and 30B, a trim process is performed to reduce the thickness $T_{3A}$ of the spacer layer 38 in the first region 100A. The respective step is illustrated as step 325 in the process flow shown in FIG. 36. The trim process may be performed using a dry etch or wet etch process, such as those discussed above with respect to FIGS. 7A and 7B. The trimming process may remove between about 20 Å and about 70 Å, such as between about 25 Å and about 35 Å from the thickness $T_{3A}$ of the spacer layer 38. The resulting thickness $T_{4A}$ may be between about 25 Å and about 130 Å, such as between about 40 Å and about 100 Å.

In FIGS. 31A and 31B, the photo mask 142 may be removed by any suitable technique, such as discussed above with respect to FIGS. 8A and 8B. The respective step is illustrated as step 330 in the process flow shown in FIG. 36. The spacer layer 238 in the second region 100B has a thickness $T_{4B}$ which is unchanged from the thickness $T_{3B}$. The spacer layer 238 in the first region 100A, however, now has a thickness $T_{4A}$ which is thinner than the previous thickness $T_{3A}$ and is also thinner than the thickness $T_{4B}$. At the edge of where the photo mask 142 was over the spacer layer 38, a step may form with a height of $T_{4B}-T_{4A}$, corresponding to the amount that was trimmed from the spacer layer 238 in the first region 100A.

In FIGS. 32A and 32B, a second spacer layer 239 may be formed using processes and materials similar to the spacer layer 38 of FIGS. 5A and 5B. FIGS. 32C and 32D are similar to FIG. 32B except illustrate other embodiments where the spacer layer 238 is not merged (see FIG. 28C). The respective step is illustrated as step 333 in the process flow shown in FIG. 36. The thickness of the second spacer layer 239 may be between about 20 Å and 100 Å, such as between about 50 Å and 80 Å. Because the spacer layer 238 was trimmed in the first region 100A, the total thickness of the combined spacer layer 242 is different in the first region 100A versus the second region 100B. In accordance with some embodiments, the thickness $T_{5A}$ of the combined spacer layer 242 over the mandrels 32A is in the range between about 50 Å and about 200 Å, such as between about 100 Å and about 170 Å. The thickness $T_{5B}$ of the combined spacer layer 242 over the mandrels 32B is between about 120 Å and about 280 Å, such as between about 150 Å and about 200 Å.

In some embodiments, the second spacer layer 239 may be formed using the same materials and processes as used to form the first spacer layer 238. In such embodiments, even though the second spacer layer 239 may be formed of the same material as the spacer layer 238, an interface between the spacer layer 238 and the second spacer layer 239 may be observable. In some embodiments, the material of the spacer layer 238 and the second spacer layer 239 may be formed such that no visible interface is observable. In other embodiments, different materials and/or processes may be used to form the second spacer layer 239, in which case an interface is maintained between the spacer layer 238 and the second spacer layer 239.

Prior to etching the spacer layer, the process described above with respect to FIGS. 9A and 9B to FIGS. 12A and 12B to form a sacrificial material 154 may be performed.

In FIG. 32C, when the second spacer layer 239 is deposited, it also does not merge across the gap 239g, in accordance with some embodiments. In FIG. 32D, when the second spacer layer 239 is deposited, it does merge across the gap 239g, in accordance with other embodiments. One of skill should understand that the other Figures may be modified in accordance with such embodiments.

In FIGS. 33A and 33B, which include a cross-sectional view and a top view, respectively, an anisotropic etching is performed to remove the horizontal portions of the combined spacer layer 242, while the vertical portions of the combined spacer layer 242 remain. The respective step is illustrated as step 335 in the process flow shown in FIG. 36. The remaining portions of the combined spacer layer 242 are referred to as spacers 40A and spacers 40B hereinafter, where the spacers 40A are in the first region 100A and the spacers 40B are in the second region 100B. The process for etching the combined spacer layer 242 may use materials and processes similar to the etching of the spacer layer 38 in FIGS. 13A and 13B, which are not repeated.

As shown in FIG. 33A, spacers 40A are on the sidewalls of mandrels 32A and spacers 40B are on the sidewalls of mandrels 32B. Referring to FIG. 33B, spacers 40A and spacers 40B may include lengthwise portions in the x-direction and y-direction, and may form various shapes. In some embodiments, spacers 40A and spacers 40B may include lengthwise portions at non-zero angles to the x-direction and y-direction, or may include curvilinear sections, rounded sections, circular sections, and so forth.

FIGS. 34A and 34B illustrate the formation of a mask 158/162 with keep areas 164. The formation of the mask 158/162 is similar to that discussed above with respect to FIGS. 14A and 14B through FIGS. 16A and 16B, and the details are not repeated. In the illustrated embodiment, FIG. 34B demonstrates that a keep area 164 is in the second region 100B. Mask 158/162 is used to protect the areas of the mandrel layer 32 which are not to be removed.

Figure 35B:
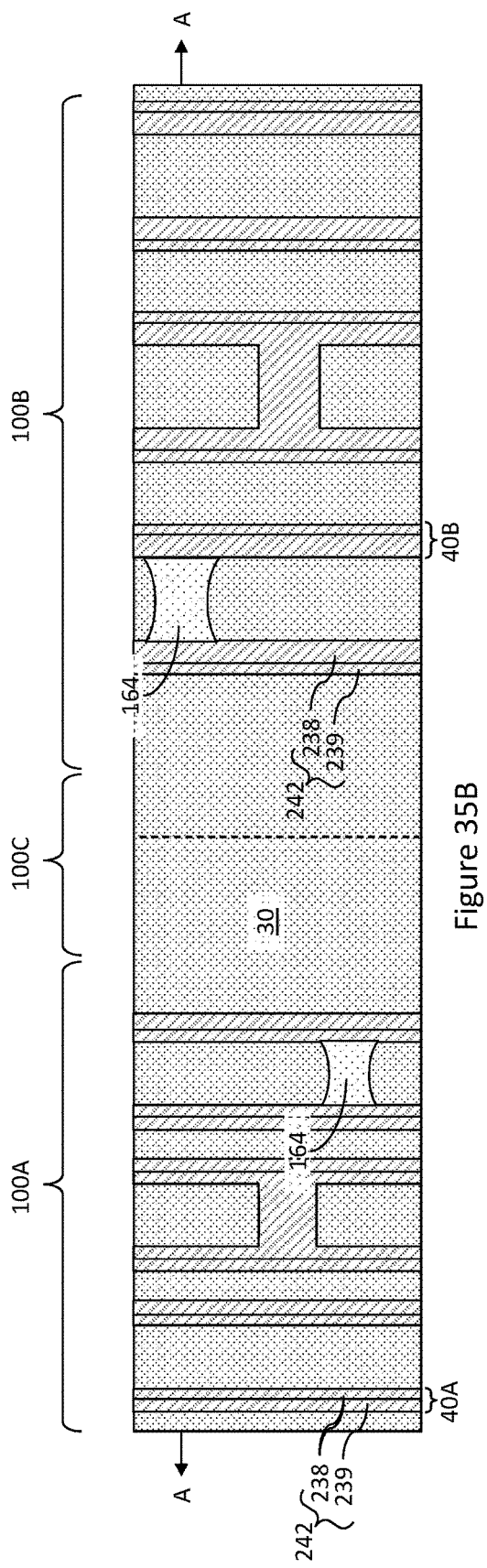
Figure 35A:
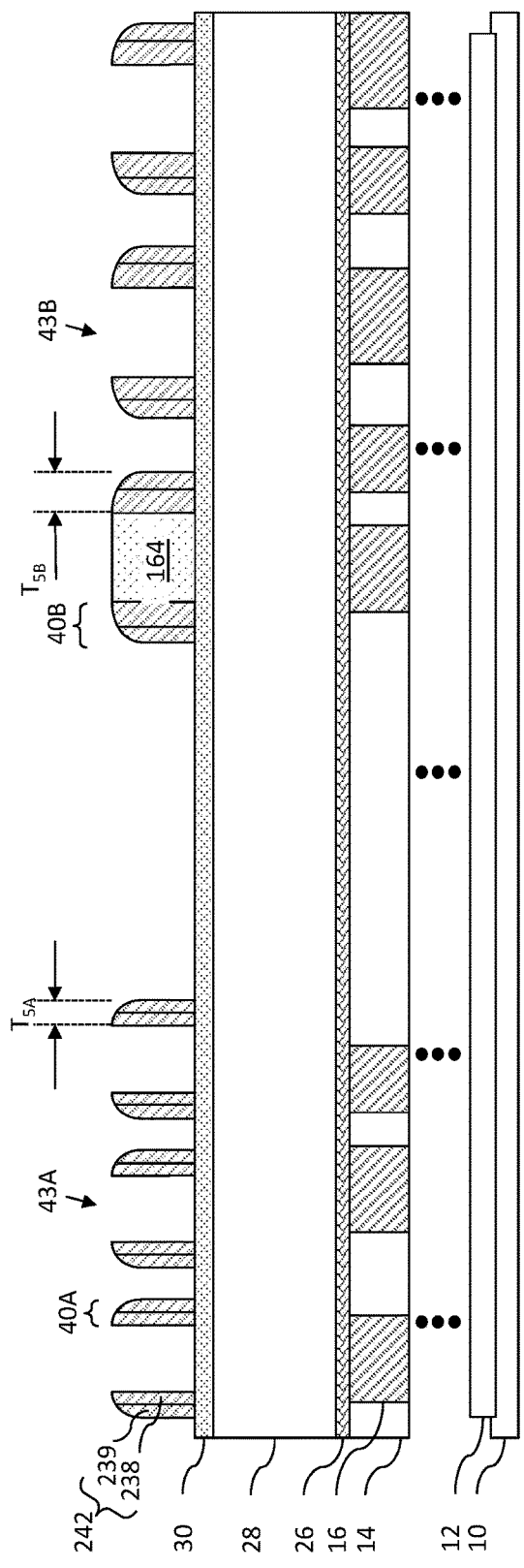

In FIGS. 35A and 35B, which include a cross-sectional view and a top view, respectively, mandrels 32A and 32B are selectively etched in an etching step through mask 158/162 to remove the mandrels 32A and 32B, thereby forming openings 43A between spacers 40A and forming openings 43B between spacers 40B. The respective step is illustrated as step 340 in the process flow shown in FIG. 36. The mandrels 32A and 32B may be removed using processes and materials similar to those discussed above with respect to FIGS. 16A and 16B, which are not repeated. The spacers 40A have a width which is about the same as the thickness $T_{5A}$. The spacers 40B have a width which is about the same as the thickness $T_{5B}$.

Figure 36:
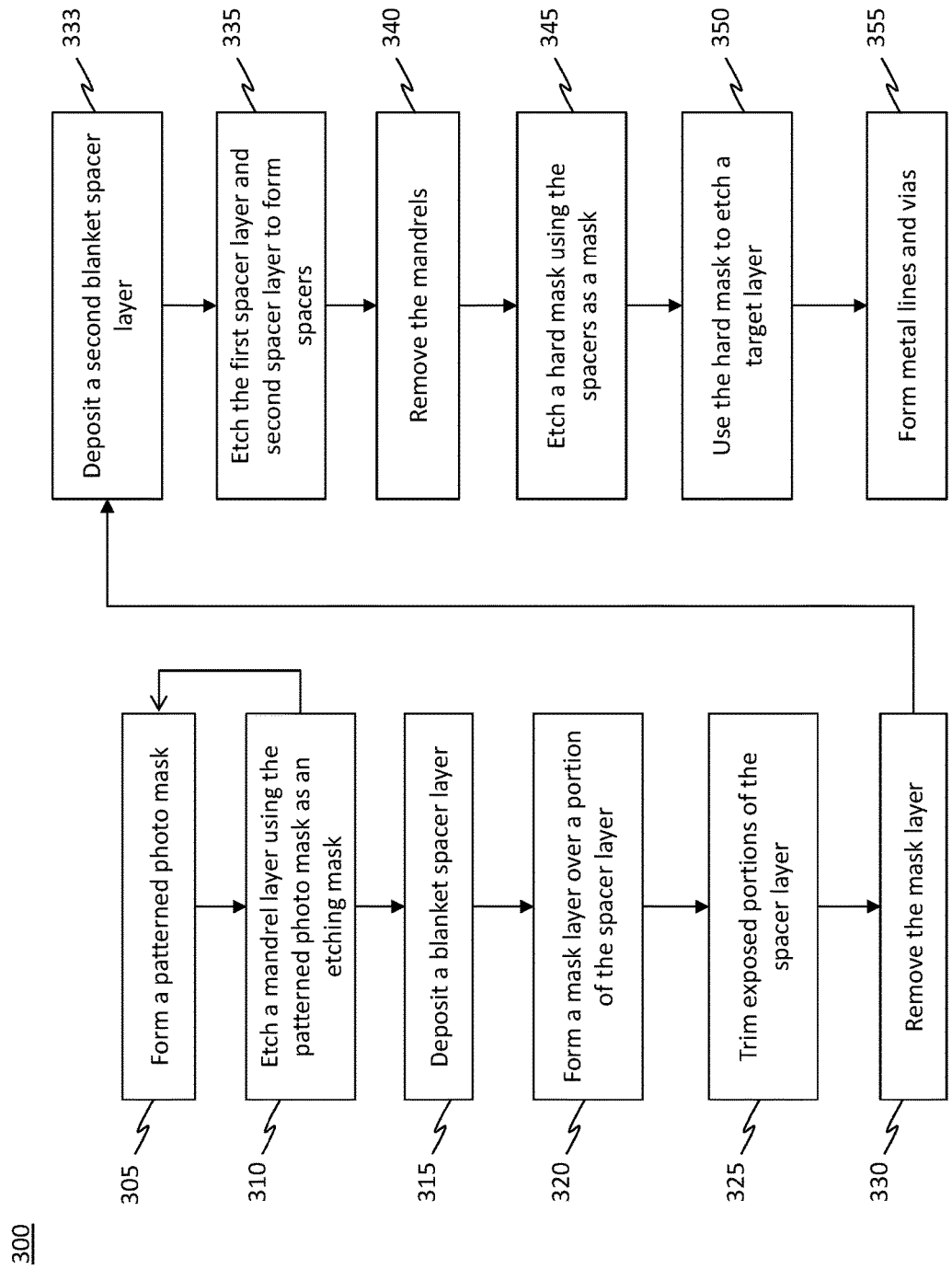
FIG. 36 illustrates a process flow for forming metal lines in accordance with some embodiments.

The process of etching the hard mask 30 using the spacers 40A and 40B as referenced in step 345 of the process flow in FIG. 36 may be the same as the process of etching the hard mask 30, as described above with respect to FIGS. 17A and 17B through FIGS. 22A and 22B, which are not repeated.

The process of using the hard mask 30 to etch the target layer 28 as referenced in step 350 of the process flow in FIG. 36 may be the same as the process of etching the target layer 28, as described above with respect to FIGS. 23A and 23B, which are not repeated.

The process of forming metal lines 50 and vias 52 as referenced in step 355 of the process flow in FIG. 36 may be the same as the process of forming metal lines 50 and 52, as described above with respect to FIGS. 24A and 24B, which are not repeated. As such, similar to that described above with respect to FIG. 24B, formed metal lines, such as metal lines 50, include two spacings S1 and S2 (see FIG. 24A), with spacing S2 being greater than spacing S1. Spacing S2 is determined by the thickness $T_{5B}$ (FIG. 35A) of the spacers 40B. Advantageously, spacing S1 can be adjusted by adjusting the trimming amount of the spacer layer 238 in the first region 100A, as discussed above, and then subsequently depositing a second spacer layer over the spacer layer 238. Accordingly, the embodiments of the present disclosure have the flexibility in adjusting spacings between metal lines to have different values.

In the process discussed above with respect to FIGS. 1A, 1B, and 1C through FIG. 27 and with respect to FIGS. 28A and 28B through FIG. 36, in each case the spacer layer 38 is trimmed to achieve different thicknesses of the spacer layer 38 in different areas of the wafer 100. The remaining Figures describe other embodiments where a pad layer is used over the spacer layer in select regions of the wafer 100. In addition, optional line cut processes are described which may be applied to all of the flows of the embodiments described herein. The line cut processes can use additional pad material to alter the spacer pattern to result in metal line cuts. In addition, optional pattern loading of the third region 100C is described which may be applied to all of the flows of the embodiments described herein (Similarly, the optional pattern loading of the third region 100C may be omitted, such as described with respect to the above Figures).

FIGS. 37A and 37B through 48 illustrate cross-sectional views of intermediate stages in the formation of features such as metal lines in accordance with some embodiments of the present disclosure. Unless specified otherwise, the materials and the formation methods of the components in these embodiments are essentially the same as the like components, which are denoted by like reference numerals in the embodiments shown in FIGS. 1A, 1B, and 1C through 27. The details regarding the formation process and the materials of the like components shown in FIGS. 37A and 37B through 48 may thus be found in the discussion of the embodiment shown in FIGS. 1A, 1B, and 1C through FIG. 27.

Figure 37B:
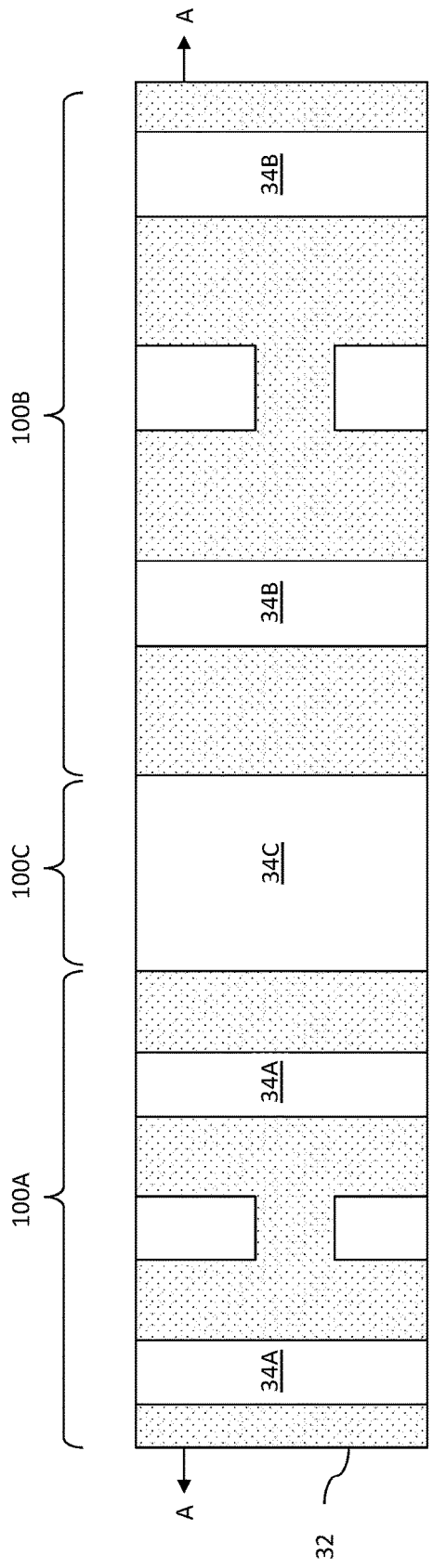
Figure 37A:
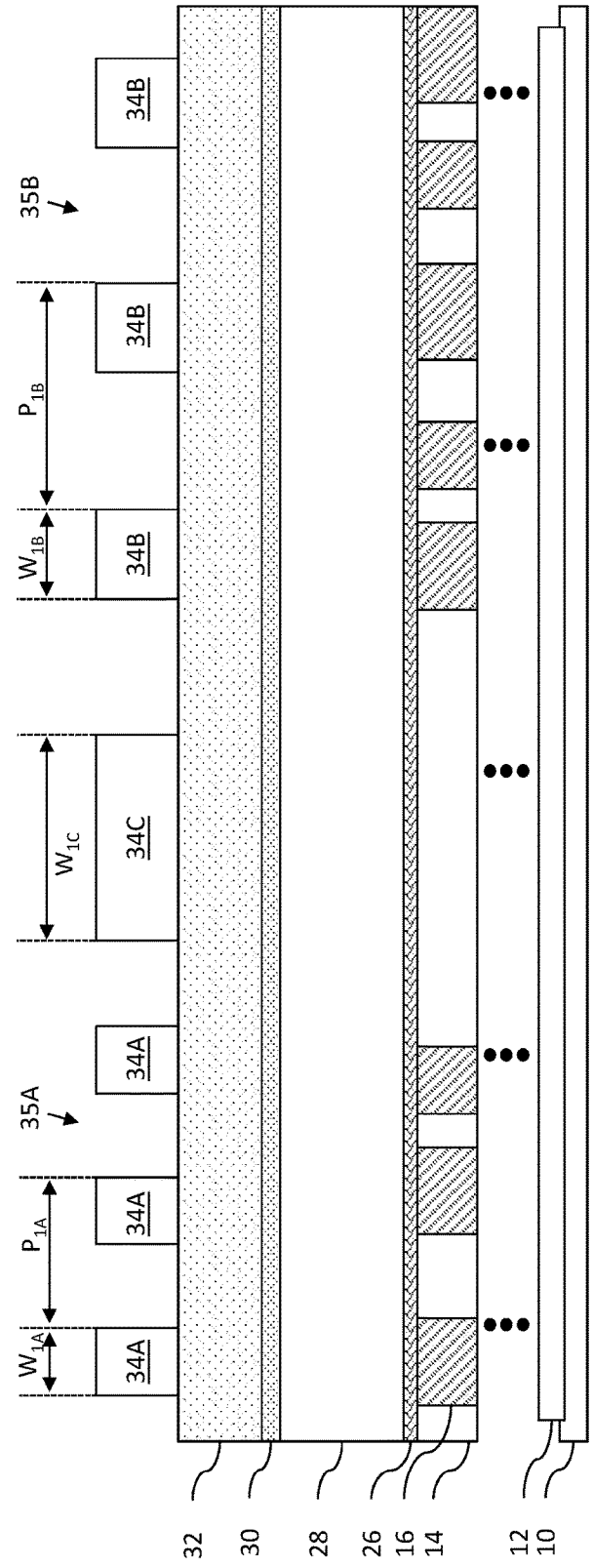

FIG. 37A is a vertical cross-section along the line A-A indicated in FIG. 37B, and FIG. 37B is a top down view of the wafer 100 in FIG. 37A. FIGS. 37A and 37B illustrate a structure similar to that illustrated in FIGS. 1A, 1B, and 1C. Accordingly, the substrate 10, devices 12, dielectric layer 14, conductive features 16, etch stop layer 26, target layer 28, and hard mask 30 refer to features which are similar to those illustrated in FIGS. 1A, 1B, and 1C, and are not repeated.

FIGS. 37A and 37B also illustrate one or more photolithography processes. A first photolithography process may be performed and then the mandrel layer 32 patterned to form openings in a first direction therein, such as illustrated above with respect to FIGS. 1A, 1B, 1C, 2A, 2B, and 2C. The respective steps are illustrated as steps 405 and 410 in the process flow 400 shown in FIG. 48. Following the first photolithography process, a second photolithography process may be performed to form openings in a second direction therein. Photo mask 34 may be formed and patterned using processes and materials similar to the photo mask 34 of FIGS. 3A and 3B. Photo mask 34 is applied and patterned into photo mask 34A in the first region 100A, photo mask 34B in the second region 100B, and photo mask 34C in the third region 100C, for example, in a photo lithography process. The respective step is illustrated as step 405 in the process flow 400 shown in FIG. 48. Openings 35A in the first region 100A and openings 35B in the second region 100B are formed in photo mask 34. In accordance with some embodiments of the present disclosure, openings 35 have the top-view shapes of strips, which are parallel to each other. The photo mask 34C in the third region 100C, where metal strips are not to be formed may be used to control pattern loading effects. The photo mask 34C may also be used in the embodiments discussed above with respect to FIGS. 28A and 28B through FIG. 36.

The patterned features, such as strips, of the photo mask 34A and the photo mask 34B are formed at two different widths and two different pitches, with sizes and pitches similar to those discussed above with respect to FIGS. 1A and 1B.

Figure 38B:
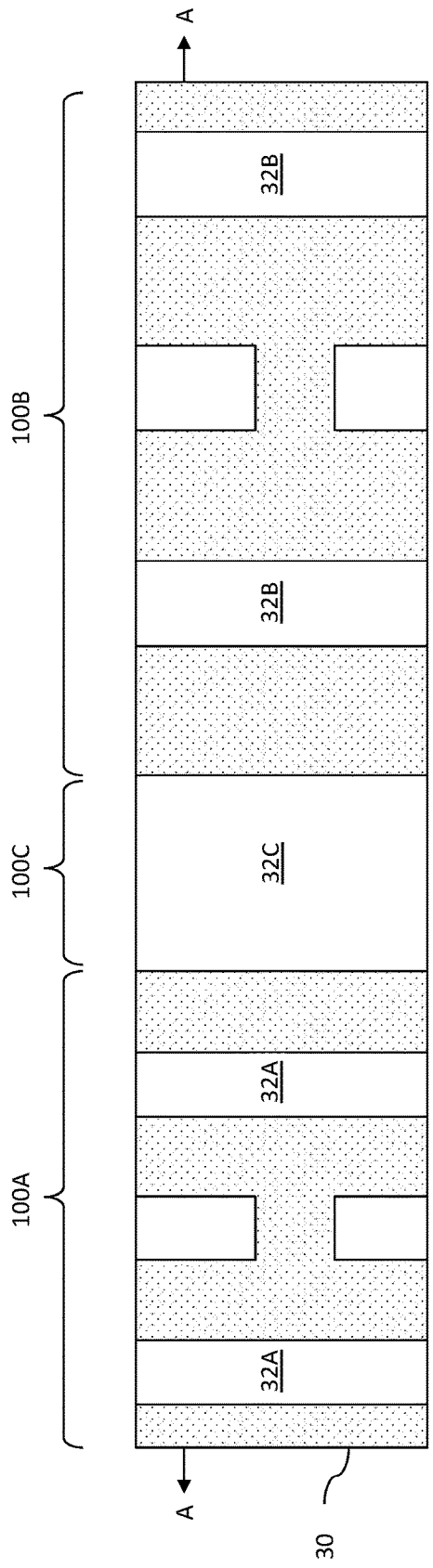
Figure 38A:
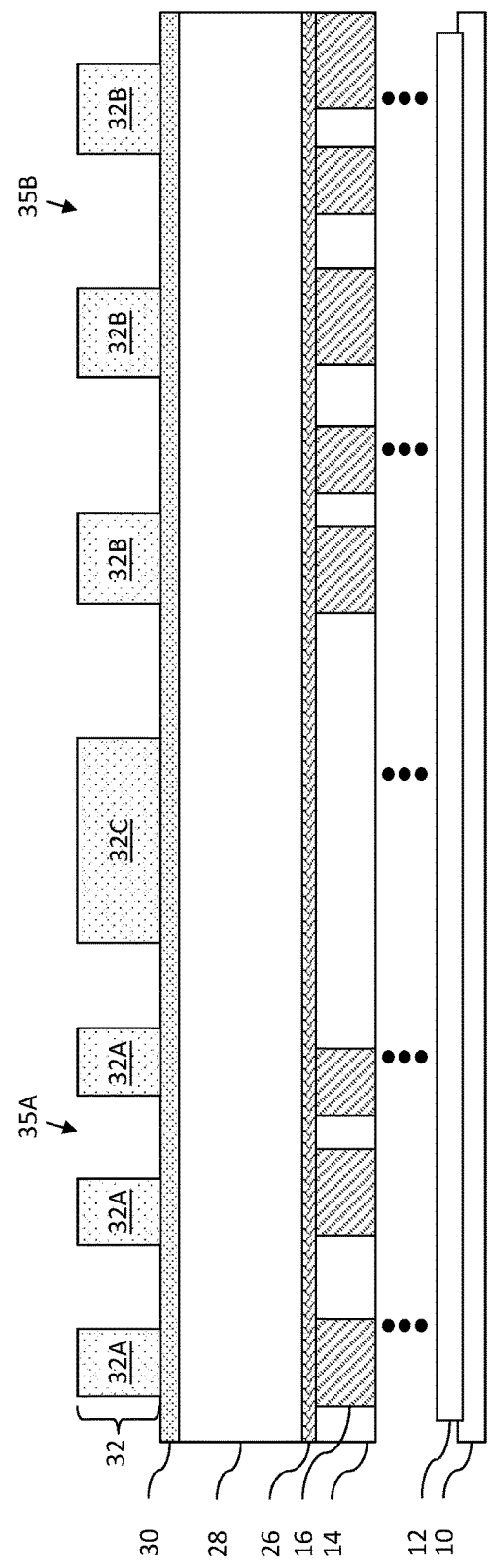

In FIGS. 38A and 38B, an etching process is performed to transfer the patterns in photo mask 34A and photo mask 34B into the mandrel layer 32 to form mandrels 32A and mandrels 32B, respectively, by extending openings 35A and openings 35B into the mandrel layer 32. Mandrels 32B are in the second region 100B and correspond to a fine pitch, and mandrels 32A are in the first region 100A and correspond to a finer pitch. In addition, a hard mask 32C is formed in the third region 100C. The respective step is illustrated as step 410 in the process flow 400 shown in FIG. 48. The remaining photo mask 34 is then removed, for example, in an ashing step. The resulting structure is shown in FIGS. 38A and 38B. The etching may be performed using processes and materials similar to those discussed above with respect to FIGS. 4A and 4B, which are not repeated. In some embodiments, a trimming process may be used prior to etching the mandrel layer 32 and a baking process may be used after etching the mandrel layer 32, similar to that discussed above with respect to FIGS. 4A and 4B.

FIG. 39A is a vertical cross-section along the line A-A indicated in FIG. 39B, and FIG. 39B is a horizontal cross-section (rather than a top down view) along the line B-B indicated in FIG. 39A. A similar horizontal cross-section is also used in FIGS. 40B, 41B, 42B, 43B, and 44B. FIGS. 39A and 39B illustrate the wafer 100 of FIGS. 38A and 38B after the deposition of a spacer layer 38 over the mandrels 32A and 32B and over the hard mask 32C. The respective step is illustrated as step 415 in the process flow 400 shown in FIG. 48.

The spacer layer 38 may be formed using processes and materials similar to the spacer layer 38 of FIGS. 5A and 5B, except that it is not deposited as thickly as the spacer layer 38 of FIGS. 5A and 5B. Because it is not deposited as thickly, the risk of undesired merge and horning effects are reduced or eliminated. In accordance with some embodiments, the thickness $T_{6A}$ of spacer layer 38 over the mandrels 32A is in the range between about 50 Å and about 250 Å, such as between about 100 Å and 175 Å. The thickness $T_{6B}$ of the spacer layer 38 over the mandrels 32B and the thickness $T_{6C}$ over the hard mask 32C are the same thickness as the thickness $T_{6A}$.

In FIGS. 40A and 40B, a photo mask 142 may be formed over the wafer 100 and patterned to expose the second region 100B, while remaining over the first region 100A. The respective step is illustrated as step 420 in the process flow 400 shown in FIG. 48. The photo mask 142 may be made using processes and materials similar to those discussed above with respect to FIGS. 6A and 6B, which are not repeated.

Figure 41B:
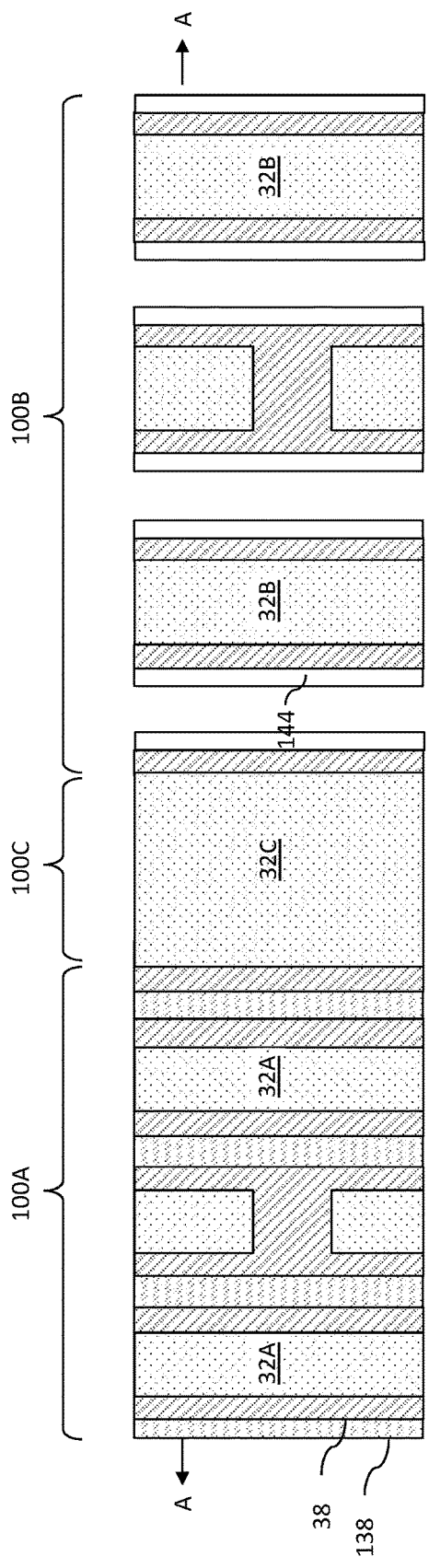
Figure 41A:
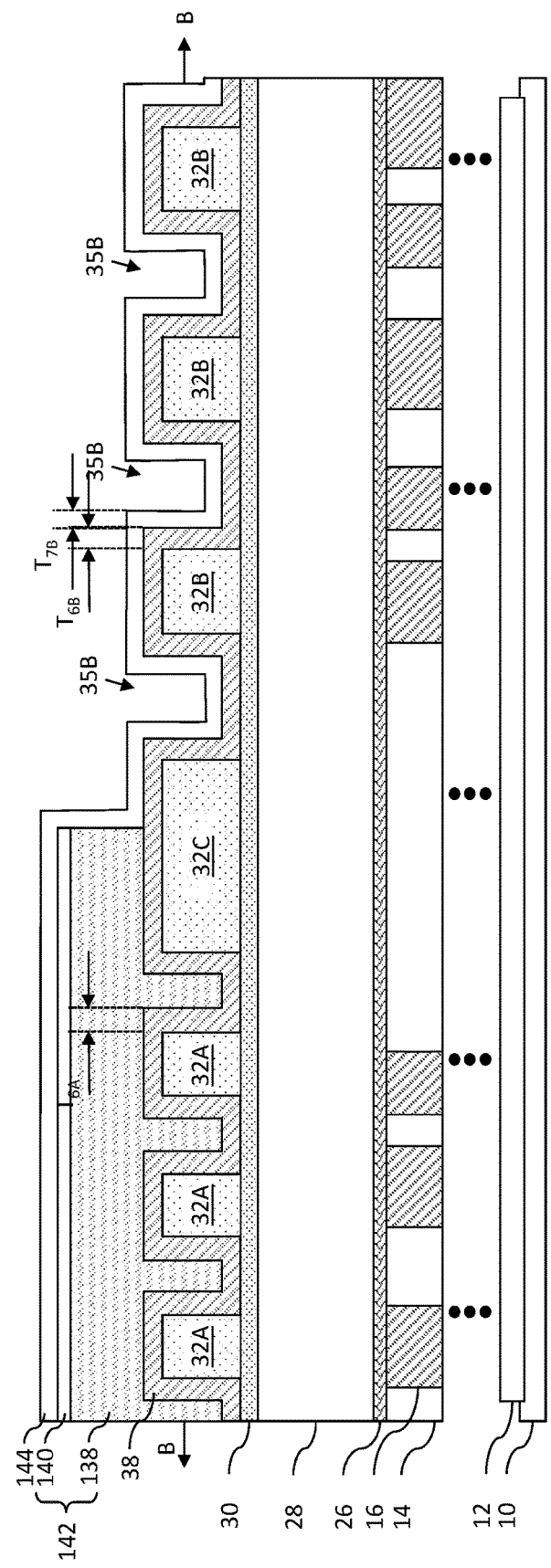

In FIGS. 41A and 41B, a pad layer 144 is deposited over the photo mask 142 and over the spacer layer 38. The respective step is illustrated as step 425 in the process flow 400 shown in FIG. 48. The pad layer may also be referred to as a spacer layer. In some embodiments, the middle layer 140 may be removed prior to depositing the pad layer 144 so that the pad layer 144 is formed directly on an uppermost surface of the bottom layer 138. The pad layer 144 may comprise an inorganic material. For example, the pad layer 144 may be an inorganic oxide, such as, titanium oxide, tantalum oxide, silicon oxide, and the like. In some embodiments, the inorganic material is a low temperature oxide (LTO). In some embodiments, the pad layer 144 may comprise a nitride, such as silicon nitride or silicon oxynitride, or the like. The pad layer 144 may be selected to have sufficient etch selectivity to the spacer layer 38 relative a same etch process. For example, a ratio of an etch rate of the pad layer 144 to an etch rate of the spacer layer 38 relative a same etch process is at least 0.7 in some embodiments.

The pad layer 144 may be formed using a semiconductor film deposition process, such as, CVD, PVD, ALD, or the like. The semiconductor film deposition process may be a conformal process, which forms on sidewalls and a bottom surface of openings 35B. The pad layer 144 may be formed to a thickness $T_{7B}$ between about 10 Å and about 100 Å, though other values are contemplated and may be used.

Figure 42B:
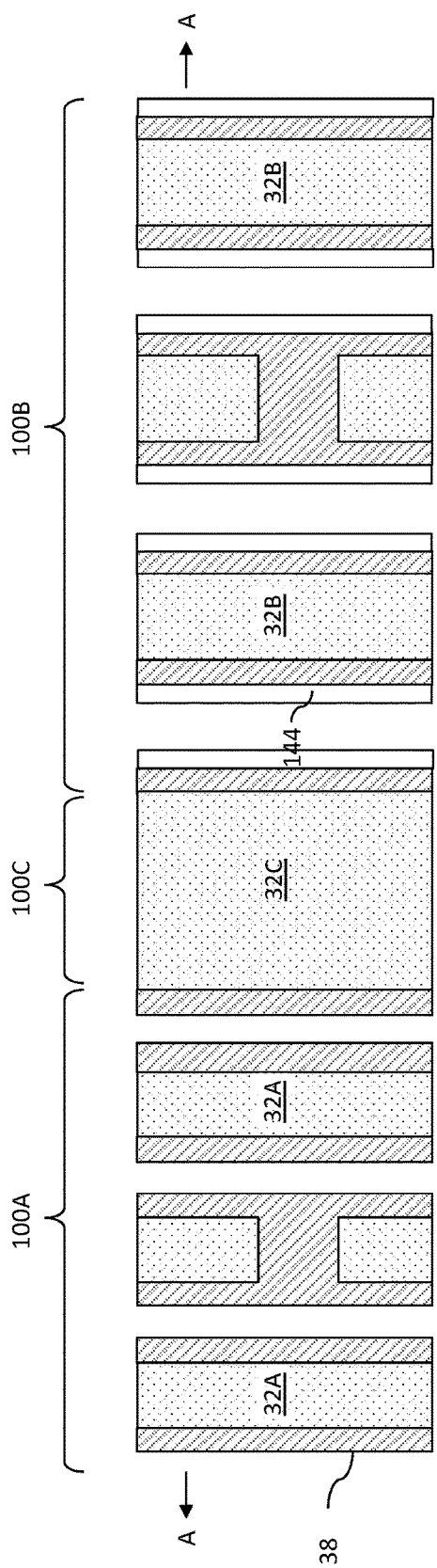
Figure 42A:
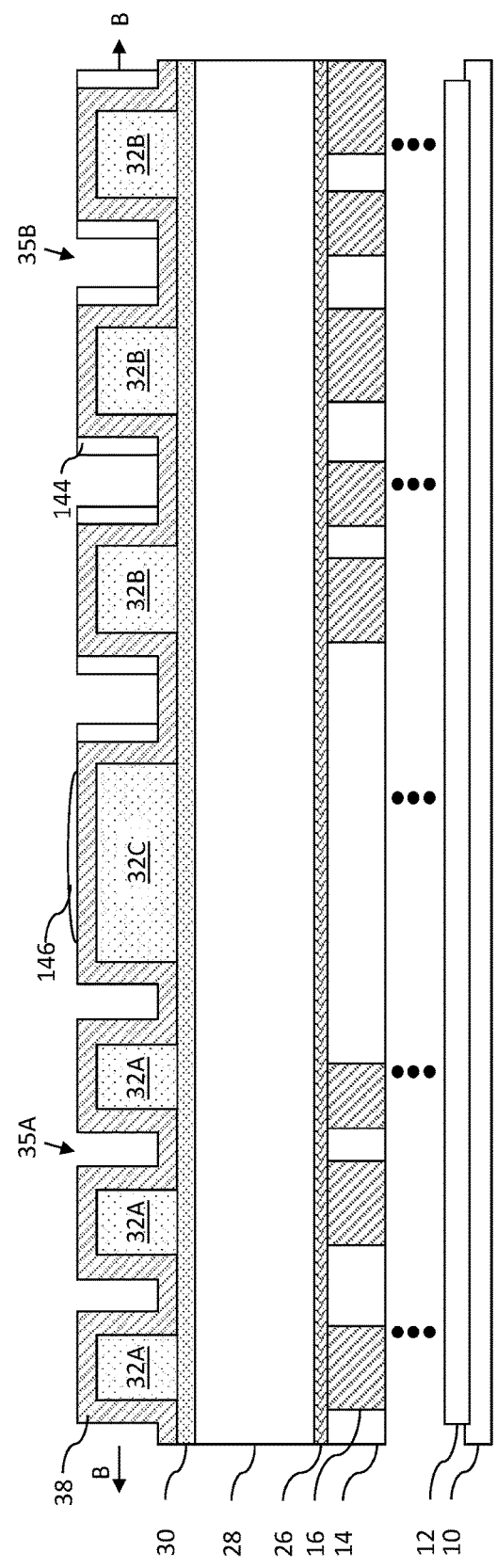

In FIGS. 42A and 42B, the bottom layer 138 is removed using an ashing process or wet etching process. The respective step is illustrated as step 430 in the process flow 400 shown in FIG. 48. When the bottom layer 138 is removed, the pad layer 144 over the bottom layer 138 is also removed. The pad layer 144 remains over the spacer layer 38 in the second region 100B. In some embodiments, only a portion of the pad layer 144 remains on sidewalls (and a bottom surface, in some embodiments) of the openings 35B. The remaining portion of the pad layer 144 is used to pad the width of the spacer layer 38 in the second region 100B.

Also illustrated in FIGS. 42A and 42B is a residue 146 that remains over the third region 100C. The residue 146 may result from removing the photo mask 142 and/or pad layer 144. A cleaning process alone could damage the pad layer 144, so the first region 100A and second region 100B may be masked to clean the residue 146. In some embodiments, a separate cleaning process need not be performed and the residue 146 may be cleaned in the process of the continuing steps. In particular, if a sacrificial material 154 is formed, such as described with respect to FIGS. 9A and 9B through 12A and 12B, then a separate photo mask 152 is not needed for cleaning, such as described with respect to FIGS. 43A and 43B, because the photo mask 152 of FIGS. 9A and 9B through 11A and 11B may be used.

If a residue removal process is performed, in FIGS. 43A and 43B a photo mask 152 is formed over the wafer 100 and patterned to expose the third region 100C and the residue 146. The respective step is illustrated as step 435 in the process flow 400 shown in FIG. 48. The photo mask 152 may be formed and patterned using processes and materials similar to those discussed above with respect to the photo mask 142 of FIGS. 6A and 6B, which are not repeated.

Figure 44B:
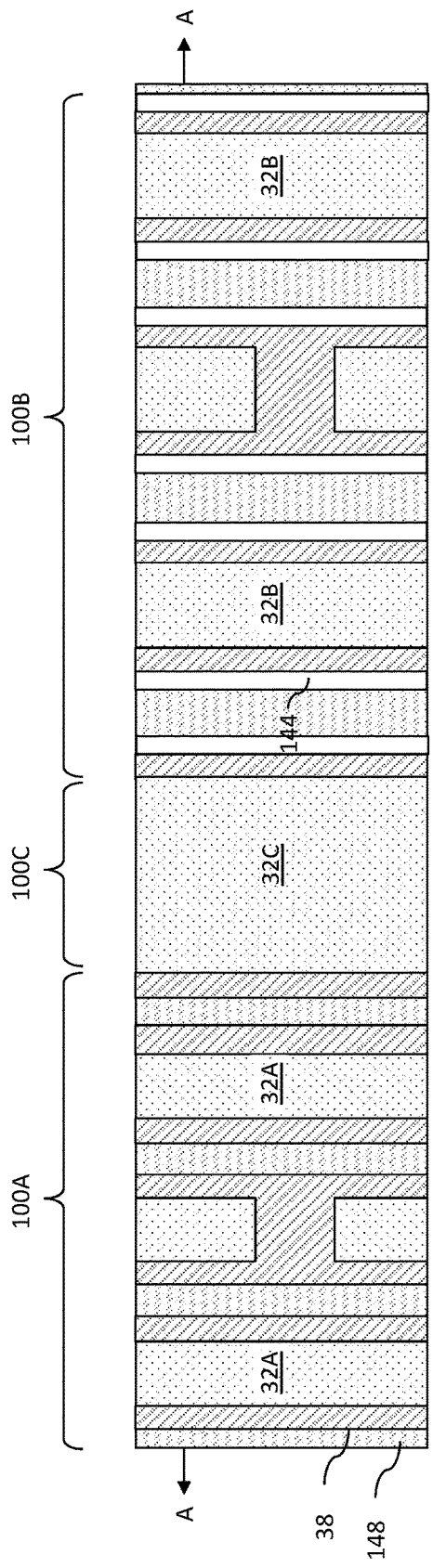
Figure 44A:
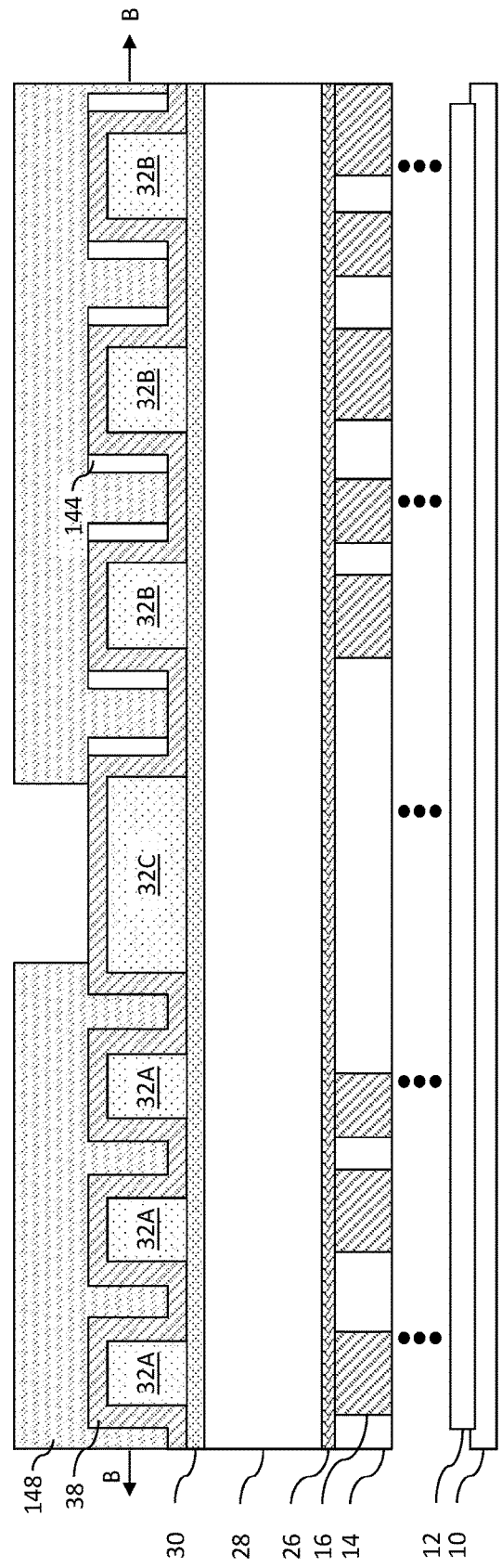

In FIGS. 44A and 44B, an etch back process may be used to remove the residue 146. The respective step is illustrated as step 440 in the process flow 400 shown in FIG. 48. In some embodiments, the etch back process may utilize a dry (e.g., plasma) etch process, a wet etch process, or a combination thereof. A plasma etch process can include using a fluorocarbon ($C_xF_y$) gas, a chlorofluorocarbon ($C_xCl_yF_z$) gas, a carbon chloride ($C_xCl_y$) gas, the like or a combination thereof. A wet etch process can include using one or more solutions of standard clean-1 (SC1), standard clean-2 (SC2), sulfuric acid-hydrogen peroxide mixture (SPM), diluted hydrofluoric (dHF) acid, hydrogen peroxide ($H_2O_2$), buffered oxide etch (BOE) solution, hydrochloric (HCl) acid, the like, or a combination thereof. A temperature of the solution can be in a range from about 20° C. to about 90° C., and a duration of immersion of the substrate in the solution can be in a range from about 10 seconds to about 120 seconds. In some embodiments, the etch back process may remove the middle layer 150 (as illustrated in FIGS. 44A and 44B) and/or the under layer 148 of the photo mask 152. In some embodiments, an ashing process and/or one or more cleaning processes may be used to remove the underlayer 148.

Prior to etching the spacer layer 38 and combined spacer layer 244, the process described above with respect to FIGS. 9A and 9B to FIGS. 12A and 12B to form a sacrificial material 154 may be performed.

Figure 45B:
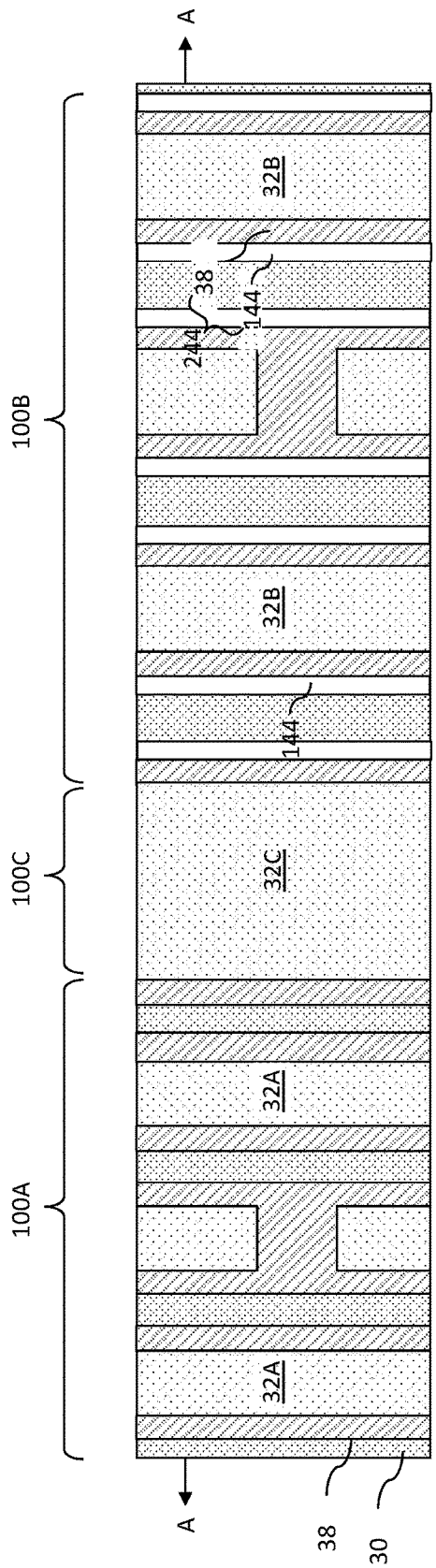
Figure 45A:
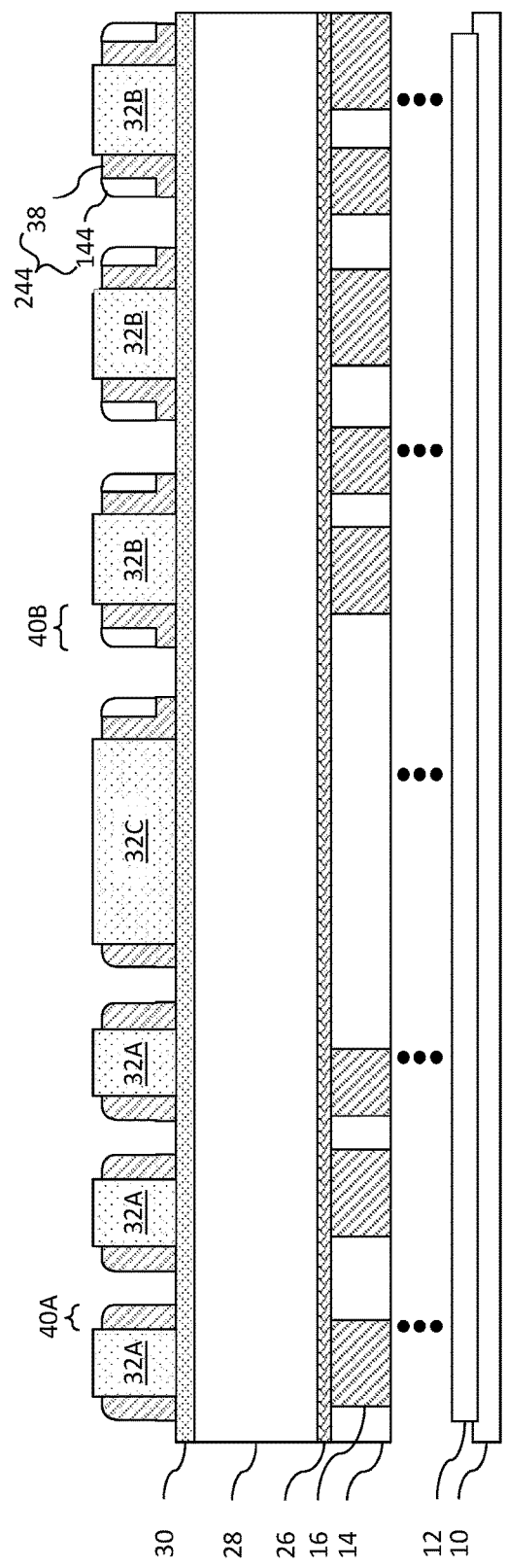

In FIGS. 45A and 45B, which include a cross-sectional view and a top view, respectively, an anisotropic etching is performed to remove the horizontal portions of the spacer layer 38 in the first region 100A and the combined spacer layer 38 and the pad layer 144 (together, the combined spacer layer 244) in the second region 100B, while the vertical portions of the spacer layer 38 and the combined spacer layer 244 remain. The respective step is illustrated as step 445 in the process flow 400 shown in FIG. 48. The remaining portions of the spacer layer 38 in the first region 100A are referred to as spacers 40A and the remaining portions of the combined spacer layer 244 in the second region 100B are referred to as spacers 40B hereinafter. The process for etching the combined spacer layer 242 may use materials and processes similar to the etching of the spacer layer 38 in FIGS. 13A and 13B, which are not repeated.

As shown in FIG. 45A, spacers 40A are on the sidewalls of mandrels 32A and spacers 40B are on the sidewalls of mandrels 32B. In some embodiments, hard mask 32C may also have spacers 40A and spacers 40B formed on the sidewalls thereof. Referring to FIG. 45B, spacers 40A and spacers 40B may include lengthwise portions in the x-direction and y-direction, and may form various shapes. In some embodiments, spacers 40A and spacers 40B may include lengthwise portions at non-zero angles to the x-direction and y-direction, or may include curvilinear sections, rounded sections, circular sections, and so forth.

FIGS. 46A and 46B illustrate the formation of a mask 158/162 with keep areas 164. The formation of the mask 158/162 is similar to that discussed above with respect to FIGS. 14A and 14B through FIGS. 16A and 16B, and the details are not repeated. In the illustrated embodiment, FIG. 46B demonstrates that a keep area 164 is in the second region 100B. Mask 158/162 is used to protect the areas of the mandrel layer 32 which are not to be removed.

In FIGS. 47A and 47B, which include a cross-sectional view and a top view, respectively, mandrels 32A and 32B are selectively etched in an etching step through the mask 158/162 to remove the mandrels 32A and 32B, thereby forming openings 43A between spacers 40A and forming openings 43B between spacers 40B. In some embodiments, the hard mask 32C is also removed, thereby forming openings 43C (indicated in parenthesis) between spacers 40A and spacers 40B in the third region 100C. The respective step is illustrated as step 450 in the process flow 400 shown in FIG. 48. The mandrels 32A and 32B and hard mask 32C may be removed using processes and materials similar to those discussed above with respect to FIGS. 16A and 16B, which are not repeated. The spacers 40A have a width $T_{8A}$ which is about the same as the thickness $T_{6A}$. The spacers 40B have a width $T_{8B}$ which is about the same as the thickness $T_{6B}+T_{7B}$ (minus losses from the spacer etch process described with respect to FIGS. 45A and 45B between about 0 Å and 20 Å).

Figure 25:
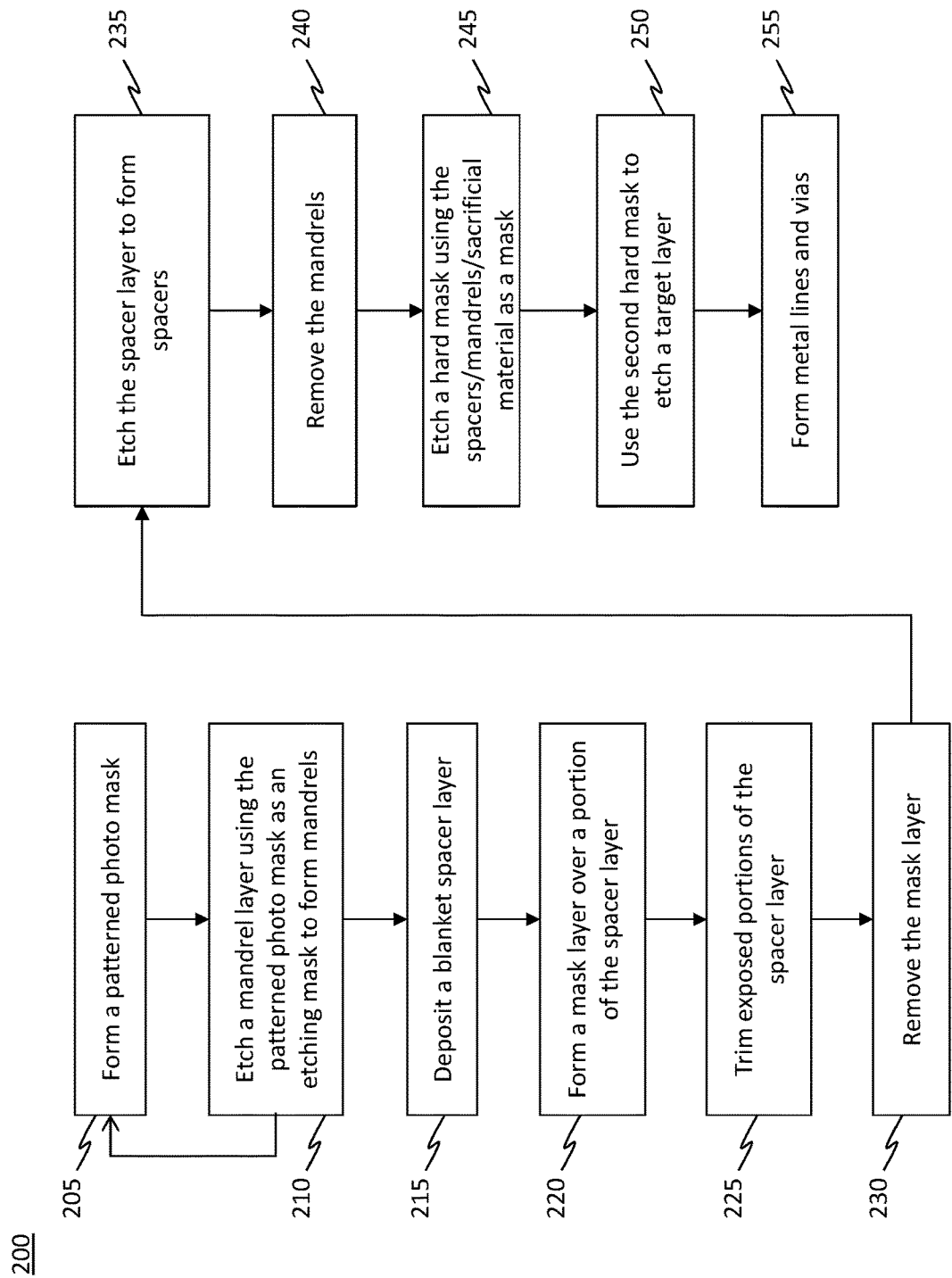
Figure 48:
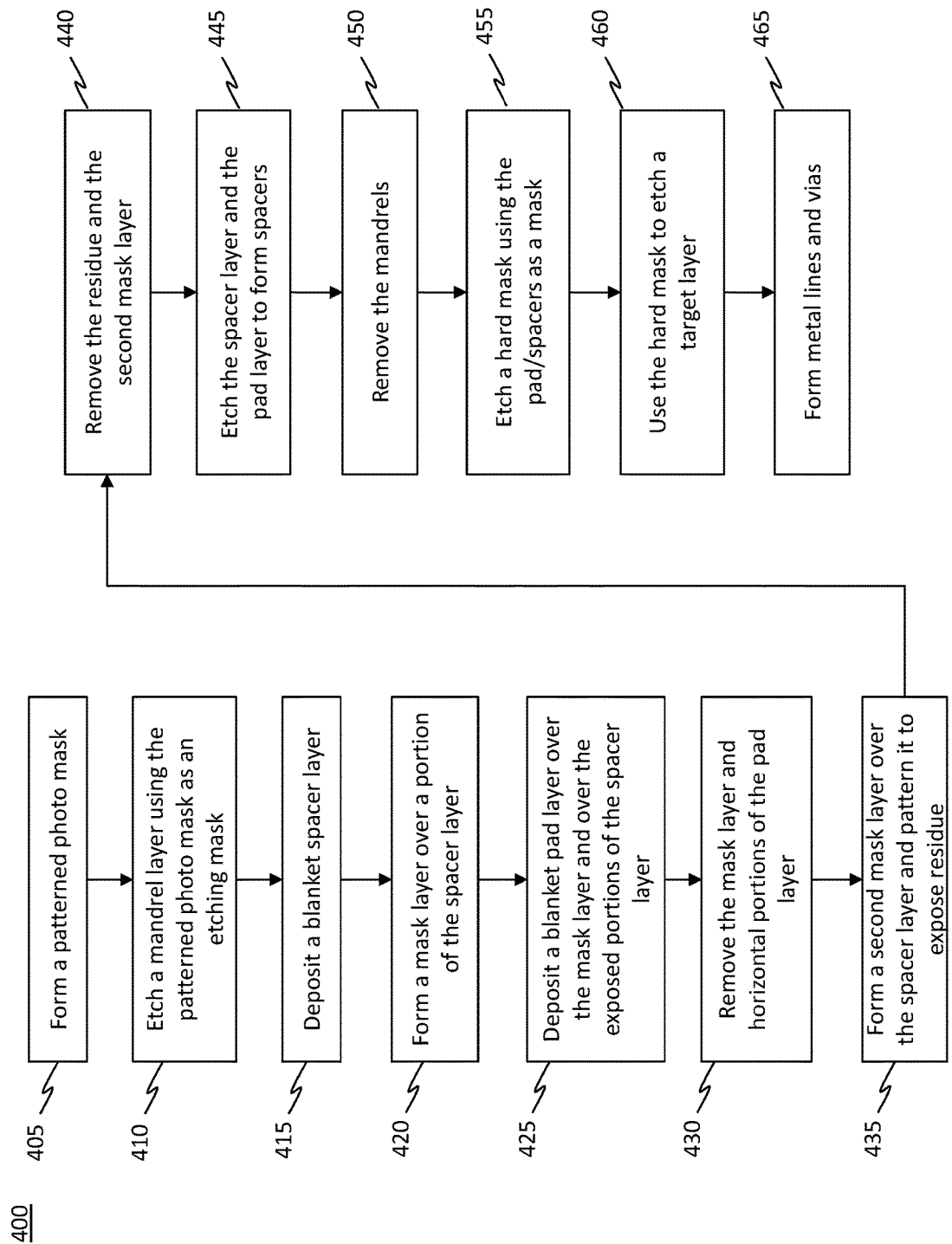
FIG. 48 illustrates a process flow for forming metal lines in accordance with some embodiments.

The remaining processes of FIG. 48 are similar to like processes described with respect to FIG. 25 and may be performed using similar processes and materials, and thus are not repeated. For example, the step illustrated as step 455 in the process flow 400 shown in FIG. 48 is similar to the step illustrated as step 245 in the process flow shown in FIG. 25; the step illustrated as step 460 in the process flow 400 shown in FIG. 48 is similar to the step illustrated as step 250 in the process flow shown in FIG. 25; and the step illustrated as step 465 in the process flow 400 shown in FIG. 48 is similar to the step illustrated as step 255 in the process flow shown in FIG. 25. As such, similar to that described above with respect to FIGS. 24A and 24B, formed metal lines, such as metal lines 50, include two spacings S1 and S2, with spacing S2 being greater than spacing S1.

FIGS. 49A and 49B through 55 illustrate cross-sectional views of intermediate stages in the formation of features such as metal lines in accordance with some embodiments of the present disclosure. Unless specified otherwise, the materials and the formation methods of the components in these embodiments are essentially the same as the like components, which are denoted by like reference numerals in the embodiments shown in FIGS. 1A, 1B, and 1C through 27. The details regarding the formation process and the materials of the like components shown in FIGS. 49A and 49B through FIG. 55 may thus be found in the discussion of the embodiment shown in FIGS. 1A, 1B, and 1C through FIG. 27.

FIG. 49A is a vertical cross-section along the line A-A indicated in FIG. 49B, and FIG. 49B is a horizontal cross-section along the line B-B indicated in FIG. 49A. A similar horizontal cross-section is also used in FIGS. 50B and 51B. FIGS. 49A and 49B illustrate the wafer 100 of FIGS. 39A and 39B after the deposition of a spacer layer 38 over the mandrels 32A and 32B and over the hard mask 32C and after the deposition of a pad layer 144 over the spacer layer 38. The respective step is illustrated as step 620 in the process flow shown in FIG. 55. Thus, the step 605 is substantially the same as the step 405 of FIG. 48, the step 610 is substantially the same as the step 410, and the step 615 is substantially the same as the step 415. Accordingly, the substrate 10, devices 12, dielectric layer 14, conductive features 16, etch stop layer 26, target layer 28, hard mask 30, mandrels 32A and 32B, and hard mask 32C refer to features which are similar to what are shown in FIGS. 37A and 37B and FIGS. 38A and 38, and hence are not repeated herein. In accordance with some embodiments, the thickness $T_{9A}$ of spacer layer 38 over the mandrels 32A and 32B and the hard mask 32C is in the range between about 50 Å and about 200 Å, such as between about 100 Å and about 160 Å, though other values are contemplated and may be used.

A pad layer 144 is deposited over the spacer layer 38. The respective step is illustrated as step 620 in the process flow 600 shown in FIG. 55. The pad layer may also be referred to as a spacer layer. The pad layer 144 may be formed using processes and materials similar to those discussed above with respect to FIGS. 41A and 41B, which are not repeated. The pad layer 144 may be formed to a thickness Tim between about 10 Å and about 100 Å, though other values are contemplated and may be used.

In FIGS. 50A and 50B, a photo mask 142 may be formed over the wafer 100 and patterned to expose the first region 100A, while remaining over the second region 100B. The respective step is illustrated as step 625 in the process flow

Figure 55:
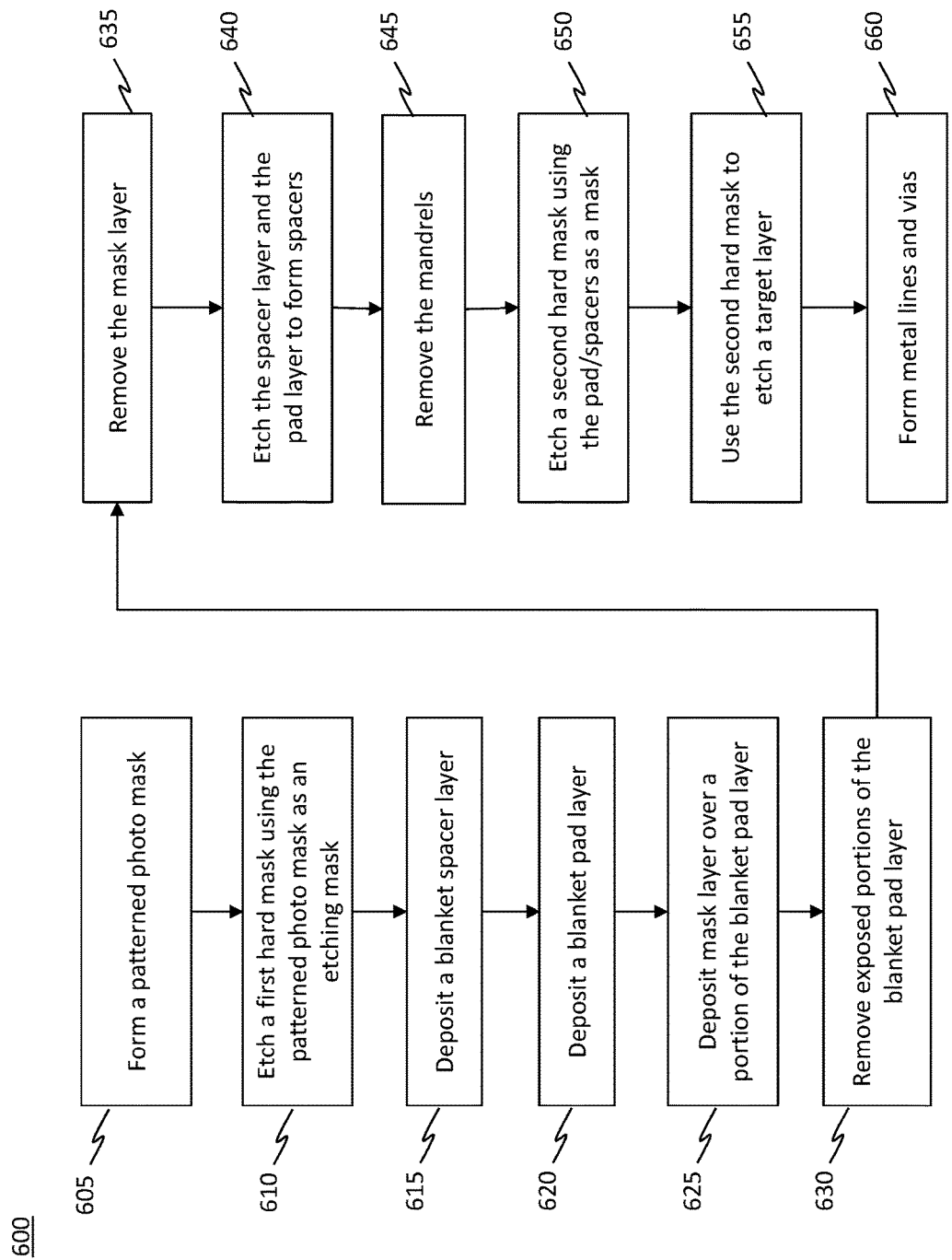
FIG. 55 illustrates a process flow for forming metal lines in accordance with some embodiments.

600 shown in FIG. 55. The photo mask 142 may be made using processes and materials similar to those discussed above with respect to FIGS. 6A and 6B, which are not repeated.

In FIGS. 51A and 51B, the portion of the pad layer 144 which is exposed from the photo mask 142 may be removed by any suitable technique, such as a wet etch process or a dry etch (e.g., plasma) process or a combination thereof. The respective step is illustrated as step 630 in the process flow 600 shown in FIG. 55. A plasma etch process can include using a fluorocarbon ($C_xF_y$) gas, a chlorofluorocarbon ($C_xCl_yF_z$) gas, the like or a combination thereof. The wet etch process can include using one or more solutions of standard clean-1 (SC1), standard clean-2 (SC2), sulfuric acid-hydrogen peroxide mixture (SPM), diluted hydrofluoric (dHF) acid, hydrogen peroxide ($H_2O_2$), buffered oxide etch (BOE) solution, hydrochloric (HCl) acid, the like, or a combination thereof. A temperature of the solution can be in a range from about 20° C. to about 90° C., and a duration of immersion of the substrate in the solution can be in a range from about 10 seconds to about 120 seconds.

In FIGS. 52A and 52B, the photo mask 142 is removed using an ashing process or wet etching process and the spacer layer and pad layers are etched to form spacers. The respective step is illustrated as steps 635 and 640 in the process flow 600 shown in FIG. 55. After the photo mask 142 is removed, the pad layer 144 remains over the spacer layer 38 in the second region 100B. The pad layer 144 is used to pad the width of the spacer layer 38 in the second region 100B.

Prior to etching the spacer layer 38 and combined spacer layer 244, the process described above with respect to FIGS. 9A and 9B to FIGS. 12A and 12B to form a sacrificial material 154 may be performed.

Also in FIGS. 52A and 52B, an anisotropic etching is performed to remove the horizontal portions of the spacer layer 38 in the first region 100A and the combined spacer layer 38 and the pad layer 144 (together, the combined spacer layer 244) in the second region 100B, while the vertical portions of the spacer layer 38 and the combined spacer layer 244 remain. The respective step is illustrated as step 640 in the process flow 600 shown in FIG. 55. The remaining portions of the spacer layer 38 in the first region 100A are referred to as spacers 40A and the remaining portions of the combined spacer layer 244 in the second region 100B are referred to as spacers 40B hereinafter. The process for etching the combined spacer layer 242 may use materials and processes similar to the etching of the spacer layer 38 in FIGS. 16A and 16B, which are not repeated.

As shown in FIG. 52A, spacers 40A are on the sidewalls of mandrels 32A and spacers 40B are on the sidewalls of mandrels 32B. In some embodiments, hard mask 32C may also have spacers 40A and spacers 40B formed on the sidewalls thereof. Referring to FIG. 52B, spacers 40A and spacers 40B may include lengthwise portions in the x-direction and y-direction, and may form various shapes. In some embodiments, spacers 40A and spacers 40B may include lengthwise portions at non-zero angles to the x-direction and y-direction, or may include curvilinear sections, rounded sections, circular sections, and so forth. The hard mask 32C may also have a stepped upper surface as a result of removing the pad layer 144 in the first region 100A. The height of the spacers 40B may also be taller than the height of the spacers 40A by about 0 Å to about 50 Å.

FIGS. 53A and 53B illustrate the formation of a mask 158/162 with keep areas 164. The formation of the mask 158/162 is similar to that discussed above with respect to FIGS. 14A and 14B through FIGS. 16A and 16B, and the details are not repeated. In the illustrated embodiment, FIG. 53B demonstrates that a keep area 164 is in the second region 100B. Mask 158/162 is used to protect the areas of the mandrel layer 32 which are not to be removed.

Figure 54B:
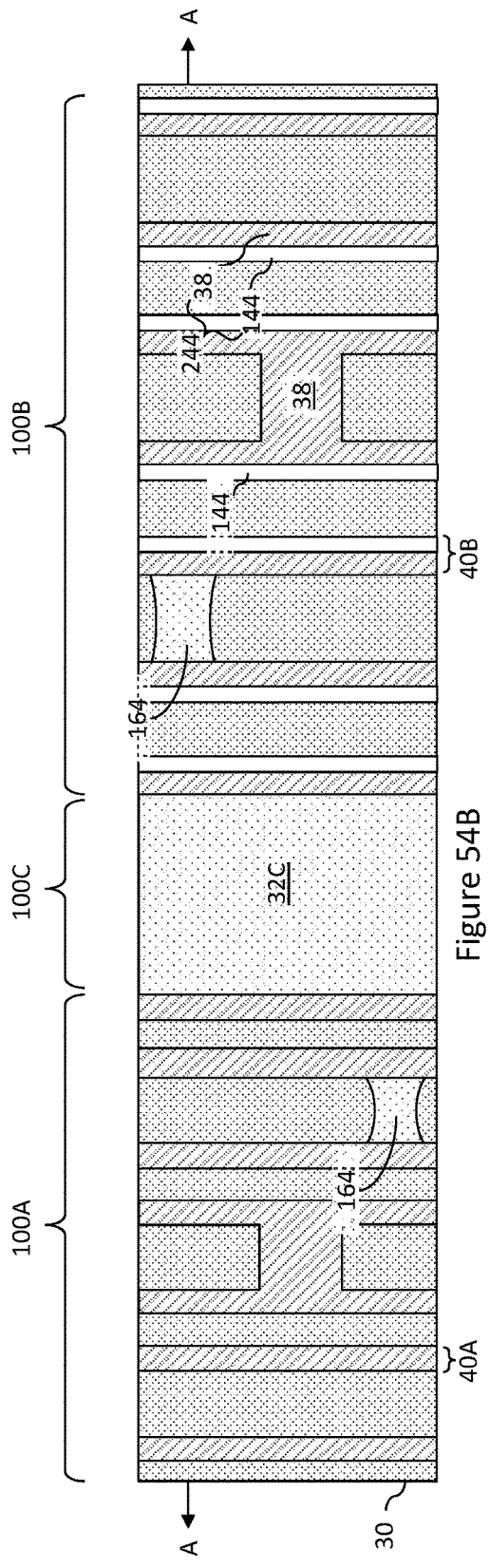
Figure 54A:
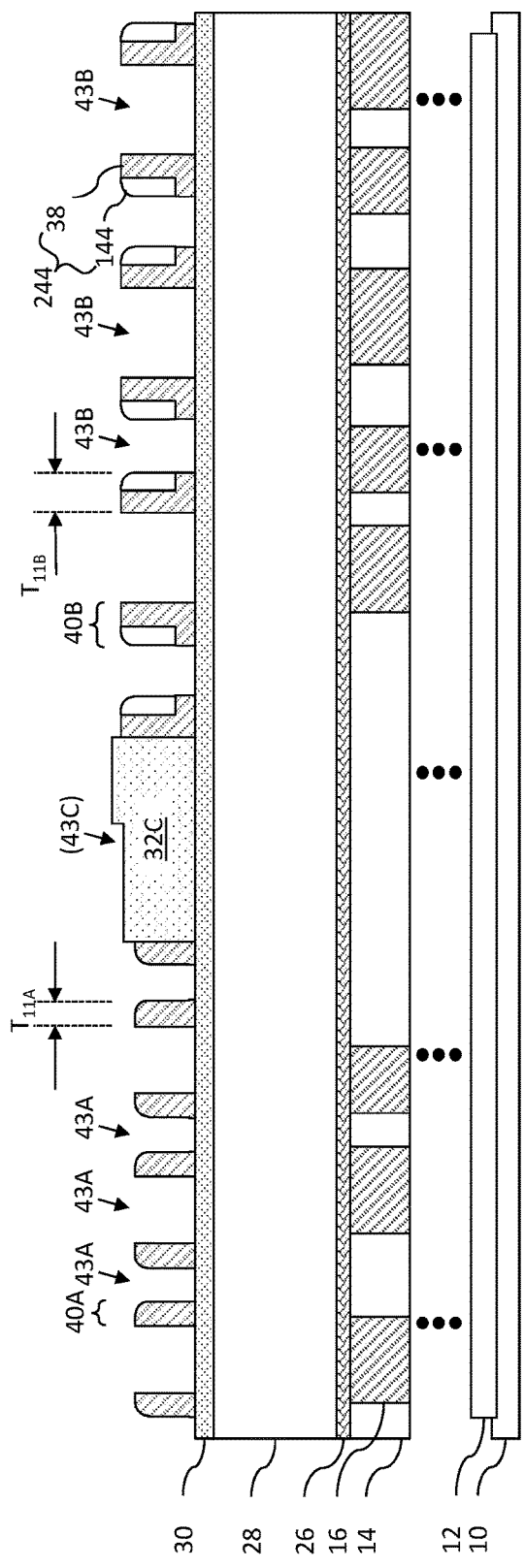

In FIGS. 54A and 54B, which include a cross-sectional view and a top view, respectively, mandrels 32A and 32B are selectively etched in an etching step to remove the mandrels 32A and 32B, thereby forming openings 43A between spacers 40A and forming openings 43B between spacers 40B. In some embodiments, the hard mask 32C is also removed, thereby forming openings 43C (indicated in parenthesis) between spacers 40A and spacers 40B in the third region 100C. The respective step is illustrated as step 645 in the process flow 600 shown in FIG. 55. The mandrels 32A and 32B and hard mask 32C may be removed using processes and materials similar to those discussed above with respect to FIGS. 8A and 8B, which are not repeated. The spacers 40A have a width $T_{11A}$ which is about the same as the thickness $T_{9A}$. The spacers 40B have a width Tim which is about the same as the thickness $T_{9A}+T_{10A}$ (minus losses from the spacer etch process described with respect to FIGS. 52A and 52B between about 0 Å and 20 Å).

The remaining processes of FIG. 55 are similar to like processes described with respect to FIG. 25 and may be performed using similar processes and materials, and thus are not repeated. For example, the step illustrated as step 650 in the process flow 600 shown in FIG. 55 is similar to the step illustrated as step 245 in the process flow shown in FIG. 25; the step illustrated as step 655 in the process flow 600 shown in FIG. 55 is similar to the step illustrated as step 250 in the process flow shown in FIG. 25; and the step illustrated as step 660 in the process flow 600 shown in FIG. 55 is similar to the step illustrated as step 255 in the process flow shown in FIG. 25. As such, similar to that described above with respect to FIGS. 24A and 24B, formed metal lines, such as metal lines 50, include two spacings S1 and S2, with spacing S2 being greater than spacing S1.

The embodiments of the present disclosure advantageously provide the ability to have multiple spaced and sized mandrels and spacers on the same wafer. After depositing an initial spacer layer over different sized mandrels, the spacer layer can be manipulated and altered so that part of the spacer layer is thicker over mandrels which are wider and/or pitched further apart, while part of the spacer layer is thinner over mandrels which are narrower and/or pitched closer together. By utilizing a spacer layer having multiple widths, subsequently formed metal lines can have isolation between lines which are customized based on the widths of the spacers. This allows a wafer to have multiple types of line signaling and isolation within a same layer of an interconnect, for example. Adjusting the spacer sizes also allows for designing to different capacitance effects between adjacent metal lines. For example, in embodiments where some areas of a device design are such that capacitance leakage between metal lines is not as much of a concern as in other areas of the device design, the isolation spacing between metal lines in those areas can be smaller while larger in the other areas. As a result, the spacing between the formed features can be adjusted, and the flexibility in the formation of the features is improved.

One embodiment is a method including patterning a first mandrel layer over a target layer to form first mandrels and second mandrels, the first mandrels having a larger width than the second mandrels. The method also includes depositing a spacer layer over the first mandrels and the second mandrels. The method also includes forming a mask layer over the spacer layer and the first mandrels. The method further includes thinning the spacer layer over the second mandrels. The method further still includes removing the mask layer. The spacer layer is etched to form a spacer etch mask, the spacer etch mask may include first spacers in contact with sidewalls of the first mandrels and second spacers in contact with sidewalls of the second mandrels, the first spacers having a greater width than the second spacers. The method also includes etching the target layer based on the spacer etch mask. In an embodiment, the method may include, after removing the mask layer, depositing a second spacer layer over the first spacer layer. In an embodiment, the method may include forming first metal lines in a first region of the target layer, the first region corresponding to the first mandrels; and forming second metal lines in a second region of the target layer, the second region corresponding to the second mandrels, the second metal lines being separated from each other by a greater distance than the first metal lines. In an embodiment, the method may include forming a second mask layer over the spacer layer and the first mandrels; patterning the second mask layer to expose cut line areas; depositing a sacrificial material in the cut line areas; and removing the second mask layer, the sacrificial material becoming part of the spacer etch mask. In an embodiment, the method may include using the spacer etch mask to etch a hard mask underlying the spacer etch mask; and using the hard mask to etch the target layer. In an embodiment, the first spacers are between 20 Å and 50 Å wider than the second spacers.

Another embodiments is a method including patterning a first mandrel layer over a target layer to form first mandrels and second mandrels, the first mandrels having a larger width than the second mandrels. A spacer layer is deposited over the first mandrels and the second mandrels. A mask layer is formed over the spacer layer and the second mandrels, a portion of the spacer layer over the first mandrels exposed from the mask layer. A pad layer is deposited over the mask layer and the exposed spacer layer and the mask layer is removed. The method also includes etching the spacer layer and the pad layer over the first mandrels to form a first spacer etch mask including first spacers, and etching the spacer layer over the second mandrels to form a second spacer mask including second spacers, the first spacers each being wider than the second spacers. The method also includes etching the target layer based on the first spacer etch mask and the second spacer etch mask. In an embodiment, the method includes, after removing the mask layer, forming a second mask layer; patterning the second mask layer to provide an opening in the second mask layer, the opening exposing residue of the pad layer; and removing the residue of the pad layer. In an embodiment, the first spacer mask or second spacer mask may include pillars of the sacrificial material. In an embodiment, the pad layer and the sacrificial material may include the same material. In an embodiment, the target layer may include a semiconductor material. In an embodiment, patterning the first mandrel layer includes patterning the first mandrel layer to form a hard mask between the first mandrels and the second mandrels. In an embodiment, the method may include removing horizontal portions of the pad layer from over the first mandrels, remaining vertical portions of the pad layer disposed on sidewalls of the spacer layer.

Another embodiment is a method including forming a first set of mandrels in a first region of a wafer and forming a second set of mandrels in a second region of the wafer, the first set of mandrels having a wider pitch than the second set of mandrels. The method also includes depositing a first spacer layer over the first set of mandrels and the second set of mandrels, and depositing a second spacer layer over the first set of mandrels and the second set of mandrels. A mask is formed over the first region. The second spacer layer over the second set of mandrels in the second region is removed, and then the mask is removed. The method also includes etching the first spacer layer in the second region and etching the first spacer layer and the second spacer layer in the first region to form a spacer mask including first spacers in the first region and second spacers in the second region, the first spacers being wider than the second spacers. The first set of mandrels and the second set of mandrels are removed. A target layer underlying the spacer mask is etched. In an embodiment, the method may include etching a hard mask layer directly underlying the spacer mask and using the hard mask layer to etch the target layer. In an embodiment, spacing between adjacent lines in the first region is greater than spacing between adjacent metal lines in the second region. In an embodiment, the second spacer layer may include a different material than the first spacer layer. In an embodiment, a spacer of the first spacers contacts one side of the hard mask and a spacer of the second spacers contacts an opposite side of the hard mask. In an embodiment, the first spacers are taller than the second spacers.

Another embodiment is a method including forming a bottom hard mask on a substrate, where the bottom hard mask includes an oxide layer and a nitride layer, the nitride layer is disposed on the substrate, and the oxide layer is disposed on the nitride layer. The method also includes forming a buffer layer over the substrate after forming the bottom hard mask on the substrate. The method also includes forming a first top hard mask on the buffer layer, where the first top hard mask has a first trench to expose a first portion of the buffer layer. The method also includes forming a spacer layer to cover a sidewall of the first trench and an upper surface of the first top hard mask and the first portion of the buffer layer to form a second trench over the first portion, where the spacer layer includes a top portion disposed on the upper surface of the first top hard mask, a vertical portion disposed on the sidewall of the first trench, and a bottom portion disposed on the first portion of the buffer layer. The method also includes etching the top portion and the bottom portion to form a thinned top portion and a thinned bottom portion. The method also includes forming a second top hard mask in the second trench. The method also includes removing the thinned top portion and the vertical portion of the spacer layer. The method also includes etching the first top hard mask and the second top hard mask to form a patterned top hard mask. The method also includes etching the buffer layer and bottom hard mask according to the patterned top hard mask to form a third trench in the bottom hard mask. In an embodiment, the spacer layer further includes a second section disposed over the first top hard mask, the method further including: masking the second section during the etching of the top portion and the bottom portion, so that the second section has a greater thickness than the top portion and the bottom portion. In an embodiment, the method further includes: depositing a patterning layer over the thinned top portion and the thinned bottom portion; forming an opening in the patterning layer, the opening partially exposing the thinned top portion and the thinned bottom portion; and forming the second top hard mask in the opening of the patterning layer. In an embodiment, the removing of the thinned top portion and the vertical portion of the spacer layer is performed after etching the first top hard mask and the second top hard mask. In an embodiment, the spacer layer is a first spacer layer, further including: depositing a second spacer layer on the first spacer layer. In an embodiment, the patterned top hard mask is disposed between the first top hard mask and the buffer layer.

Another embodiment is a method including forming a bottom hard mask over a first layer, where the bottom hard mask includes an oxide layer and a nitride layer. The method also includes forming a buffer layer over the first layer. The method also includes forming a first mask on the buffer layer. The method also includes forming a first trench through the first mask to expose the buffer layer. The method also includes forming a spacer layer to cover a sidewall of the first mask, an upper surface of the first mask, and an upper surface the exposed buffer layer, the spacer layer partially filling the first trench. The method also includes reducing a thickness of a top portion of the spacer layer and of a bottom portion of the spacer layer, the top portion of the spacer layer over the upper surface of the first mask and the bottom portion of the spacer layer over the upper surface of the exposed buffer layer. The method also includes forming a second mask over the spacer layer and in the first trench. The method also includes removing the top portion of the spacer layer. The method also includes etching the first mask and the second mask to form a patterned top hard mask. The method also includes etching the buffer layer and the bottom hard mask according to the patterned top hard mask to form a second trench in the bottom hard mask. In an embodiment, forming the buffer layer includes depositing a nitrogen free anti-reflective coating (NFARC); depositing a nitride layer on the NFARC; and depositing an oxide layer on the nitride layer. In an embodiment, forming the second mask includes: depositing a patterning layer over the spacer layer; patterning the patterning layer to form an opening in the patterning layer, the opening exposing the spacer layer; depositing the second mask in the opening; and removing the patterning layer. In an embodiment, the method further includes: forming a third trench through the first mask to expose the buffer layer, a width of the first trench being a different width than the third trench. In an embodiment, the spacer layer partially fills the third trench, and the method further includes: prior to reducing the thickness of the top portion of the spacer layer and the bottom portion of the spacer layer, depositing a protection mask over a portion of the spacer layer disposed over the third trench, the protection mask preventing an altering of the portion of the spacer layer disposed over the third trench. In an embodiment, a material of the first mask is the same as a material of the second mask, and a material of the spacer layer is different from those of the first mask and the second mask. In an embodiment, removing the top portion of the spacer layer is performed after etching the first mask and the second mask to form the patterned top hard mask.

Another embodiment is a method including forming a target layer over a wafer. The method also includes forming a buffer layer over the target layer. The method also includes forming a first set of mandrels over the buffer layer. The method also includes depositing a first spacer layer over the first set of mandrels. The method also includes thinning the first spacer layer to reduce a thickness of the first spacer layer over the first set of mandrels. The method also includes forming a first mask over the first spacer layer, the first mask filling a trench between two adjacent mandrels of the first set of mandrels. The method also includes removing horizontal sections of the first spacer layer, thereby exposing a first underlying layer, except beneath the first mask. The method also includes, after removing the horizontal sections of the first spacer layer, etching the first underlying layer using remaining portions of the first spacer layer as an etch mask. The method also includes removing the first set of mandrels. The method also includes and etching the target layer underlying the spacer layer. In an embodiment, forming the first set of mandrels includes: depositing a first material layer; and patterning the first material layer into the first set of mandrels. In an embodiment, the method further includes: forming a second set of mandrels from the first material layer, the second set of mandrels having a different spacing than the first set of mandrels. In an embodiment, the method further includes: depositing a second spacer layer over the first spacer layer. In an embodiment, the second spacer layer includes a different material than the first spacer layer. In an embodiment, depositing the second spacer layer is performed after thinning the first spacer layer. In an embodiment, the first underlying layer corresponds to the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various modifies, substitutions, and alterations herein without departing from the spirit and scope of the present disclosure.

What is claimed is:

1. A method comprising:
    forming a bottom hard mask on a substrate, wherein the bottom hard mask comprises an oxide layer and a nitride layer, the nitride layer is disposed on the substrate, and the oxide layer is disposed on the nitride layer;
    forming a buffer layer over the substrate after forming the bottom hard mask on the substrate;
    forming a first top hard mask on the buffer layer, wherein the first top hard mask has a first trench to expose a first portion of the buffer layer;
    forming a spacer layer to cover a sidewall of the first trench and an upper surface of the first top hard mask and the first portion of the buffer layer to form a second trench over the first portion, wherein the spacer layer comprises a top portion disposed on the upper surface of the first top hard mask, a vertical portion disposed on the sidewall of the first trench, and a bottom portion disposed on the first portion of the buffer layer;
    etching the top portion and the bottom portion to form a thinned top portion and a thinned bottom portion;
    forming a second top hard mask in the second trench;
    removing the thinned top portion and the vertical portion of the spacer layer;
    etching the first top hard mask and the second top hard mask to form a patterned top hard mask; and
    etching the buffer layer and bottom hard mask according to the patterned top hard mask to form a third trench in the bottom hard mask.

2. The method of claim 1, wherein the spacer layer further comprises a second section disposed over the first top hard mask, further comprising:
    masking the second section during the etching of the top portion and the bottom portion, so that the second section has a greater thickness than the top portion and the bottom portion.

3. The method of claim 1, further comprising:
depositing a patterning layer over the thinned top portion and the thinned bottom portion;
forming an opening in the patterning layer, the opening partially exposing the thinned top portion and the thinned bottom portion; and
forming the second top hard mask in the opening of the patterning layer.

4. The method of claim 1, wherein the removing of the thinned top portion and the vertical portion of the spacer layer is performed after etching the first top hard mask and the second top hard mask.

5. The method of claim 1, wherein the spacer layer is a first spacer layer, further comprising:
depositing a second spacer layer on the first spacer layer.

6. The method of claim 1, wherein the patterned top hard mask is disposed between the first top hard mask and the buffer layer.

7. A method comprising:
forming a bottom hard mask over a first layer, wherein the bottom hard mask comprises an oxide layer and a nitride layer;
forming a buffer layer over the first layer;
forming a first mask on the buffer layer;
forming a first trench through the first mask to expose the buffer layer;
forming a spacer layer to cover a sidewall of the first mask, an upper surface of the first mask, and an upper surface the exposed buffer layer, the spacer layer partially filling the first trench;
reducing a thickness of a top portion of the spacer layer and of a bottom portion of the spacer layer, the top portion of the spacer layer over the upper surface of the first mask and the bottom portion of the spacer layer over the upper surface of the exposed buffer layer;
forming a second mask over the spacer layer and in the first trench;
removing the top portion of the spacer layer;
etching the first mask and the second mask to form a patterned top hard mask; and
etching the buffer layer and the bottom hard mask according to the patterned top hard mask to form a second trench in the bottom hard mask.

8. The method of claim 7, wherein forming the buffer layer comprises:
depositing a nitrogen free anti-reflective coating (NFARC);
depositing a nitride layer on the NFARC; and
depositing an oxide layer on the nitride layer.

9. The method of claim 7, wherein forming the second mask comprises:
depositing a patterning layer over the spacer layer;
patterning the patterning layer to form an opening in the patterning layer, the opening exposing the spacer layer;
depositing the second mask in the opening; and
removing the patterning layer.

10. The method of claim 7, further comprising: forming a third trench through the first mask to expose the buffer layer, a width of the first trench being a different width than the third trench.

11. The method of claim 10, wherein the spacer layer partially fills the third trench, further comprising:
prior to reducing the thickness of the top portion of the spacer layer and the bottom portion of the spacer layer, depositing a protection mask over a portion of the spacer layer disposed over the third trench, the protection mask preventing an altering of the portion of the spacer layer disposed over the third trench.

12. The method of claim 11, wherein a material of the first mask is the same as a material of the second mask, and a material of the spacer layer is different from those of the first mask and the second mask.

13. The method of claim 7, wherein removing the top portion of the spacer layer is performed after etching the first mask and the second mask to form the patterned top hard mask.

14. A method comprising:
forming a target layer over a wafer;
forming a buffer layer over the target layer;
forming a first set of mandrels over the buffer layer;
depositing a first spacer layer over the first set of mandrels;
thinning the first spacer layer to reduce a thickness of the first spacer layer over the first set of mandrels;
forming a first mask over the first spacer layer, the first mask filling a trench between two adjacent mandrels of the first set of mandrels;
removing horizontal sections of the first spacer layer, thereby exposing a first underlying layer, except beneath the first mask;
after removing the horizontal sections of the first spacer layer, etching the first underlying layer using remaining portions of the first spacer layer as an etch mask;
removing the first set of mandrels; and
etching the target layer underlying the spacer layer.

15. The method of claim 14, wherein forming the first set of mandrels comprises:
depositing a first material layer; and
patterning the first material layer into the first set of mandrels.

16. The method of claim 15, further comprising:
forming a second set of mandrels from the first material layer, the second set of mandrels having a different spacing than the first set of mandrels.

17. The method of claim 14, further comprising: depositing a second spacer layer over the first spacer layer.

18. The method of claim 17, wherein the second spacer layer comprises a different material than the first spacer layer.

19. The method of claim 17, wherein depositing the second spacer layer is performed after thinning the first spacer layer.

20. The method of claim 14, wherein the first underlying layer corresponds to the buffer layer.

* * * * *